US012795941B2

(12) United States Patent
Petti et al.

(10) Patent No.: US 12,795,941 B2
(45) **Date of Patent: *Nov. 10, 2026**

(54) THREE-DIMENSIONAL MEMORY STRING ARRAY OF THIN-FILM FERROELECTRIC TRANSISTORS

(71) Applicant: SUNRISE MEMORY CORPORATION, San Jose, CA (US)

(72) Inventors: Christopher J. Petti, Mountain View, CA (US); Vinod Purayath, Sedona, AZ (US); George Samachisa, Atherton, CA (US); Wu-Yi Henry Chien, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 18/919,262

(22) Filed: Oct. 17, 2024

(65) Prior Publication Data

US 2025/0113493 A1 Apr. 3, 2025

Related U.S. Application Data

(63) Continuation of application No. 18/483,322, filed on Oct. 9, 2023, now Pat. No. 12,160,996, which is a (Continued)

(51) Int. Cl.

| | |
|---|---|
| ***H10B 51/30*** | (2023.01) |
| ***G11C 11/22*** | (2006.01) |
| ***H10B 51/20*** | (2023.01) |

(52) U.S. Cl.

CPC ............ *H10B 51/30* (2023.02); *G11C 11/223* (2013.01); *G11C 11/2273* (2013.01); *G11C 11/2275* (2013.01); *H10B 51/20* (2023.02)

(58) Field of Classification Search

CPC ........ H10B 51/30; H10B 51/20; H10B 51/50; H10B 51/10; G11C 11/223;

(Continued)

(56) References Cited

U.S. PATENT DOCUMENTS

| | | | |
|---|---|---|---|
| 9,007,812 B2 | 4/2015 | Koyama et al. | |
| 10,608,012 B2 * | 3/2020 | Huang .................. | H10B 43/27 |

(Continued)

FOREIGN PATENT DOCUMENTS

| | | |
|---|---|---|
| CN | 109087949 A | 12/2018 |
| WO | 2016018412 A1 | 2/2016 |

(Continued)

*Primary Examiner* — Fernando Hidalgo

(57) ABSTRACT

Thin-film Ferroelectric field-effect transistor (FeFET) may be organized as 3-dimensional NOR memory string arrays. Each 3-dimensional NOR memory string array includes a row of active stack each including a predetermined number of active strips each provided one on top of another and each being spaced apart from another by an isolation layer. Each active strip may include a shared source layer and a shared drain layer shared by the FeFETs provided along the active strip. Data storage in the active strip is provided by ferroelectric elements that can individually electrically set into one of two polarization states. FeFETs on separate active strips may be configured for read, programming or erase operations in parallel.

37 Claims, 49 Drawing Sheets

Related U.S. Application Data continuation of application No. 17/812,375, filed on Jul. 13, 2022, now Pat. No. 11,839,086.

(60) Provisional application No. 63/222,926, filed on Jul. 16, 2021.

(58) Field of Classification Search
CPC ............ G11C 11/2273; G11C 11/2275; G11C 11/2259; H10D 30/701; H10D 64/689; H10D 64/033
USPC .......................................................... 365/145
See application file for complete search history.

(56) References Cited

U.S. PATENT DOCUMENTS

| | | | | |
|---|---|---|---|---|
| 11,069,410 | B1 | 7/2021 | Cui et al. | |
| 11,217,494 | B1 | 1/2022 | Young et al. | |
| 11,839,086 | B2 * | 12/2023 | Petti | H10B 51/20 |
| 12,160,996 | B2 * | 12/2024 | Petti | H10B 51/20 |
| 2011/0073866 | A1 | 3/2011 | Kim et al. | |
| 2012/0064682 | A1 | 3/2012 | Jang et al. | |
| 2016/0237567 | A1 | 8/2016 | Sieber et al. | |
| 2016/0322368 | A1 | 11/2016 | Sun et al. | |
| 2017/0162250 | A1 | 6/2017 | Slesazeck et al. | |
| 2017/0178712 | A1 | 6/2017 | Van Houdt | |
| 2017/0248746 | A1 | 8/2017 | Banerjee et al. | |
| 2018/0166453 | A1 | 6/2018 | Müller | |
| 2019/0006376 | A1 | 1/2019 | Ramaswamy | |
| 2019/0006385 | A1 | 1/2019 | Kim et al. | |
| 2019/0103145 | A1 | 4/2019 | Tseng et al. | |
| 2019/0198509 | A1 | 6/2019 | Kim | |
| 2020/0006376 | A1 | 1/2020 | Makala et al. | |
| 2020/0357821 | A1 | 11/2020 | Chen | |
| 2021/0167073 | A1 | 6/2021 | Shivaraman et al. | |
| 2021/0174887 | A1 | 6/2021 | Sanada | |
| 2021/0217775 | A1 | 7/2021 | Zhang et al. | |
| 2021/0242239 | A1 | 8/2021 | Lin et al. | |
| 2021/0272983 | A1 | 9/2021 | Gilbert et al. | |
| 2021/0320182 | A1 | 10/2021 | Chien et al. | |
| 2021/0375933 | A1 | 12/2021 | Lu et al. | |
| 2021/0399015 | A1 | 12/2021 | Lin et al. | |
| 2021/0407845 | A1 | 12/2021 | Wang et al. | |
| 2022/0020774 | A1 | 1/2022 | Chia et al. | |
| 2022/0028894 | A1 | 1/2022 | Yang et al. | |
| 2022/0139933 | A1 | 5/2022 | Noack | |
| 2022/0199639 | A1 | 6/2022 | Yeh et al. | |
| 2022/0238551 | A1 | 7/2022 | Petti | |
| 2022/0293788 | A1 | 9/2022 | Lin et al. | |
| 2022/0367479 | A1 | 11/2022 | Lee et al. | |
| 2023/0012093 | A1 | 1/2023 | Kakushima et al. | |
| 2023/0143057 | A1 | 5/2023 | Hoang et al. | |
| 2023/0225130 | A1 | 7/2023 | Liou et al. | |

FOREIGN PATENT DOCUMENTS

| | | | |
|---|---|---|---|
| WO | 2018144957 | A1 | 8/2018 |
| WO | 2018236356 | A1 | 12/2018 |
| WO | 2021141612 | A1 | 7/2021 |
| WO | 2021178309 | A1 | 9/2021 |

* cited by examiner

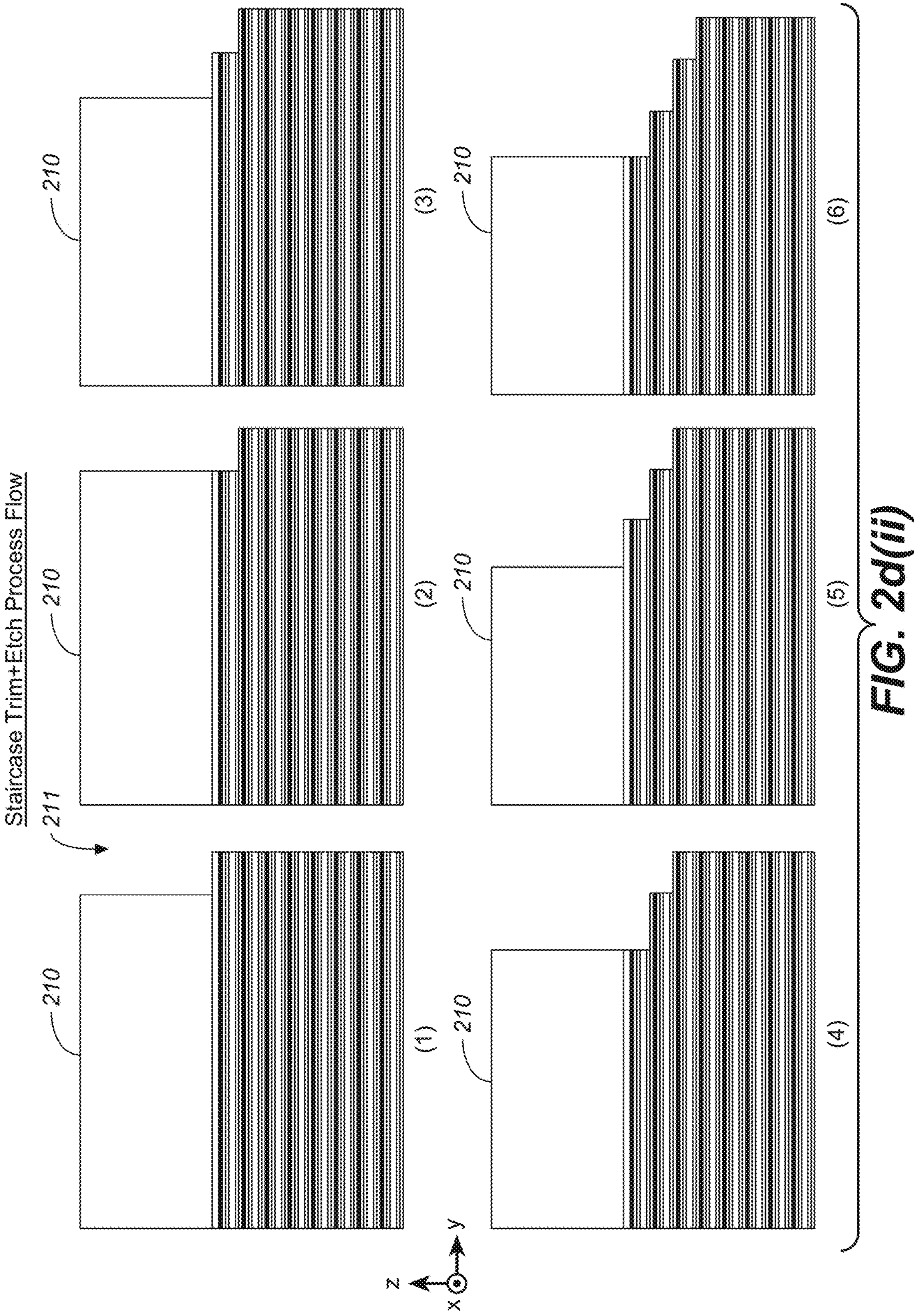
FIG. 2d(ii)

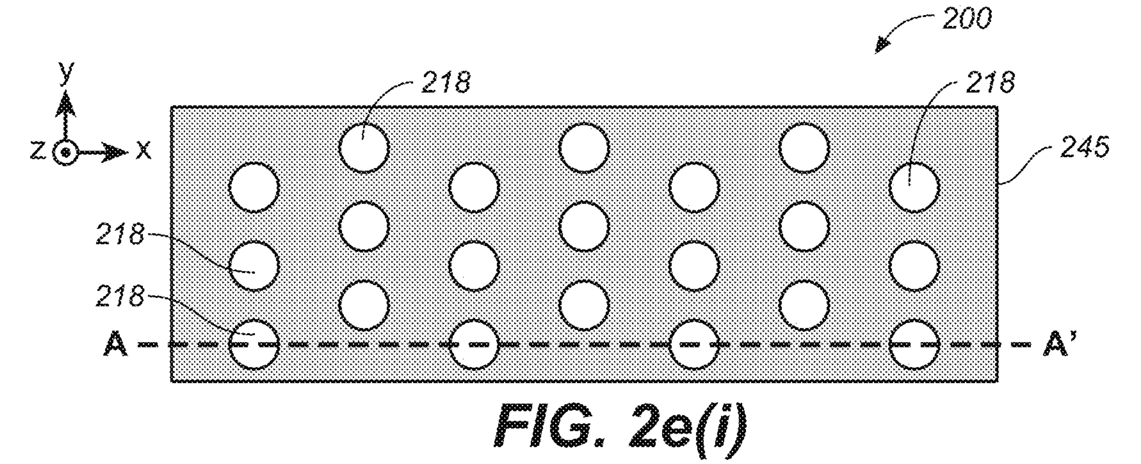
FIG. 2e(i)
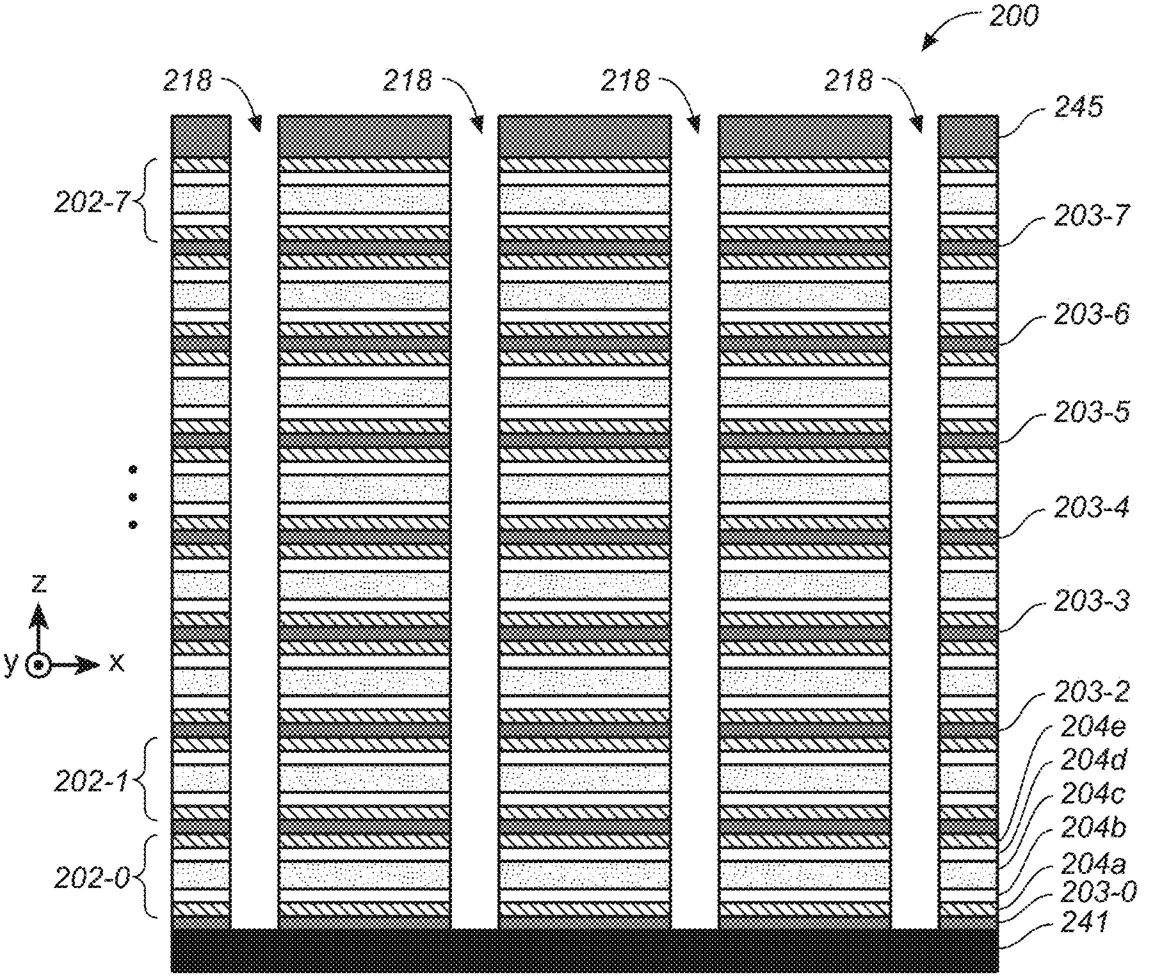
FIG. 2e(ii)

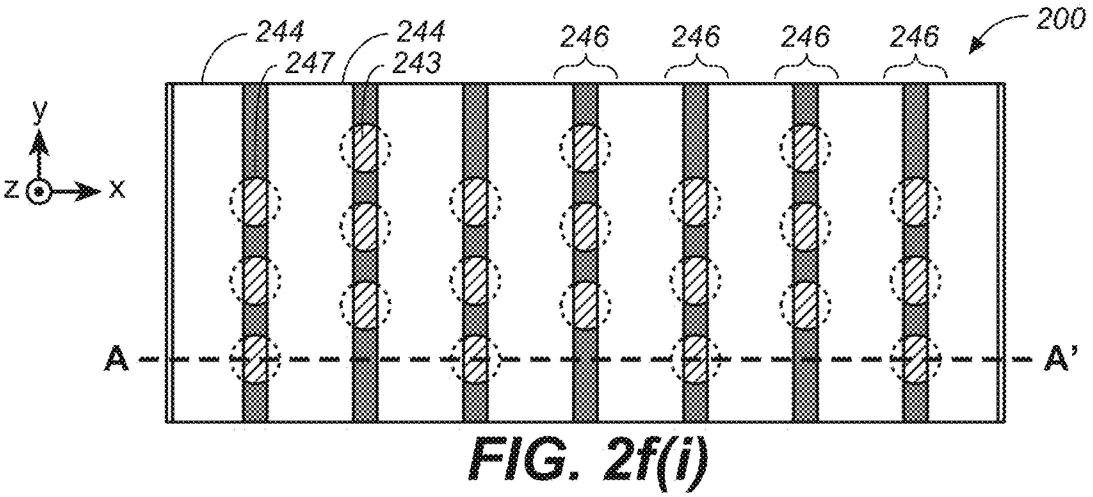
FIG. 2f(i)
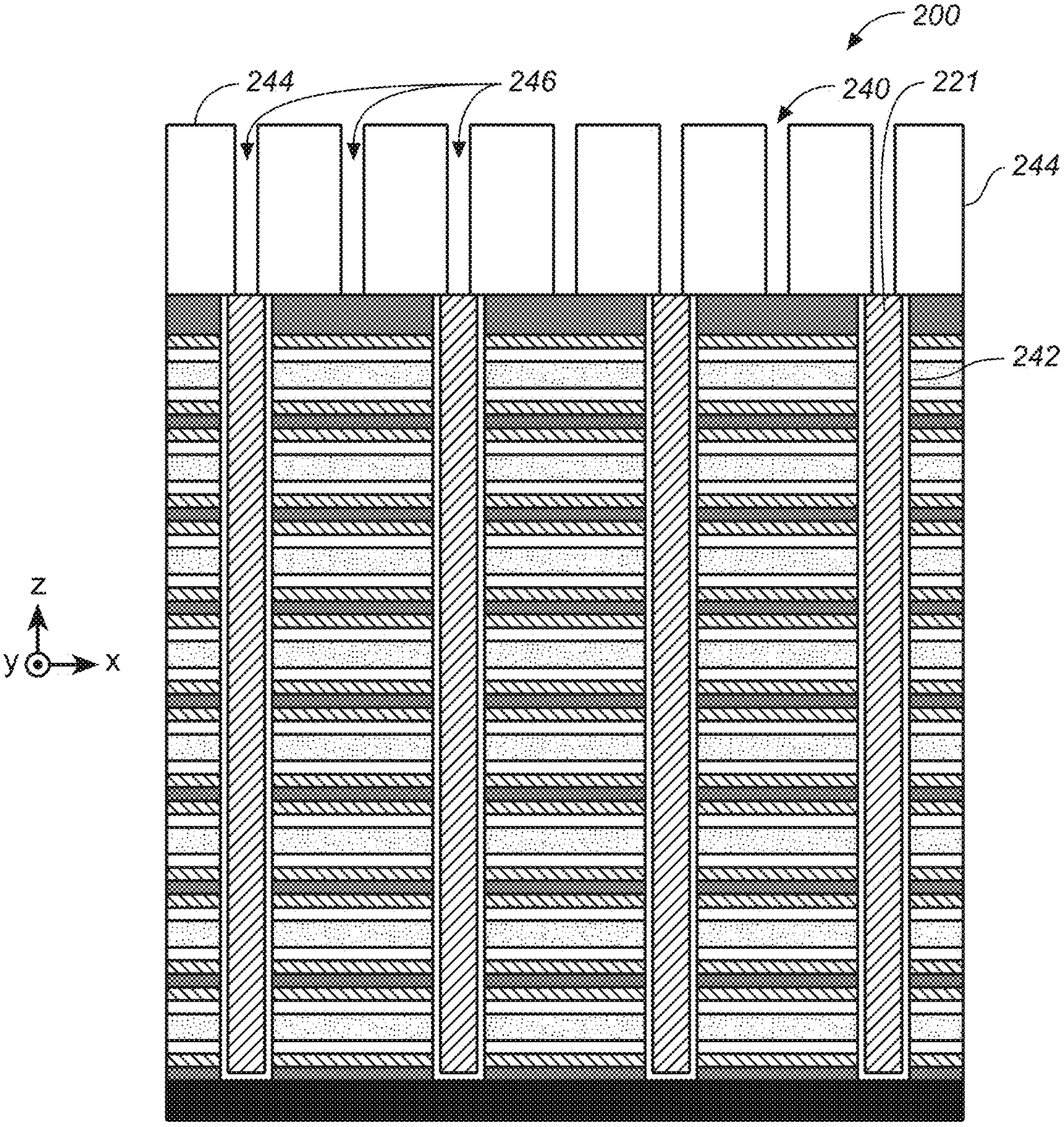
FIG. 2f(ii)

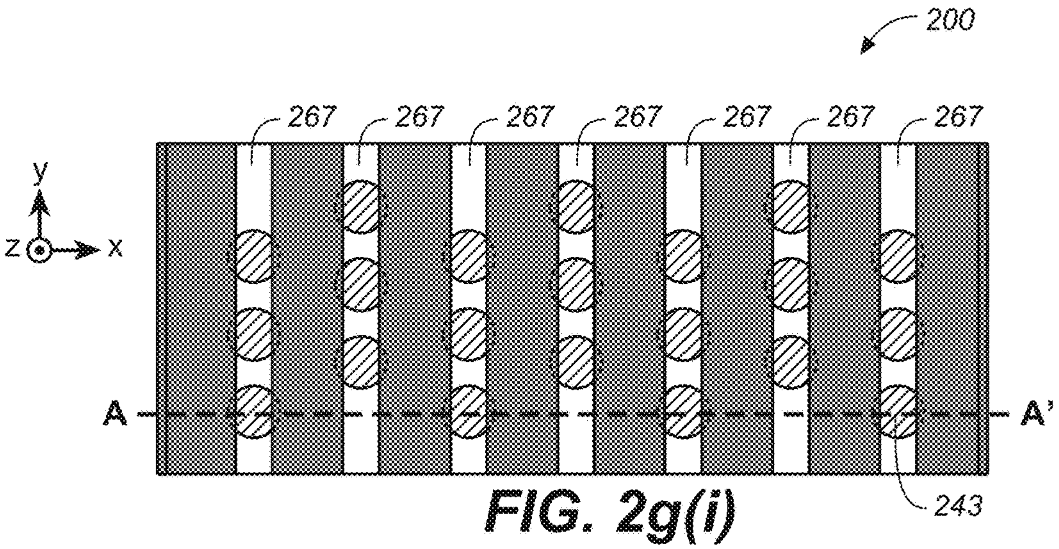
FIG. 2g(i)
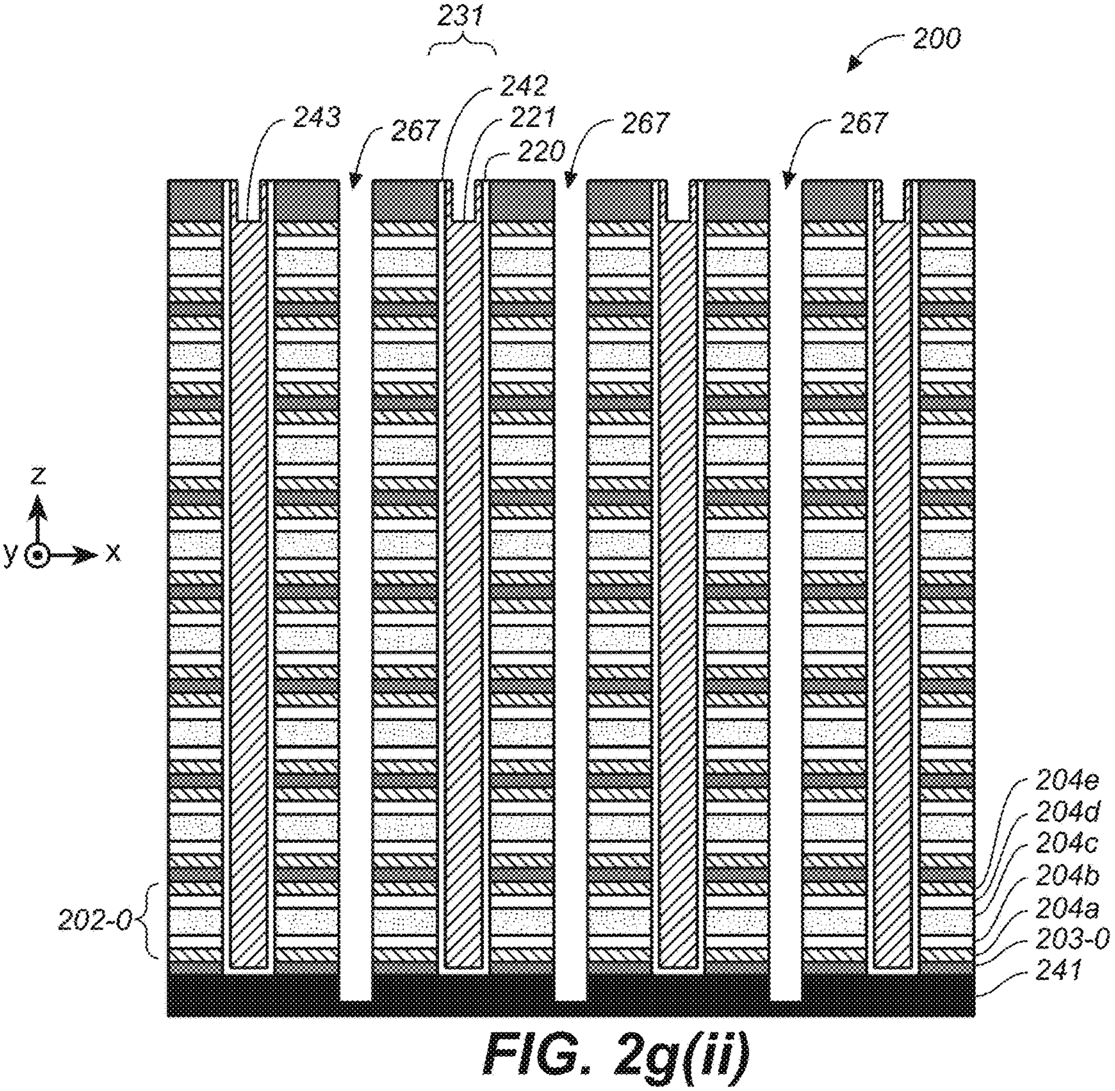
FIG. 2g(ii)

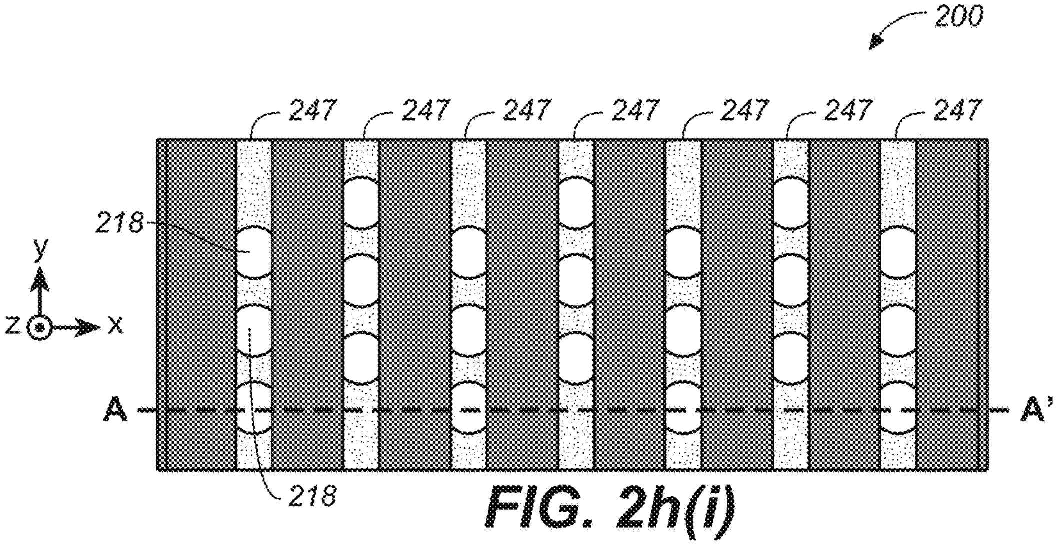
FIG. 2h(i)
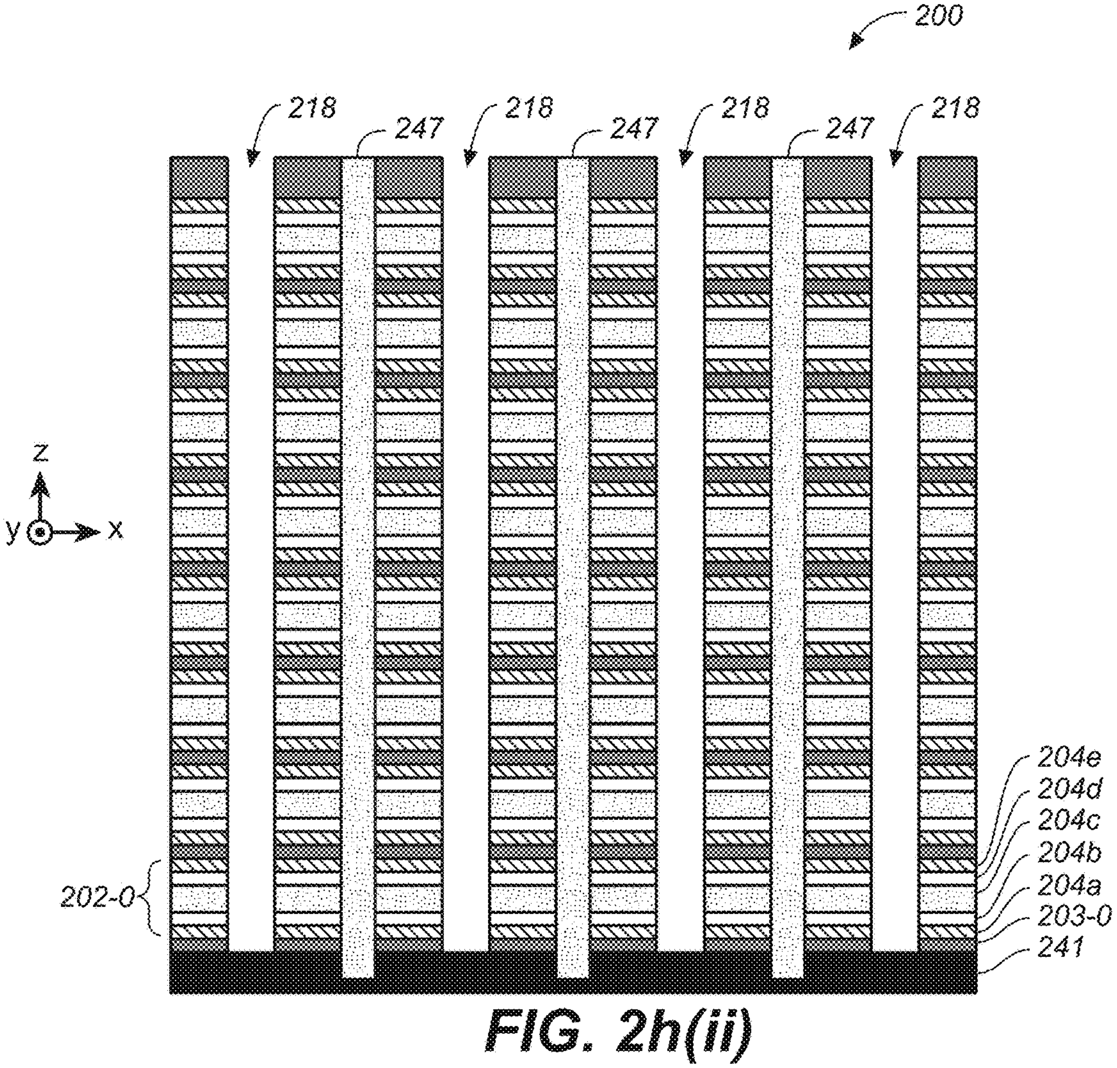
FIG. 2h(ii)

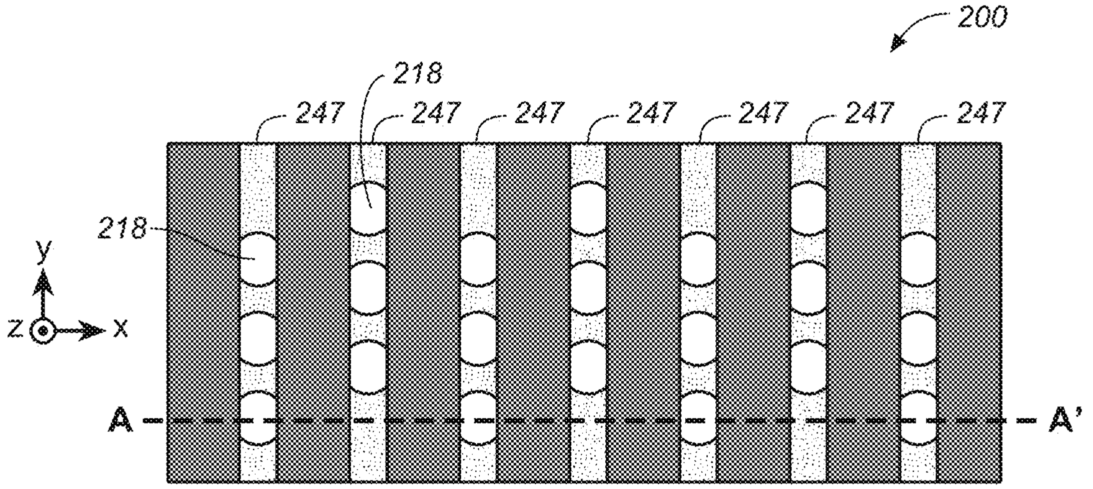
FIG. 2i(i)
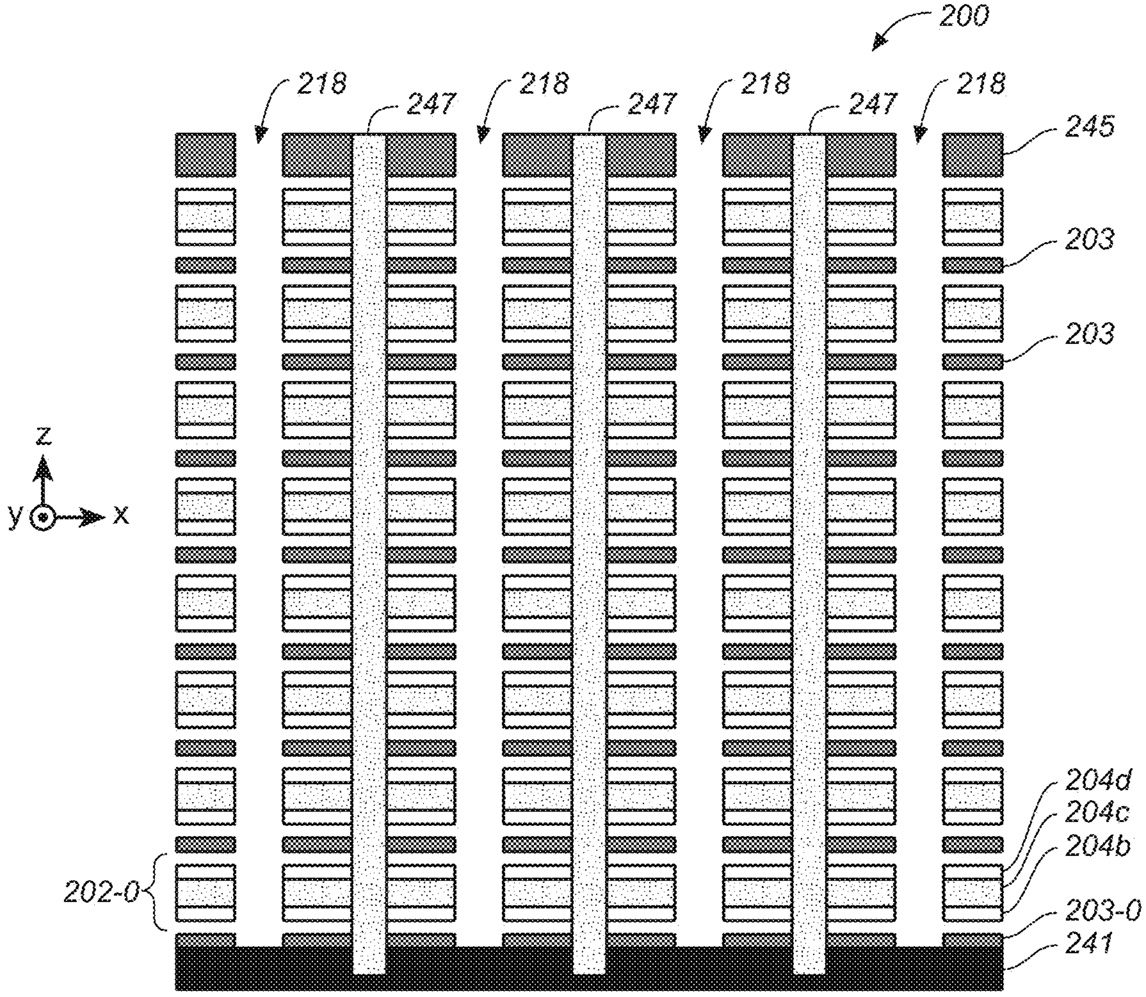
FIG. 2i(ii)

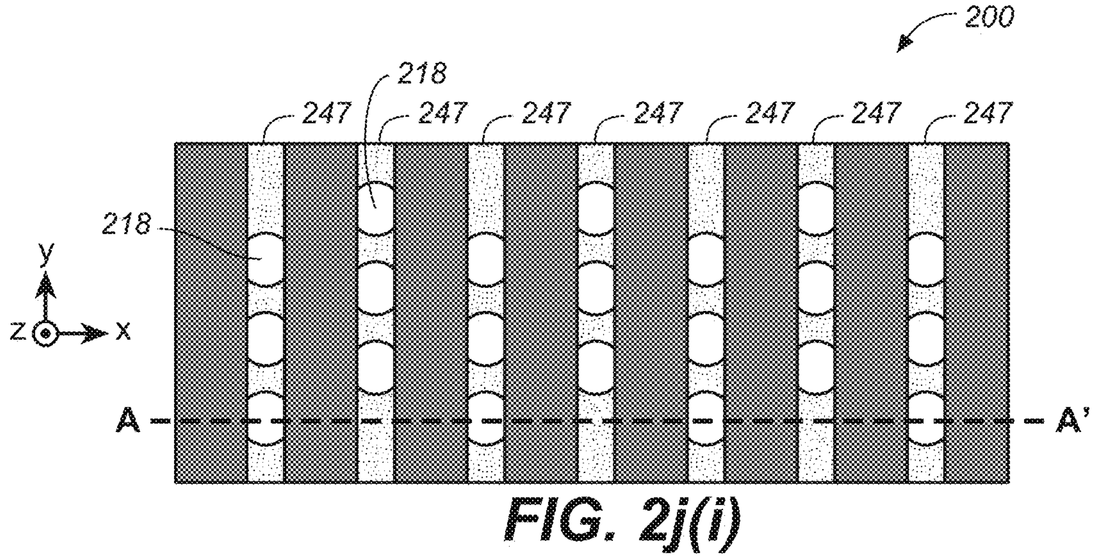
FIG. 2j(i)
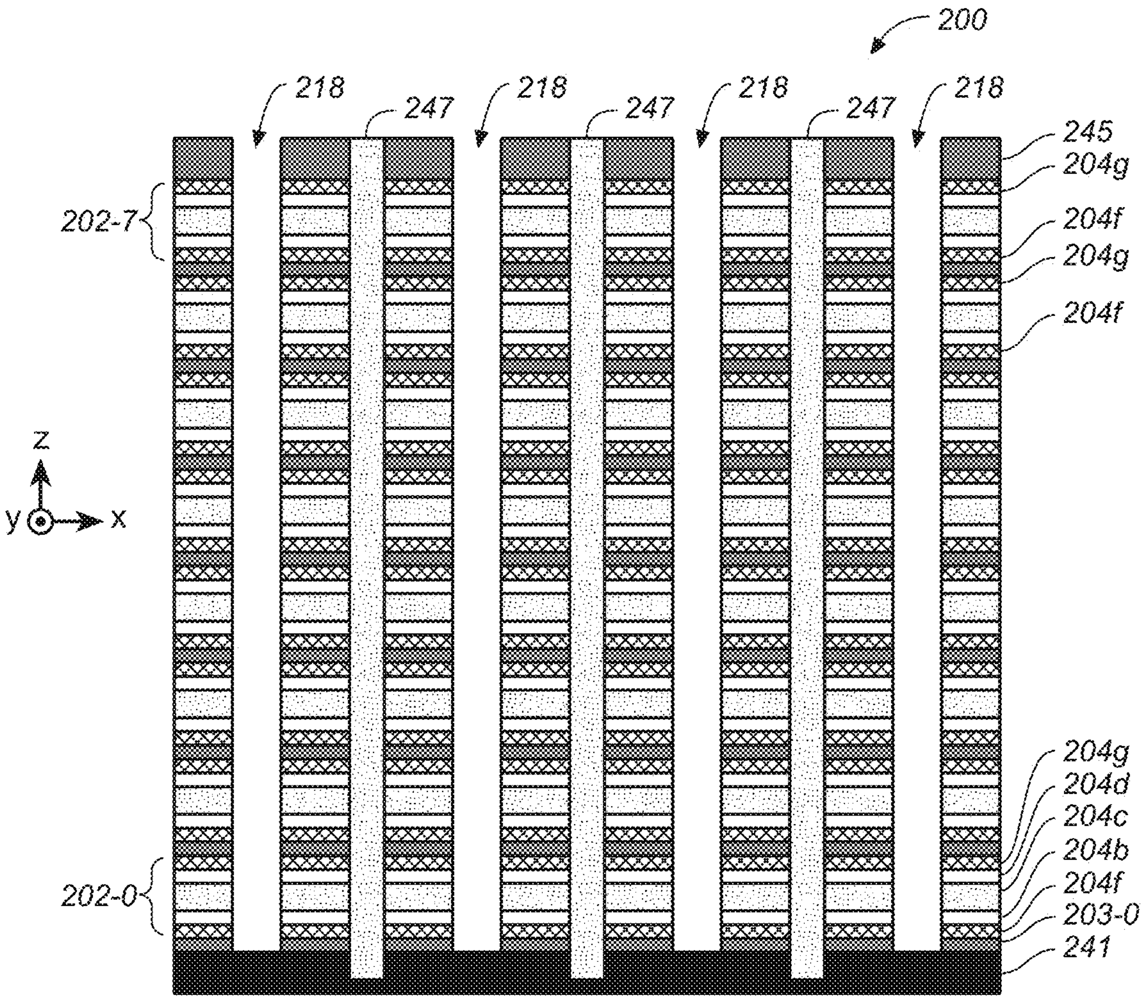
FIG. 2j(ii)

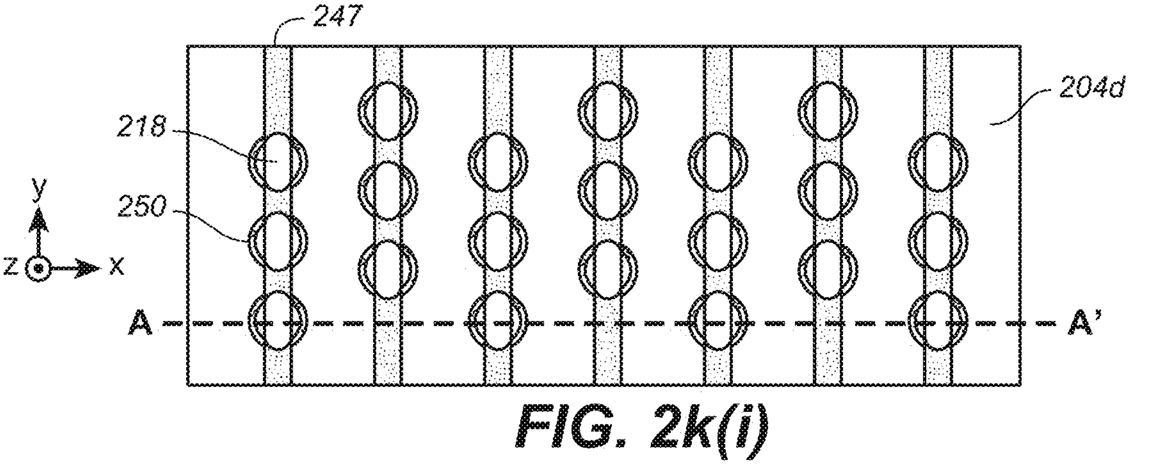
FIG. 2k(i)
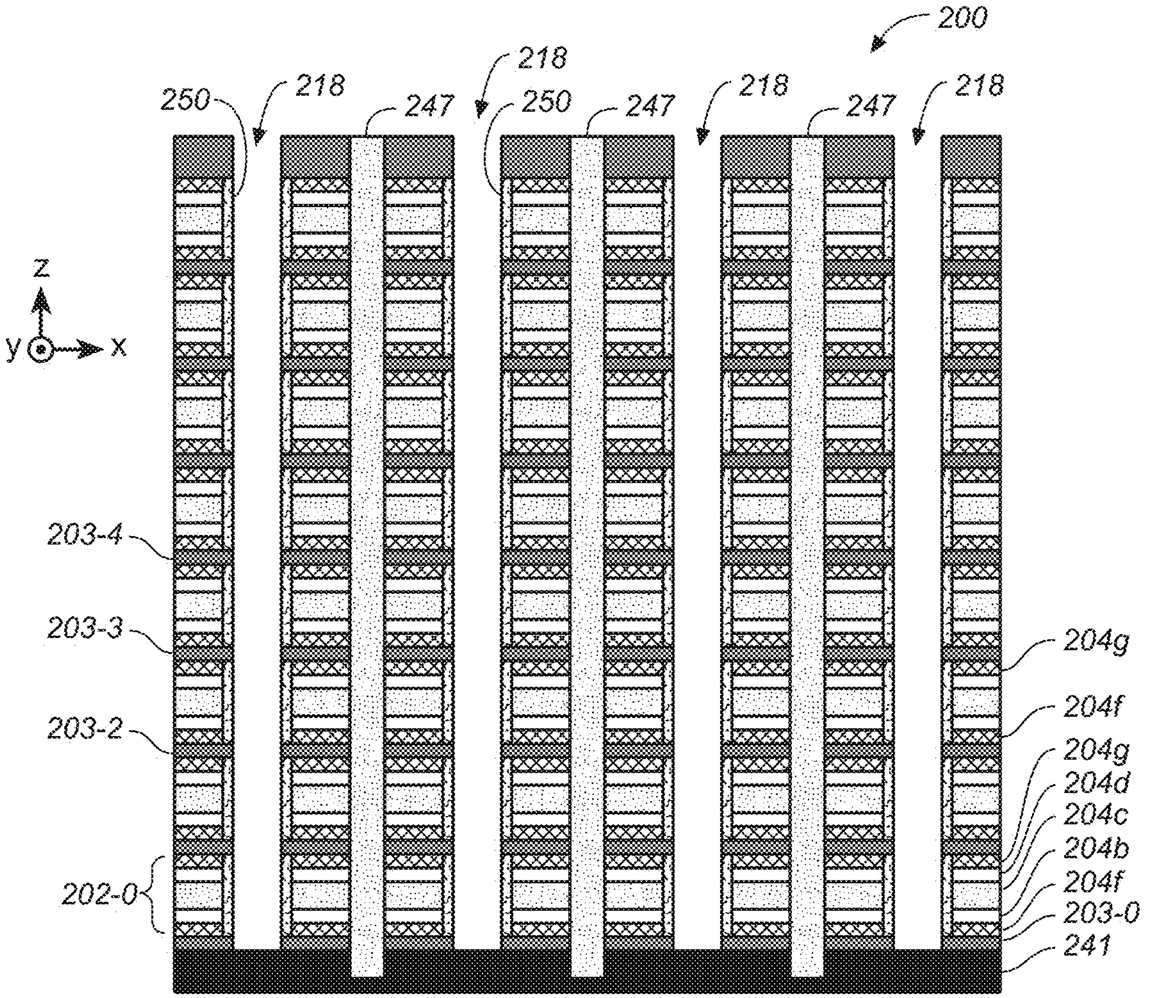
FIG. 2k(ii)

FIGURE 5d(ii)

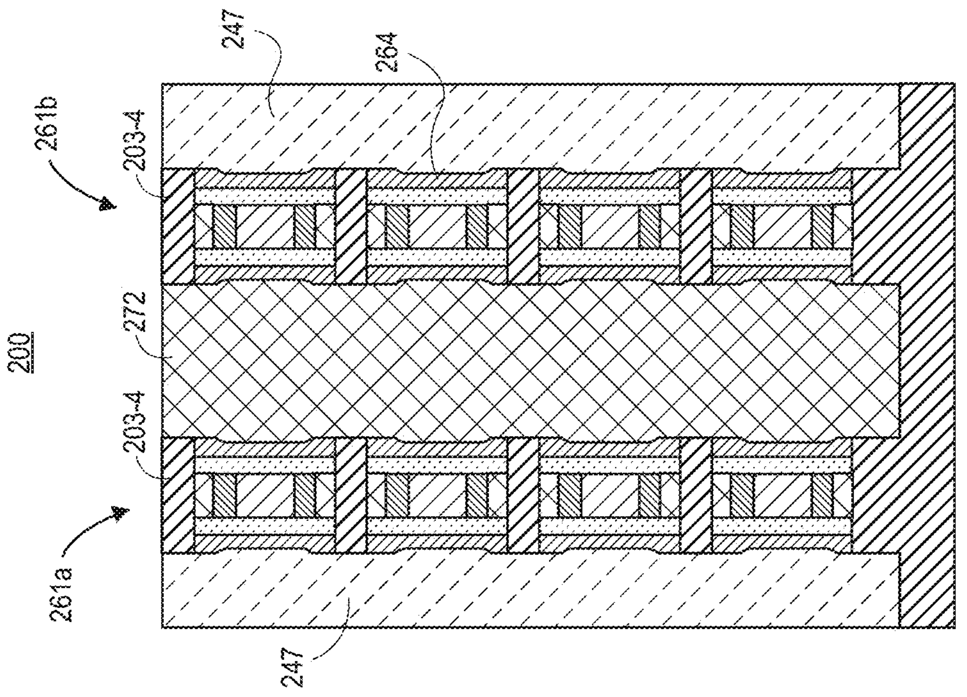
FIGURE 5f(ii)
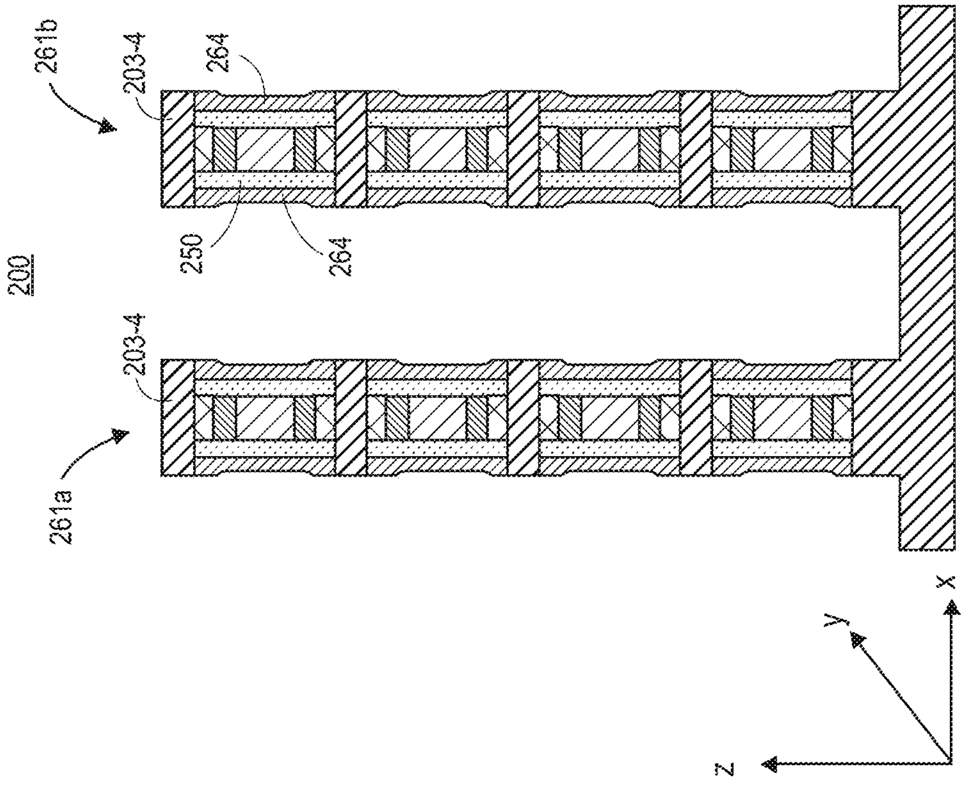
FIGURE 5e(ii)

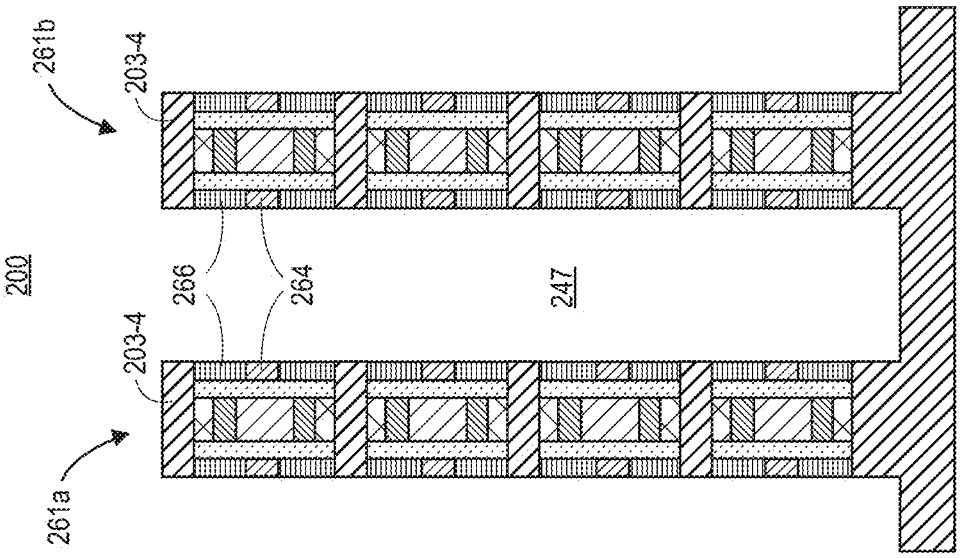
FIGURE 5e(iii)
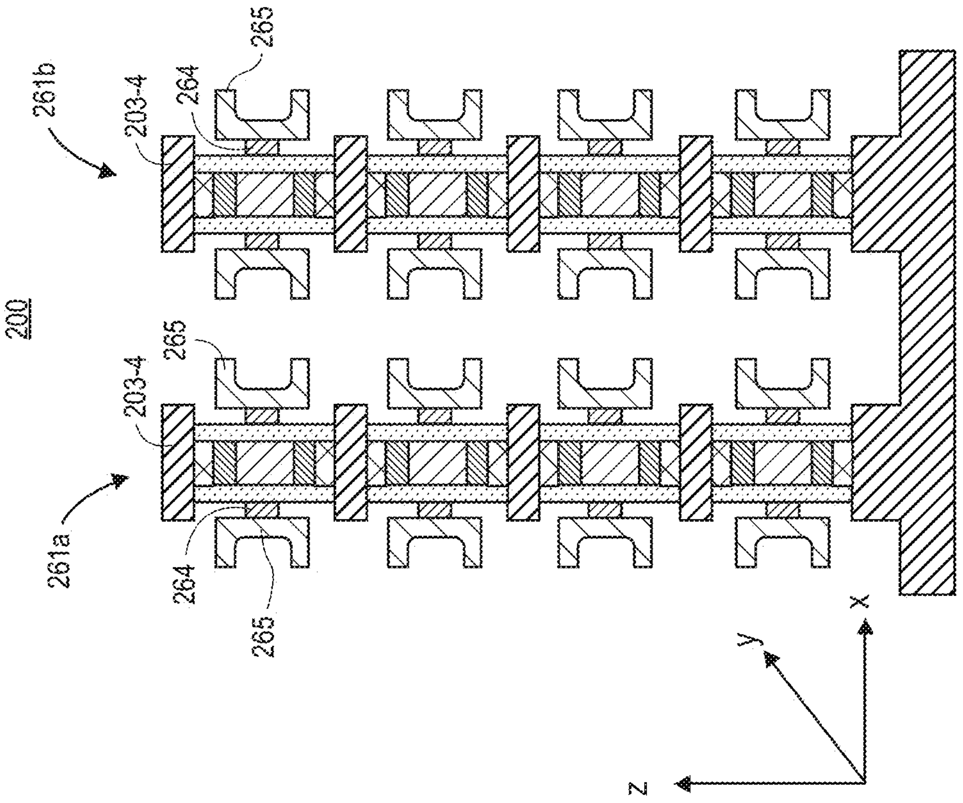
FIGURE 5d(iii)

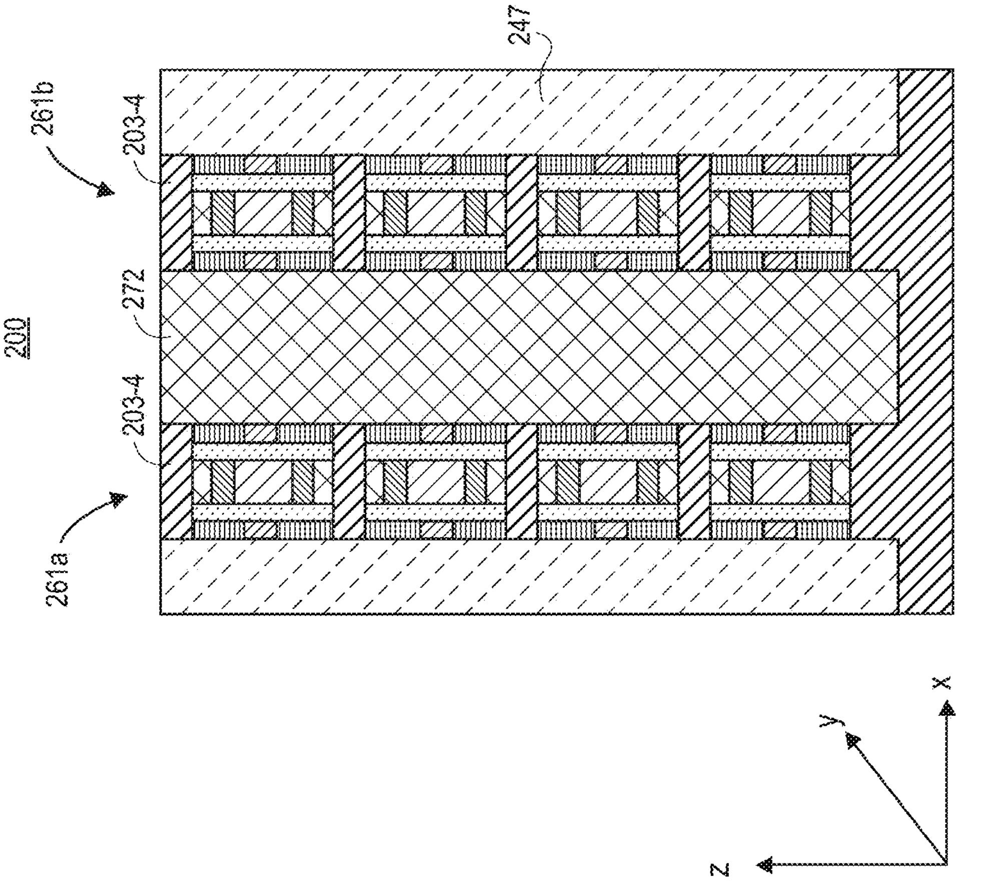
FIGURE 5f(iii)

FIG. 11k(iii)

FIG. 11p(iii)

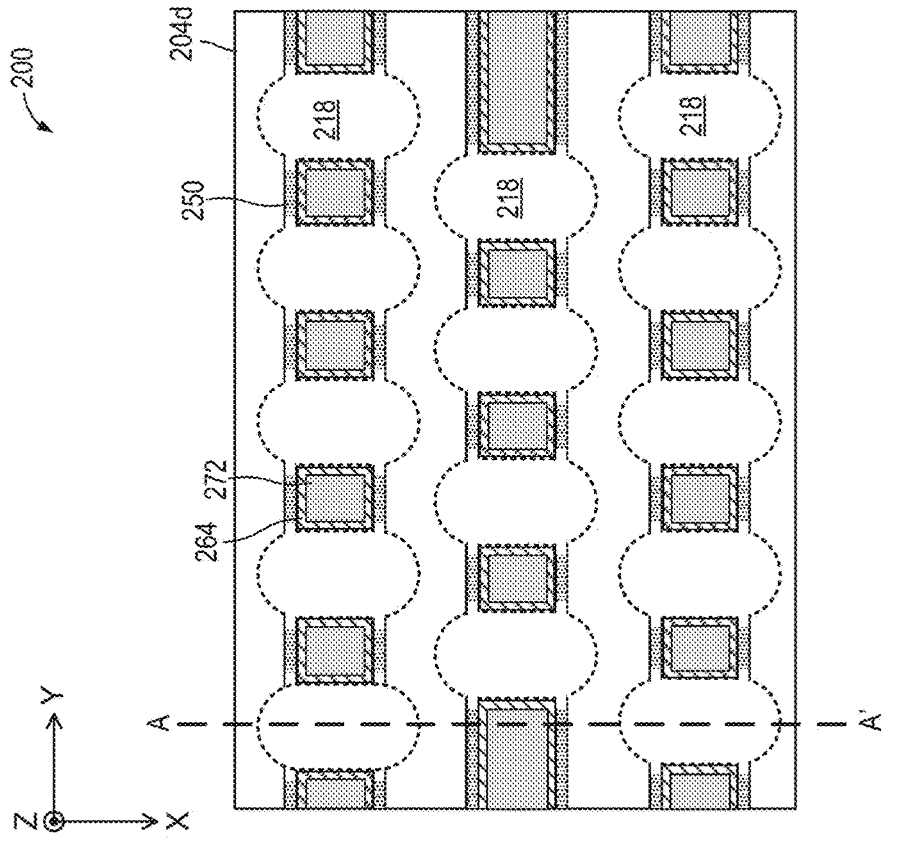
FIG. 11q(i)
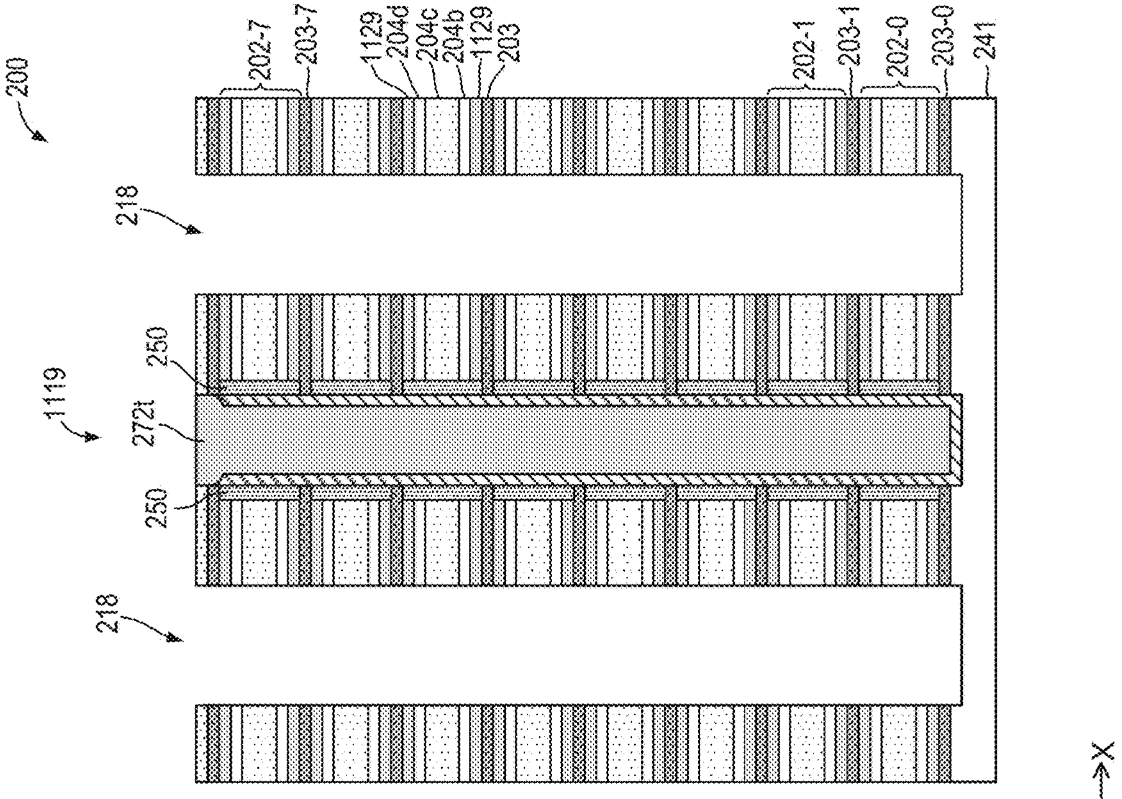
FIG. 11q(ii)

FIG. 11r(iii)

THREE-DIMENSIONAL MEMORY STRING ARRAY OF THIN-FILM FERROELECTRIC TRANSISTORS

CROSS REFERENCE TO RELATED APPLICATIONS

This application is a continuation of co-pending U.S. patent application Ser. No. 18/483,322 ("Application"), entitled 3-DIMENSIONAL MEMORY STRING ARRAY OF THIN-FILM FERROELECTRIC TRANSISTORS, filed Oct. 9, 2023, now U.S. Pat. No. 12,160,996, issued Dec. 3, 2024, which claims priority continuation of issued U.S. Pat. No. 11,839,086 (U.S. patent application Ser. No. 17/812,375) ("Parent Application"), entitled 3-DIMENSIONAL MEMORY STRING ARRAY OF THIN-FILM FERROELECTRIC TRANSISTORS, filed Jul. 13, 2022 and issued Dec. 5, 2023, which claims priority to U.S. provisional application ("Provisional Application"), Ser. No. 63/222,926, entitled "3-Dimensional Memory String Array of Thin-Film Ferroelectric Transistors," filed on Jul. 16, 2021.

The present application is related to U.S. patent application ("Non-Provisional Application I"), Ser. No. 17/674,137, entitled "Thin-film Storage Transistor With Ferroelectric Storage Layer," filed on Feb. 17, 2022, which claims priority to (i) U.S. provisional application ("Provisional Application I"), Ser. No. 63/152,266, entitled "Thin-Film Storage Transistor With Ferroelectric Storage Layer," filed on Feb. 22, 2021, and (ii) U.S. provisional application ("Provisional Application II"), Ser. No. 63/153,273, entitled "Thin-Film Storage Transistor With Ferroelectric Storage Layer," filed on Feb. 24, 2021.

The present application is related to U.S. patent application ("Non-Provisional Application II"), Ser. No. 17/382,064, entitled "Methods For Fabricating A 3-Dimensional Memory Structure Of NOR Memory Strings," filed on July 221, 2021, which claims priority to U.S. provisional application ("Provisional Application III"), Ser. No. 63/054,743, entitled "Methods For Fabricating A 3-Dimensional Memory Structure Of NOR Memory Strings," filed on Jul. 21, 2020. The present application is also related to U.S. provisional application ("Provisional Application IV"), Ser. No. 63/054,750, entitled "Methods for Fabricating A 3-Dimensional Memory Structure of NOR Memory Strings," filed on Jul. 21, 2020, now U.S. patent application Ser. No. 17/382,126, filed Jul. 21, 2021; U.S. provisional application ("Provisional Application V"), Ser. No. 63/139,435, entitled "Vertical NOR Thin-film Transistor Strings and Fabrication Thereof," filed on Jan. 20, 2021, now U.S. patent application Ser. No. 17/559,101, filed Dec. 22, 2021; and U.S. provisional application ("Provisional Application VI"), Ser. No. 63/114,958, entitled "Methods for Reducing Disturb Errors by Refreshing Data Alongside Programming or Erase Operations," filed on Nov. 17, 2020, now U.S. patent application Ser. No. 17/525,712, filed Nov. 12, 2021.

The present application is also related to U.S. non-provisional patent application ("Related Application"), Ser. No. 16/894,596, entitled "Capacitive-Coupled Non-Volatile Thin-Film Transistor Strings in Three Dimensional Arrays," filed on Jun. 5, 2020, which is a continuation of U.S. patent application Ser. No. 16/107,118, entitled "Capacitive-Coupled Non-Volatile Thin-Film Transistor Strings in Three Dimensional Arrays," filed on Aug. 21, 2018, which is a divisional application of U.S. non-provisional patent application Ser. No. 15/248,420, entitled "Capacitive-Coupled Non-Volatile Thin-Film Transistor Strings in Three Dimensional Arrays," filed on Aug. 26, 2016, which is related to and claims priority of (i) U.S. provisional application, Ser. No. 62/235,322, entitled "Multi-gate NOR Flash Thin-film Transistor Strings Arranged in Stacked Horizontal Active Strips With Vertical Control Gates," filed on Sep. 30, 2015; (ii) U.S. provisional patent application, Ser. No. 62/260,137, entitled "Three-dimensional Vertical NOR Flash Thin-film Transistor Strings," filed on Nov. 25, 2015; (iii) U.S. non-provisional patent application Ser. No. 15/220,375, "Multi-Gate NOR Flash Thin-film Transistor Strings Arranged in Stacked Horizontal Active Strips With Vertical Control Gates," filed on Jul. 26, 2016; and (vi) U.S. provisional patent application, Ser. No. 62/363,189, entitled "Capacitive Coupled Non-Volatile Thin-film Transistor Strings," filed Jul. 15, 2016.

The disclosures of Parent Application, Parent Provisional Application, Related Application, Non-Provisional Applications I and II, and Provisional Applications I, II, III, IV, V, and VI are hereby incorporated by reference in their entireties.

BACKGROUND OF THE INVENTION

1. Field of the Invention

The present invention relates to high-density memory structures. In particular, the present invention relates to high-density, low read-latency memory structures formed by interconnected thin-film storage elements (e.g., 3-dimensional array of thin-film storage transistors), including those organized as NOR-type memory strings ("NOR memory strings").

2. Discussion of the Related Art

The memory circuit structures of this detailed description may be fabricated above the planar surfaces of one or more semiconductor substrates (e.g., silicon wafers) using conventional fabrication processes. In this description, "vertical" refers to a direction substantially normal to a planar surface of a semiconductor substrate, and "horizontal" refers to any direction that is orthogonal to "vertical." A Cartesian coordinate system may therefore be adopted, in which "horizontal" refers to any direction substantially parallel to the planar surface of semiconductor substrate, which is a surface spanning any two non-colinear horizontal directions X and Y (also referred to as the "X-Y plane"). Similarly, with respect to that Cartesian coordinate system, "vertical" refers to a normal direction (also referred to as the "Z-direction") to the planar surface.

A NOR-type memory string includes storage transistors that share a common source region and a common drain region, while allowing each storage transistor to be individually addressed and accessed. The Related Application discloses 3-dimensional arrays of NOR memory strings ("NOR memory strings") of charge storage transistors. The Related Application discloses, for example, a NOR memory string that includes (i) a common source region and a common drain region both running lengthwise along a horizontal direction and (i) the gate electrodes for the charge storage transistors each running along a vertical direction.

Advances in electrically polarizable materials ("ferroelectric materials"), especially those used in electronic circuits, suggest new potential applications in ferroelectric memory circuits. For example, the article "Ferroelectricity in Hafnium Oxide: CMOS compatible Ferroelectric Field Effect Transistors," by T. S. Böscke et al., published in 2011 *International Electron Devices Meeting* (*IEDM*), pp. 24.5.1-

24.5.4 (doi: 10.1109/IEDM.2011.6131606), discloses a ferroelectric field effect transistor ("FeFET") that uses hafnium oxide as a gate dielectric material. By controlling polarization in a ferroelectric gate dielectric layer, the FeFET may be programmed to have one of two or more selectable threshold voltages. Each threshold voltage of the FeFET constitutes a state (e.g., a "programmed" state, an "erased" state, or any other state that represents a designated binary value). Such an FeFET has application in high-density memory circuits. For example, U.S. patent application Ser. No. 13/897,037, entitled "Apparatuses having a ferroelectric field-effect transistor memory array and related method," by D. V. Nirmal Ramaswamy et al., filed on May 17, 2013, now U.S. Pat. No. 9,281,044, discloses a 3-dimensional array of FeFETs.

The FeFETs of the prior art, however, suffer from low endurance. For example, the article "Vertical Ferroelectric $HfO_2$ FET based on 3-D NAND Architecture: Towards Dense Low-Power Memory," by K. Florent et al., published in 2018 *IEEE International Electron Devices Meeting* (*IEDM*), 2018, pp. 2.5.1-2.5.4 (doi: 10.1109/IEDM.2018.8614710), discloses an endurance of merely $10^4$ cycles. Such low endurance renders the memory circuits practically unsuitable for many memory applications. It is highly desirable to have a memory circuit that can serve as a building a block of a main memory system. Current building blocks of main memory systems (e.g., dynamic random-access memory (DRAM)) have low retention time and low memory density.

SUMMARY

According to one embodiment of the present invention, an array of memory cells includes FeFETs formed in stacks of horizontal active strips, with vertical control gate electrodes (also referred to as "local word lines") provided along one or both sidewalls of the active strips, the control gate electrodes being separated from their associated active strips by one or more polarizable or ferroelectric elements (also referred to as "ferroelectric or polarization layers"). Polarization of the polarizable element in an FeFET changes the threshold voltage the FeFET. Each active strip may include a channel layer formed adjacent both a common source region and a common drain region. In one embodiment, in a given stack of active strips (also referred to as an "active stack"), the polarizable or ferroelectric elements associated with the FeFETs of each active strip are separated from the polarizable or ferroelectric elements associated with the FeFETs of other active strips. The FeFETs of each active strip may be organized as one or more NOR memory strings. Further, independently addressable FeFETs may be formed along opposite sides of an active strip to achieve twice the memory density than if the FeFETs are formed as a single file along the length of the common bit line. Furthermore, by forming channel regions of the FeFETs along the vertical sidewalls of each active strip (i.e., between the common drain region and the common source region), a memory density that is substantially higher than is achieved in the prior art is possible because the volume of the channel region, even with a large extent along the Z-direction, has an insignificant footprint in the X-Y plane.

In one embodiment, only the common drain region (also referred to as a "common bit line") of the FeFETs in a NOR memory string is electrically and selectively connected by one or more conductors to one of several voltage sources. In one embodiment, the common source region may be pre-charged to a predetermined voltage prior to a read, program (sometimes also referred to as "write"), or erase operation, and is held to that predetermined voltage by the parasitic capacitance associated with the common source region during the read, program (sometimes also referred to as "write"), or erase operation. In one embodiment, one or more arrays of NOR memory strings may be organized and formed as an independently addressable modular memory circuit (also referred herein as a "tile"). A group of tiles may be formed above the same substrate but are configured to each be independently controlled and operated, thereby allowing massively parallel read, program or erase operations to be carried out concurrently on the tiles. The NOR memory strings within each tile may also be organized in groups that are configured to each be independently controlled and operated.

In one embodiment, in a 3-dimensional array of NOR memory strings, FeFETs are formed on both side edges along the lengths of each active strip, with vertical local word lines being provided along both side edges. High density is achieved by sharing the local word lines between their adjacent active stacks, each local word line serving as a common gate electrode to vertically aligned FeFETs in the active strips of both active stacks. The vertical local word lines may be contacted by interconnection conductors (also referred to as "global word lines") provided above or below the 3-dimensional array of NOR memory strings. The global word lines may run along a direction transverse to the lengths of the contacted active strips.

Organizing the FeFETs as 3-dimensional arrays of NOR memory strings—rather than as NAND memory strings, for example—results in (i) reduced read-latencies approaching those of dynamic random access memory (DRAM) arrays, (ii) reduced sensitivities to read-disturb and program-disturb conditions, (iii) reduced power dissipation and a lower cost-per-bit metric relative to planar NAND or DRAM memory arrays, and (iv) the ability to read, write or erase FeFETs on multiple active strips concurrently, thereby significantly increasing data throughput.

According to one embodiment of the present invention, undesirable effects on a memory operation due to variations among FeFETs within an array of NOR memory strings may be overcome by processing the memory operation in conjunction with FeFETs in a designated reference NOR memory string within the same array. For example, effects on a read operation of an FeFET of a NOR memory string due to a background leakage current present in NOR memory strings can be substantially mitigated by comparing the sensed result of a concurrently read FeFET within a reference NOR memory string. In some embodiments, the ferroelectric or polarizable elements may have a data retention time that requires refreshing to meet data stability requirements in some applications. Relative to storage transistors in conventional non-volatile memory circuits (e.g., non-volatile NAND memory strings), which do not require refreshing in those applications, the FeFETs may be considered "quasi-volatile" (QV) storage transistors. The FeFETs are considered quasi-volatile because, as compared to conventional volatile memory circuits (e.g., DRAM circuits), the FeFETs require refreshing significantly less frequently. For example, FeFETs in high density arrays need only be refreshed, restored, or replaced, once every few minutes, hours or every few days, and may be accomplished by accessing the FeFETs individually or accessed concurrently as one or more groups. Such refresh operations ensure long term stable and reliable operations. The refresh operations may also be performed in the background, without interfering regular user read, erase or write operations.

The present invention is better understood upon consideration of the detailed description below, in conjunction with the accompanying drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the FIGS. are not necessarily to scale.

FIGS. 2*b*-1, 2*b*-2, 2*b*-3, 2*b*-4 and 2*b*-5 show various examples of active layer 220*a*, according to one embodiment of the present invention.

FIG. 2*k* illustrates, preceding steps that form the gate stacks of the FeFETs, a step for providing a channel region for each FeFET; the channel region may be provided by any one group of the groups of process steps described in conjunction with FIGS. 3*a* to 3*b*, FIGS. 4*a* to 4*c* and FIGS. 5*a* to 5*f*, respectively.

FIG. 2*l* shows an X-Z plane cross section through a row of local word lines 208*g-a*, showing active strips formed out of active layers 202-7 and 202-6, according to one embodiment of the present invention.

FIGS. 5*a*, 5*b*, 5*c*, 5*d*(*i*), 5*d*(*ii*), 5*e*(*i*), 5*e*(*ii*), 5*f*(*i*) and 5*f*(*ii*) illustrate a third group of process steps for forming the gate stacks in the FeFETs of an array of NOR memory strings, according to one embodiment of the present invention.

FIG. 9*b* also shows (i) programmable reference slice 114-Ref (indicated by area A) in quadrant Q3 similarly providing corresponding reference FeFETs for slice 114 in mirror image quadrant Q1, sharing sense amplifiers SA (b), and (ii) programmable reference plane 110-Ref in quadrant Q2 providing corresponding reference FeFETs to plane 110 in mirror image quadrant Q1, sharing sense amplifiers SA (c), and also providing corresponding reference FeFETs for NOR memory strings in the same quadrant (e.g., NOR memory string 112).

FIG. 9*c* also show spare planes 117, which may be used to provide replacement or substitution NOR memory strings or pages in quadrant Q2.

DETAILED DESCRIPTION OF THE PREFERRED EMBODIMENTS

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps The present inventors realize that certain polarizable materials (also referred to as "ferroelectric materials") may be used to form storage elements in memory applications. Such ferroelectric materials include, for example, hafnium oxide, which have been used in forming charge-trapping layers in non-volatile or quasi-volatile memory circuits. According to one embodiment of the present invention, high-density data storage may be achieved using ferroelectric field-effect transistors ("FeFETs") as the storage transistors of a 3-dimensional memory array (e.g., an array of NOR memory strings). The present invention, as illustrated herein, provides high endurance, long data retention, and relatively low voltage operations for both erase (under 7.0 volts) and programming (e.g., under −7.0 volts) operations. By combining their ferroelectric or polarization characteristics with the 3-dimensional organization (e.g., as thin-film NOR memory strings described herein), memory arrays formed out of the FeFETs of the present invention achieve the additional benefits of high-density, low-cost, high-speed randomly accessed memory circuits (e.g., low read latency).

Figures 1, 1A:
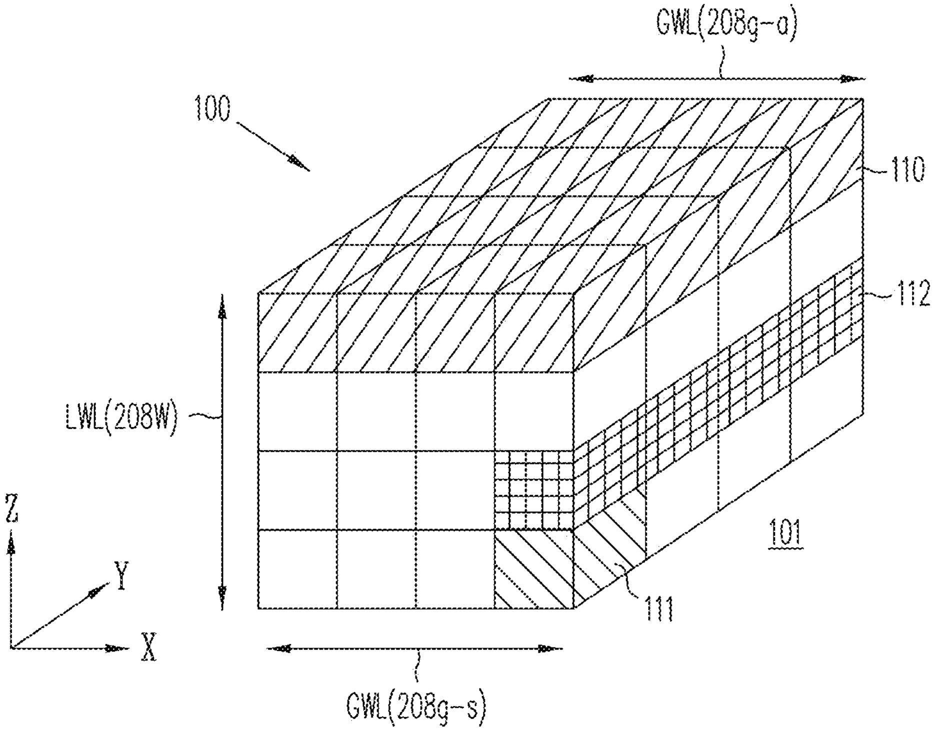
FIGS. 1*a*-1 and 1*a*-2 each show conceptualized memory structure 100, which illustrates an organization of ferroelectric field-effect transistors (FeFETs) in an array of NOR memory strings, according to one embodiment of the present invention.
Figures 1, 1A, 2:
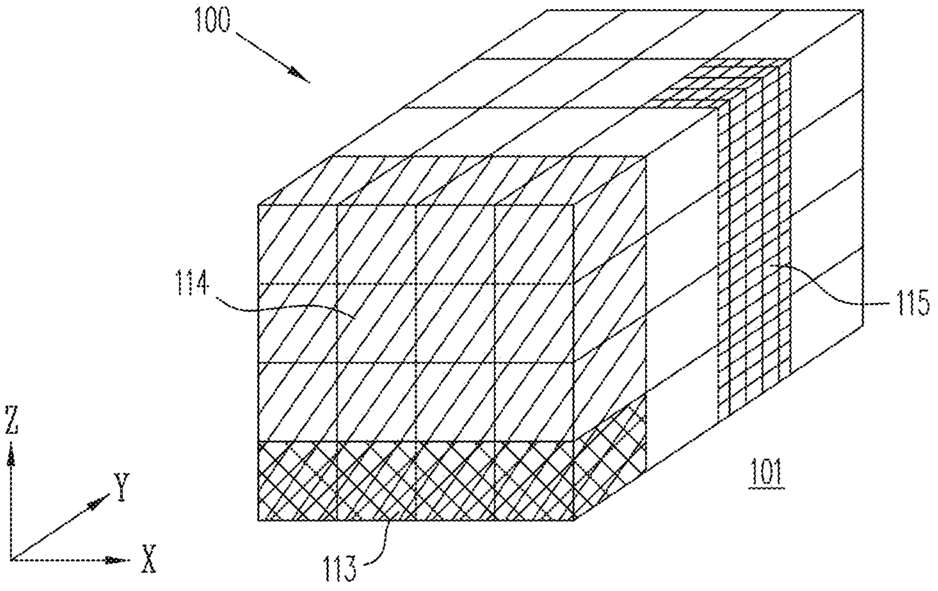

FIGS. 1*a*-1 and 1*a*-2 show conceptualized memory structure 100, which illustrates an organization of ferroelectric field-effect transistors (FeFETs) in an array of NOR memory strings, according to one embodiment of the present invention. This detailed description is facilitated by adopting as reference a Cartesian coordinate system, as indicated in FIGS. 1*a*-1 and 1*a*-2. Conceptualized memory structure 100, provided herein as an abstraction of certain salient characteristics of a memory structure of the present invention, represents an array of NOR memory strings fabricated over a surface of substrate 101. Conceptualized memory structure 100, being an abstraction, is not drawn to scale along any of the X-, Y-, and Z-directions. Substrate 101 may be, for example, a conventional silicon wafer having a top layer with a planar surface for fabricating integrated circuits, as is familiar to those of ordinary skill in the art. Thus, under this adopted Cartesian coordinate system, the term "horizontal" refers to any direction parallel to the planar surface of substrate 101, which is a surface of an X-Y plane. Similarly, the term "vertical" refers to the Z-direction or a normal to the planar surface.

As shown in both FIGS. 1*a*-1 and 1*a*-2, four planes (e.g., plane 110) of conceptualized memory structure 100 are isolated from each other and stacked one on top of another in the vertical direction. FIGS. 1*a*-1 and 1*a*-2 each show four horizontal active strips of NOR memory strings in each plane (e.g., active strip 112). As discussed below in further detail in this detailed description, each active strip—which includes several material layers extending lengthwise along the Y-direction—may have formed therein one or more NOR memory strings. Each NOR memory string includes numerous FeFETs (e.g., FeFET 111) sharing a common drain region and a common source region, the FeFETs being formed side-by-side along one or both sides of the active strip, with the thin-film FeFET current flowing through a channel region along the vertical direction. In an FeFET, the polarization in the ferroelectric element affects its threshold voltage.

In data storage or memory applications, two different threshold voltage values are selected to represent the values of a binary data bit. In such applications, the polarization states of the FeFET may be referred to as being in the "erased state" or the "programmed" state. In a NOR memory string, programming (also referred to as "writing"), reading or erasing any one of the FeFETs does not require activating any other FeFETs in the same NOR memory string. Accordingly, each FeFET of a NOR memory string is randomly addressable and accessible. FeFETs in close proximity that are not intended for the read, program or erase operation, however, are protected from unintended programming or erasing by having their transistor terminals suitably biased, often referred to as "program-inhibit" or "erase-inhibit" operations. Furthermore, an FeFET that has been accessed repeatedly may experience a gradual shift in its threshold voltage due to a phenomenon commonly referred to as "read-disturb." Indeed, even programmed or erased FeFETs need to be protected from shifts in their threshold voltages ("disturbed") during read, write or erase operations on nearby FeFETs. One effective way to mitigate these "disturb" conditions is a "refresh" operation on the FeFET. The refresh operation is designed to read and restore the programmed or erased state of the FeFET before its threshold voltage shifted too much. In some embodiments, an error detection and correction (ECC) operation may accompany the refresh operation, thereby allowing the correct data to be restored, even if the disturb condition has shifted the FeFET to an incorrect polarization state.

FIG. 1*a*-2 introduces additional randomly addressable units of memory cells that may be organized in an array of NOR memory strings: "columns," "pages" and "slices". For example, each column (e.g., column 115) represents the vertically-aligned FeFETs of multiple NOR memory strings in the active strips of an active stack; these vertically-aligned FeFETs share a common control gate or local word line. Each "page" refers to a fixed number FeFETs (e.g., a fixed number of FeFETs arranged along the X-direction, indicated in FIG. 1*a*-2 as page 113), and each "slice" refers to an organization of contiguous FeFETs that extend along both the X- and Z-directions and one FeFET deep along the Y-direction, indicated in FIG. 1*a*-2 by reference numeral 114.

Although illustrated by conceptualized memory structure 100, which is shown in the figures as an array having a 4 planes by 4 active strips organization, a memory structure of the present invention may have any number of FeFETs along any of the X-, Y- and Z-directions. For example, there may be 1, 2, 4, 8, 16, 32, 64 . . . planes in the Z direction, 2, 4, 8, 16, 32, 64, . . . active strips along the X-direction, and each NOR memory string in each active strip may have 2, 4, 8, 16, . . . 8192 or more FeFETs formed along the Y-direction. The use of numbers that are integer powers of 2 (i.e., $2^n$, where n is an integer) herein follows a customary practice in conventional memory design. It is customary to access each addressable unit of memory by decoding a binary address. Thus, for example, a memory structure of the present invention may have M NOR memory strings along each of the X and Z directions, with M being a number that is not necessarily $2^n$, for any integer n. FeFETs of the present invention may be organized such that reading, programming or erasing may be performed simultaneously on an individual page or individual slice basis. In some embodiments, an erase operation can also be performed in simultaneously for FeFETs in an even larger addressable unit of the array of NOR memory strings.

Figure 1B:
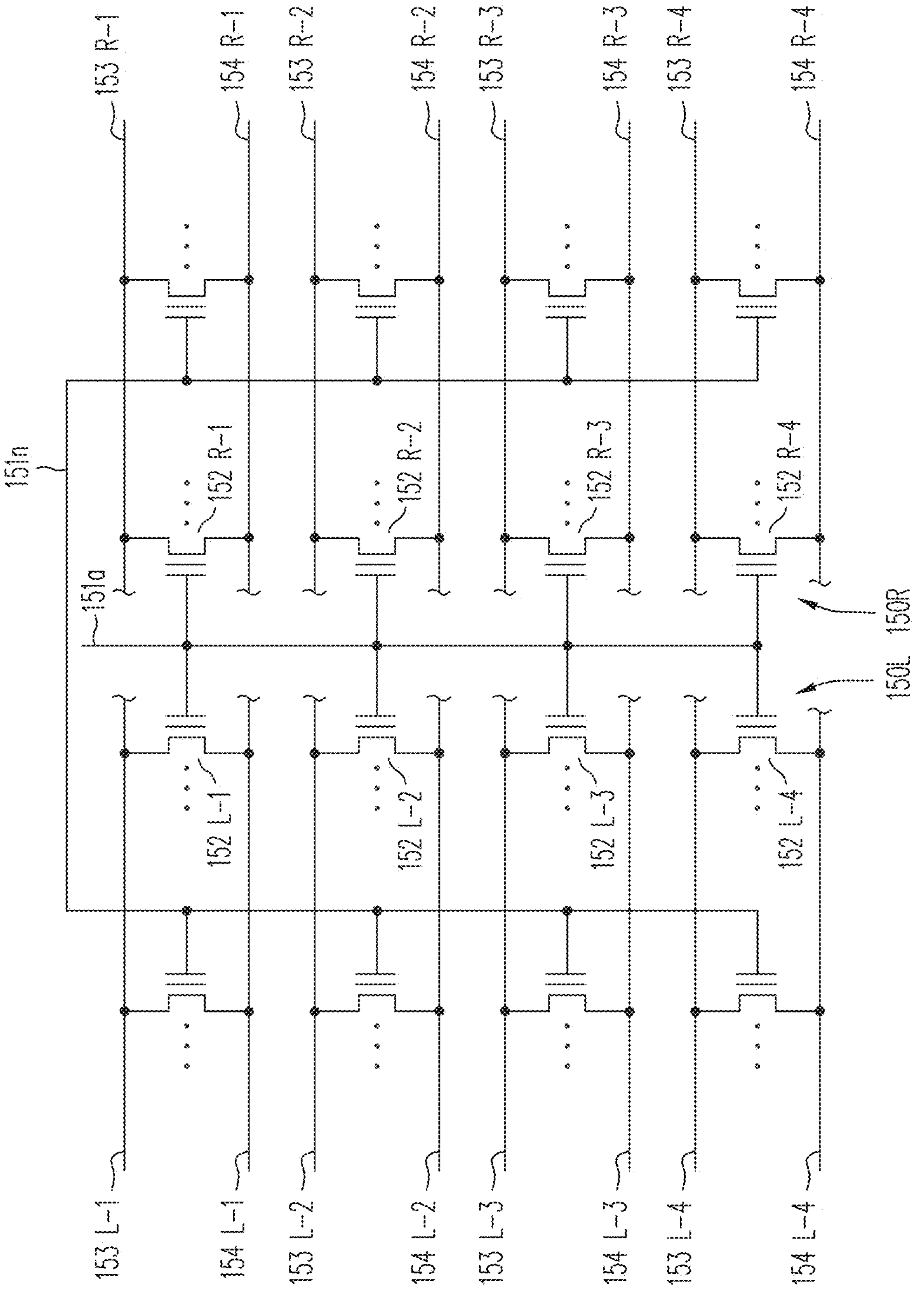
FIG. 1*b* shows a basic circuit representation of four NOR memory string-pairs, each NOR memory string-pair including two NOR memory strings provided on the same plane (i.e., one of planes 159-1, 159-2, 159-3 and 159-4), according to one embodiment of the present invention.

FIG. 1*b* shows a basic circuit representation of four NOR memory string-pairs, with each NOR memory string-pair including two NOR memory strings located on the same plane (i.e., one of planes 159-1, 159-2, 159-3 and 159-4), according to one embodiment of the present invention. Within each NOR memory string-pair, corresponding FeFETs of the NOR memory strings share a common local word line (e.g., local word line 151*n*). The detailed structure of this configuration is discussed and illustrated below. FIG. 1*b* shows a configuration which includes four NOR memory string-pairs on four separate planes (e.g., NOR memory strings 150L and 150R on plane 159-4) that are provided in adjacent columns of conceptualized memory structure 100 and share common local word line 151*a*.

As shown in FIG. 1*b*, NOR memory strings 150L and 150R may be NOR memory strings formed along two active strips located on opposite sides of shared local word line 151*a*. FeFETs 152R-1 to 152R-4 and 152L-1 to 152L-4 may be FeFETs located in the four pairs of active strips on opposite sides of local word line 151*a*. In this embodiment, local word line 151*a* controls FeFETs 152R-1, 152R-2, 152R-3 and 152R-4 from four NOR memory strings located on planes 159-1, 159-2, 159-3 and 159-4, respectively. Local word line 151*a* also controls FeFETs 152L-1, 152L-2, 152L-3 and 152L-4 from four NOR memory strings on corresponding planes 159-1, 159-2, 159-3 and 159-4, respectively. As discussed in greater detail below, in some embodiments, the parasitic capacitance C intrinsic to each NOR memory string (e.g., the distributed capacitance between the common $n^+$ source region of a NOR memory string and its multiple associated local word lines) may be used as a virtual voltage source, under some operating conditions, to provide common source voltage $V_{ss}$, For that matter, the common source voltage can be set through a pre-charge operation that provides it the voltage of the common n+ drain, for example. This flexibility in readily setting the source voltage and the drain voltage to a voltage that is more positive than the voltage on the local word line (e.g., during an erase operation), or to a voltage that is more negative than the voltage on the local word line (e.g., during a programming operation) is particularly advantageous because the polarization states (e.g., the "erased" and "programmed" states) of the FeFET are primarily symmetrical. That is, a first polarization state of the FeFET can be set by imposing a first voltage on both the source and the drain regions—as a first electrode—and a second voltage on the local word line, serving as a second electrode. This first polarization state can be readily reversed (i.e., set to the other polarization state by exchanging the voltages on the first and the second electrodes (i.e., imposing (i) the second voltage on both the source and the drain regions, and (ii) the first voltage on the local word line). According to one embodiment of the present invention, the NOR memory string does not require a hard-wired connection to a ground potential (Vss) for its common source region, common drain region, or any of its channel regions. Consequently, both polarization states can be achieved on any of the FeFETs of the NOR memory string using only positive voltages (or only negative voltages) applied to the corresponding local word line and the common source and the common drain regions. This single voltage polarity capability is advantageous because the typical FeFET has polarization states characterized by a voltage hysteresis loop that between a negative voltage in the "programmed" state to a positive voltage in the "erased" state.

Figure 1C:
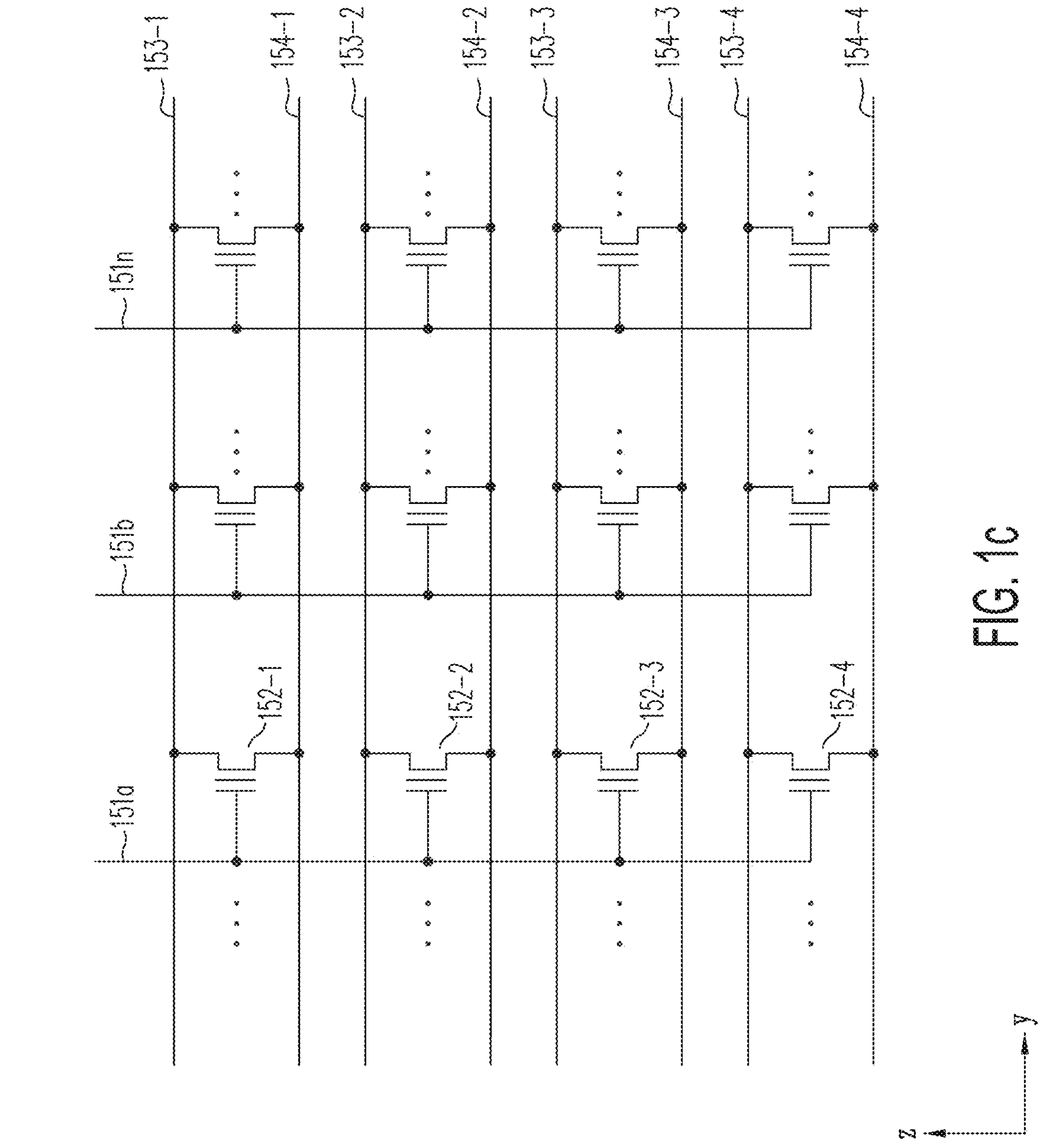
FIG. 1*c* shows a basic circuit representation of four NOR memory strings, each NOR memory string being provided on a respective one of planes 159-1, 159-2, 159-3 and 159-4, according to one embodiment of the present invention.

FIG. 1*c* shows a basic circuit representation of four NOR memory strings, with each NOR memory string being located on a respective one of planes 159-1, 159-2, 159-3 and 159-4, according to one embodiment of the present invention. In FIG. 1*c*, corresponding FeFETs (e.g., FeFETs 152-1, 152-2, 152-3 and 152-4) from the NOR memory strings share a common local word line (e.g., 151*a*). Each NOR memory string may run horizontally along the Y-direction, with storage elements (i.e., FeFETs) of the NOR memory string connected between common source line 153-*m* and common bit line 154-*m*, where m takes a value between 1 and 4. Corresponding FeFETs in the four NOR memory strings share corresponding one of local word lines 151-*n*, where n is the index of a local word line. The FeFETs in the NOR memory strings of the present invention are variable threshold voltage thin-film ferroelectric or polarization transistors wherein current to voltage hysteresis is created when the FeFET is electrically programmed, erased, or read, using programming, inhibition, erasure and read voltages that may be readily generated in the "circuitry under array" ("CUA") formed in the semiconductor substrate.

Fabrication Processes

Figure 2A:
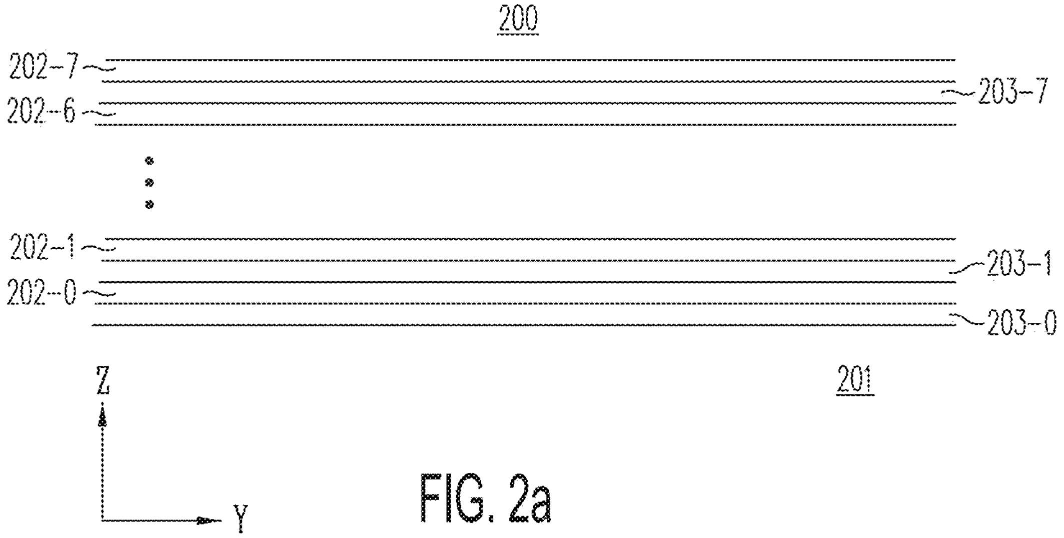
FIG. 2*a* shows a cross section in a Y-Z plane of semiconductor structure 200, after active layers 202-0 to 202-7 (each separated from the next active layer by one of isolation layers 203-0 to 203-7) have been formed on semiconductor substrate 201, but prior to formation of individual active strips, in accordance with one embodiment of the present invention.

FIG. 2*a* shows a cross section in a Y-Z plane of semiconductor structure 200, after active layers 202-0 to 202-7 (each separated from the next active layer respectively by isolation layers 203-0 to 203-7) have been formed on semiconductor substrate 201, but prior to forming individual active strips, in accordance with one embodiment of the present invention. Semiconductor substrate 201 represents, for example, a $p^-$ doped bulk silicon wafer on which support circuits for memory structure 200 may be formed as CUA prior to forming the active layers. Such support circuits, which may be formed alongside contacts 206-0 and 206-1 in FIGS. 2*c*, may include both analog and digital circuits. Some examples of such support circuits include shift registers, latches, sense amplifiers, reference cells, power supply lines, bias and reference voltage generators, inverters, NAND, NOR, Exclusive-Or and other logic gates, input/output drivers, address decoders (e.g., bit line and word line decoders), other memory elements, sequencers and state machines. These support circuits may be formed out of the building blocks for conventional devices (e.g., n-wells, p-wells, triple wells, $n^+$, $p^+$ diffusions, isolation regions, low and high voltage transistors, capacitors, resistors, vias, interconnects and conductors), as is known to those of ordinary skill in the art.

After the support circuits have been formed in and on semiconductor substrate 201, an isolation layer is provided, which may be a deposited or grown thick silicon oxide, for example.

Next, in some embodiments, one or more layers of interconnect conductors (e.g., metallic interconnect lines) may be formed, including "global word lines" for interconnecting the support circuits to the "local word lines" within the array of NOR memory strings. The layers of interconnect conductors are further discussed below. In other embodiments, global word lines are not provided under the memory array. Such metallic interconnect lines (e.g., global word line landing pads 263 of FIG. 2*c*, discussed below) may be provided as horizontal long narrow conductive strips running along a predetermined direction that may be perpendicular to the NOR memory strings to be formed at a later step. To facilitate discussion in this detailed description, the global word lines are presumed to run along the X-direction. The metallic interconnect lines may be formed by applying photo-lithographical patterning and etching steps on one or more deposited metal layers. (Alternatively, these metallic interconnect lines can be formed using a conventional damascene process, such as a copper or tungsten damascene process). A thick oxide is deposited to form isolation layer, followed by a planarization step using conventional chemical mechanical polishing (CMP) techniques.

Over isolation layer 203-0, active layers 202-0 to 202-7 are then successively formed, with each active layer being electrically insulated from the previous active layer underneath by a corresponding one of isolation layers 203-1 to 203-7. In this detailed description, the term "active layer" refers to material layers that form circuit elements (e.g., thin-film ferroelectric or polarization transistors) in the array of NOR memory strings. In FIG. 2*a*, although eight active layers are shown, any number of active layers may be provided. In practice, the number of active layers to be formed may depend on the process technology, such as the availability of a well-controlled anisotropic etching process that allows cutting through a tall stack of active layers to reach semiconductor substrate 201.

Figures 1, 2B:
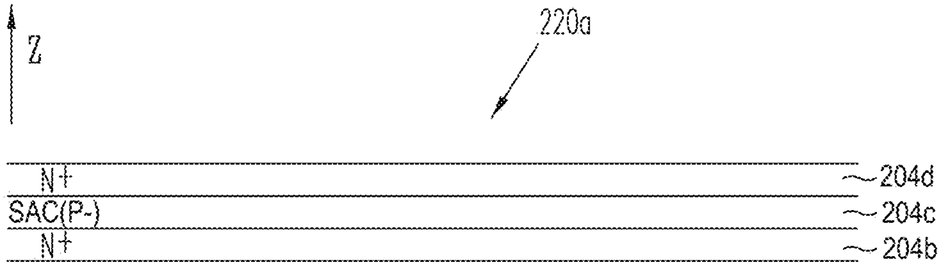
Figures 2, 2B:
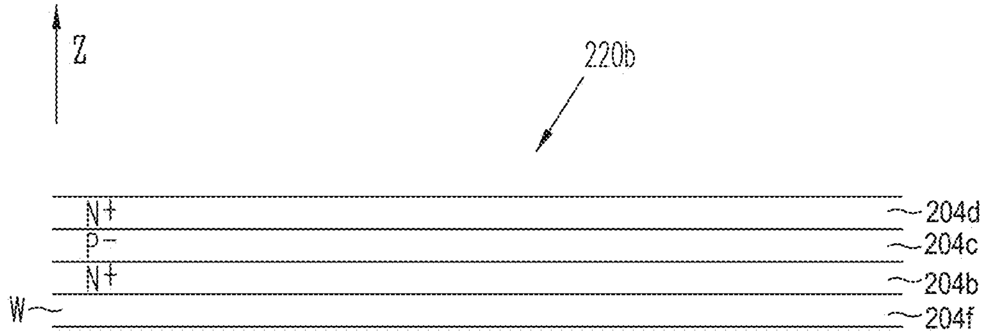

FIGS. 2*b*-1 to 2*b*-5 show examples of active layer 220*a*, according to one embodiment of the present invention. In the example of FIG. 2*b*-1, active layer 220*a* includes the material layers: (i) $n^+$ polysilicon or silicon layers 204*d* and 204*b* and (ii) sacrificial dielectric layer 204*c* (which is to be subsequently replaced at least in part by a $p^-$ doped channel polysilicon layer). In one implementation, $n^+$ silicon layers 204*d*-204*b* may be deposited successively in the same process chamber without removal in between. $N^+$ silicon layer 204*b* may be formed by depositing 10-100 nm of in-situ doped $n^+$ polysilicon. Dielectric layer 204*c* may be formed by depositing a sacrificial material (e.g., silicon oxide or $SiO_2$) in the thickness range of 10-100 nm. $N^+$ silicon layer 204*d*(i.e., the top portion of the deposited polysilicon) may be formed by depositing 10-100 nm of in-situ doped $n^+$ polysilicon. Both silicon layers 204*b* and 204*d* may be in situ $n^+$-doped. $N^+$ dopant concentrations in silicon layers 204*d* and 204*b* may be, for example between $1\times10^{20}/cm^3$ and $1\times10^{21}/cm^3$. One consideration for the dopant concentration is the sheet resistivity in $n^+$ silicon layers 204*d* and 204*b*. The $n^+$ doping may be achieved by either (i) a low-energy shallow high-dose ion implantation of phosphorus, arsenic or antimony, or (ii) in-situ phosphorus or arsenic doping of the deposited polysilicon, forming a 10-100 nm thick $n^+$ silicon layer 204*d* on top. The boron or p-dopant concentration of the channel polysilicon layer—replacing at least in part sacrificial dielectric layer 204*c*—can be in the range of $1\times10^{16}/cm^3$ to $1\times10^{18}/cm^3$. The actual boron concentration in layer 204*c* determines the native transistor threshold voltage, channel mobility, $n^+p^-n^+$ punch-through voltage, $n^+p^-$ junction leakage and reverse diode conduction characteristics, and channel depletion depth under the various operating conditions for the $n^+p^-n^+$ FeFETs formed along active strips formed out of active layers 202-0 to 202-7.

Thermal activation of the $n^+$ and $p^-$ implanted species and recrystallization of silicon layers 204*d*, 204*c* and 204*b* should preferably take place all at once after all active layers 202-0 to 202-7 have been formed, using a conventional rapid thermal annealing technique (e.g., at 700° C. or higher) or a conventional rapid laser annealing technique, thereby ensuring that all active layers experience elevated temperature processing in roughly the same amount.

Alternatively, $n^+$ and $p^-$ dopants of each of active layers 202-0 to 202-7 can be activated individually by shallow rapid thermal annealing using, for example, an excimer laser annealing (ELA) technique at an ultraviolet wavelength (e.g., 308 nanometer). The annealing energy which is absorbed by the polysilicon or amorphous silicon to partially melt layer 204*d* and part or all of layer 204*c*, optionally penetrating layer 204*b* to affect volume 205 (see FIG. 2*b*-4) without unduly heating other active layers lying below portion 223 of n+ silicon layer 204*b* of the annealed active layer 220*a*.

Although the use of successive layer-by-layer excimer laser shallow rapid thermal anneal is more costly than a single deep rapid thermal anneal step, ELA has the advantage that the localized partial melting of polysilicon (or amorphous silicon) can result in recrystallization of annealed volume 205 to form larger silicon polycrystalline grains having substantially improved mobility and uniformity, and reduced FeFET leakage due to reduced segregation of $n^+$ dopants at the grain boundaries of the affected volume. Such shallow excimer laser low-temperature anneal technique is well-known to those of ordinary skill in the art. For example, such technique is used to form polysilicon or amorphous silicon films in solar cell and flat panel display applications. See, for example, the article "Comprehensive Study of Lateral Grain Growth in Poly-Si Films by Excimer Laser Annealing (ELA) and its applications to Thin Film Transistors" by H. Kuriyama et al., published in Japanese Journal of Applied Physics, Vol. 33, Part 1, Number 10, 20th August 1994, or the article "Annealing of Silicon Back-planes with 540 W Excimer Lasers", published in technical publication by Coherent Inc. on their website.

The thickness of layer 204*c* roughly corresponds to the channel length of the FeFETs to be formed, which may be 10 nm thick or less over long active strips. In one embodiment, for example, diffusion in active layer 220*a* of FIG. 2*b*-5 may be controlled so that the channel length of the FeFETs remains near the target of 20.0-100.0 nm, even after several thermal process cycles, by depositing an ultra-thin (from one or a few atomic layers thick) film of silicon nitride (e.g., SiN or $Si_3N_4$), or another suitable diffusion-blocking film following the formation of n+ silicon layer 204*b* (e.g., layer 204*b-d* in FIG. 2*b*-5). A second ultra-thin film of silicon nitride, or another suitable diffusion-blocking film (e.g., layer 204*d-d* in FIG. 2*b*-5), may optionally be deposited following deposition of $p^-$ doped layer 204*c*, before depositing $n^+$ silicon layer 204*d*. The ultra-thin dopant diffusion-blocking layers 204*d-d* and 204*b-d* can be deposited by chemical vapor deposition, atomic layer deposition or any other suitable means (e.g., high pressure nitridation at low temperature). Each ultra-thin dopant diffusion-blocking layer acts as a barrier that prevents the $n^+$ dopants in $n^+$ silicon layers 204*d* and 204*b* from diffusing into $p^-$ layer 204*c*, yet are sufficiently thin to only marginally impede the MOS transistor action in the channel region between $n^+$ silicon layer 204*d* (acting as a source) and $n^+$ silicon layer 204*b* (acting as a drain). These additional ultra-thin dopant diffusion-blocking layers increase the manufacturing cost, but such ultra-thin dopant diffusion-blocking layers may serve to significantly reduce the cumulative leakage current from the multiple FeFETs along the active strips that are in the "off" state. However, if that leakage current is tolerable then these ultra-thin layers can be omitted. Indeed, relative to conventional non-ferroelectric field-effect transistors, the "off" state leakage currents in FeFETs are significantly smaller because of the large bandgap in the ferroelectric storage material (e.g., $HfO_2$).

Figures 2, 2B, 3:
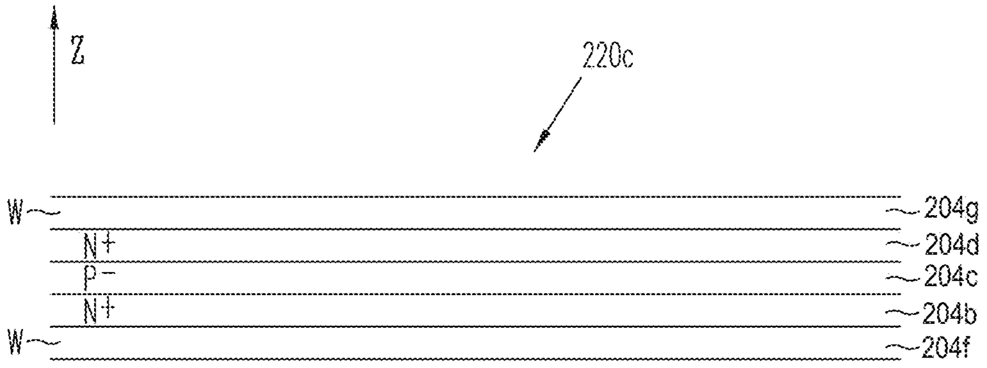
Figures 2, 2B, 3, 4:
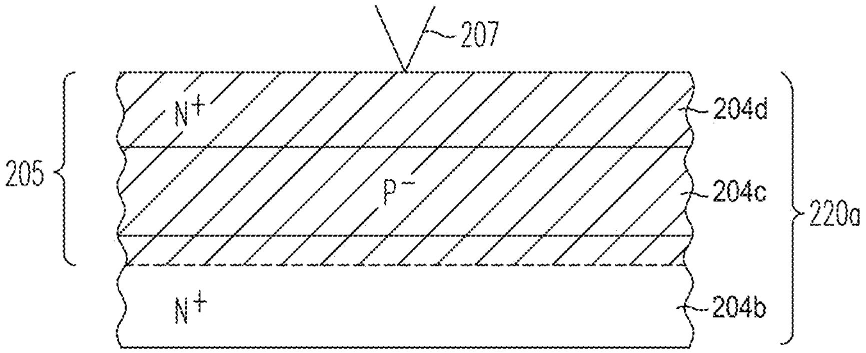
Figures 2, 2B, 3, 4, 5:
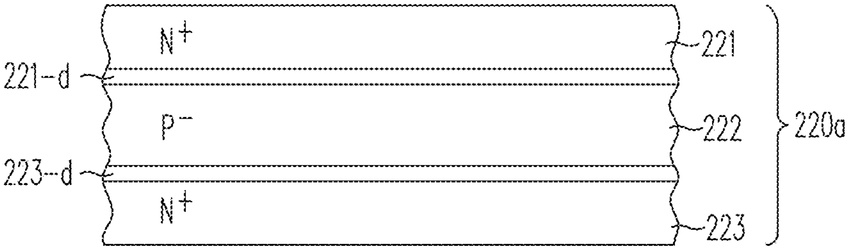

Sheet resistance in $n^+$ silicon layers 204*b* and $n^+$ silicon layers 204*d* may be reduced by adding optional conductive or metallic layers 204*g* or 204*f* to each active layer, adjacent to $n^+$ silicon layers 204*d* or 204*b* (e.g., metal layer 204*a*, labeled as W (for tungsten) in FIGS. 2*b*-2 and 2*b*-3). Metal layer 204*g* or 204*f* may be provided by one or more deposited metal layers. For example, metal layer 204*f* or 204*g* may be provided by depositing 1-2 nm thick liner layer of TiN followed by depositing a 1-40 nm thick layer of tungsten, a similar refractory metal, or a polycide or silicide (e.g., nickel silicide). Metal layer 204*f* or 204*g* is more preferably in the 10.0-40.0 nm thickness range. Preferably, a sacrificial material (e.g., silicon nitride or SiN) is deposited to stand-in for metal layers 204*f* and 204*g*, which is subsequently replaced by a conductive material to form low-resistivity layers 204*f* and 204*g*. Even very thin layer 204*f* and 204*g* (e.g., 20.0-50.0 nm) can significantly reduce the line resistance of a long active strip, while allowing the use of less heavily doped $n^+$ silicon layers 204*d* and 204*b*.

Figure 2C:
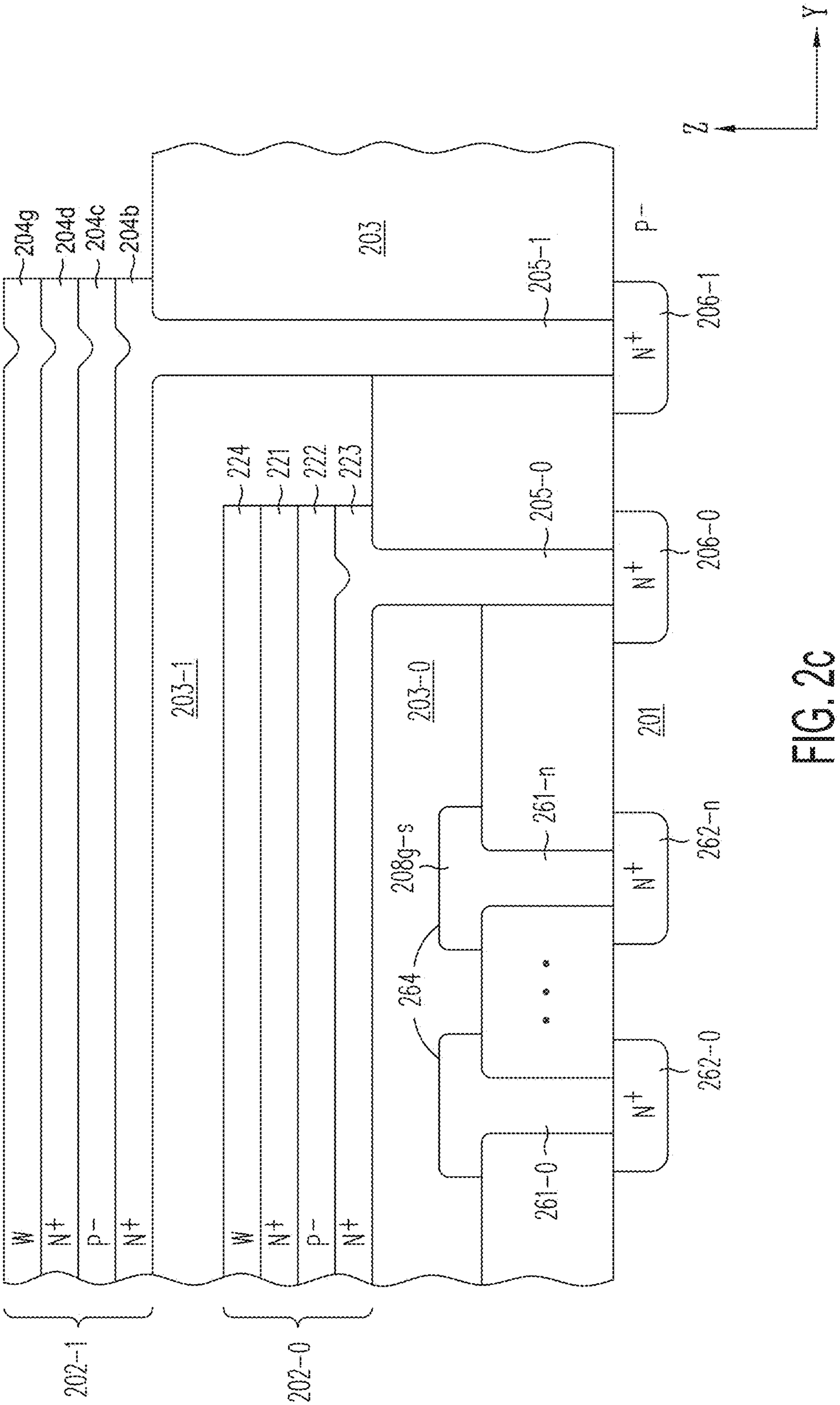
FIG. 2*c* shows cross section in a Y-Z plane of structure 200 of FIG. 2*a* through buried contacts 205-0 and 205-1, which connect n+ silicon layers 204*b* of active layers 202-0 and 202-1 to circuitry 206-0 and 206-1 in semiconductor substrate 201.

As shown in FIG. 2*c*, the conductor inside contact opening 205-1 can become quite long for a tall stack, which may adversely increase the line resistance. In that case, metal layer 204*a* (e.g., a tungsten layer) may preferably be included below $n^+$ silicon layer 204*b*, so as to substantially fill contact opening 205-1, rather than placing it above $n^+$ silicon layer 204*d*, as is shown in FIG. 2*c*.

In the embodiments where metal layers 204*f* and 204*g* are not present, there are several tradeoffs that can be made: for example, longer active strips are possible if the resulting increased read latency is acceptable. In general, the shorter the active strip, the lower the line resistance and therefore the shorter the latency. (The trade-off is in array efficiency). In the absence of metallic layers 204*f* and 204*g*, the thickness of $n^+$ silicon layers 204*d* and 204*b* can be increased (for example, to 100.0 nanometers) to reduce the intrinsic line resistance, at the expense of a taller stack to etch through. The line resistance can be further reduced by increasing the $n^+$ doping concentration in $n^+$ silicon layers 204*d* and 204*b* and by applying higher anneal temperatures in excess of 1,000° C. (e.g., by rapid thermal anneal, deep laser annealing or shallow excimer laser annealing techniques) to enhance recrystallization and dopant activation and to reduce dopant segregation at the grain-boundaries.

Shorter active strips also have superior immunity to leakage between $n^+$ silicon layer 204*b* and $n^+$ silicon layer 204*d*. A thicker $n^+$ layer provides reduced strip line resistance and increased strip parasitic capacitance, which is not desirable for dynamic sensing. The integrated circuit designer may opt for a shorter active strip (with or without metal layer 224) when low read latency is most valued. Alternatively, the strip line resistance may be reduced by contacting both ends of each active strip, rather than just at one end.

Block-formation patterning and etching steps define separate blocks in each of the active layers formed. Each block occupies an area in which a large number (e.g., thousands) of active strips running in parallel may be formed, as discussed below, with each active strip running along the Y-direction, eventually forming one or more NOR memory strings that provide a large number (e.g., thousands) of individually randomly accessible FeFETs.

Each of active layers 202-0 to 202-7 may be successively formed by repeating the steps described above. In addition, in the block-formation patterning and etching steps discussed above, each next higher active layer may be formed with an extension slightly beyond the previous active layer (see, e.g., as illustrated in FIG. 2*c*, discussed below, layer 202-1 extends beyond layer 202-0) to allow the upper active layer to access its specific decoders and other circuitry in semiconductor substrate 201 through designated buried contacts.

As shown in FIG. 2*c*, buried contacts 205-0 and 205-1 connect contacts 206-0 and 206-1 in semiconductor substrate 201, for example, to the local bit lines or source lines formed out of $n^+$ silicon layer 204*b* in each of active layers 202-0 and 202-1. Buried contacts for active layers 202-2 to 202-7 (not shown) may be similarly provided to connect active layers 202-2 to 202-7 to contacts 206-2 to 206-7 in semiconductor substrate 201 in an inverted staircase-like structure in which the active layer closest to the substrate has the shortest buried contact, while the active layer furthest from the substrate has the longest buried contact. Alternatively, in lieu of buried contacts, conductor-filled vias extending from the top of the active layers may be etched through isolation layers 203-0 and 203-1. These vias establish electrical contact from substrate circuitry 206-0, for example, to top $n^+$ silicon layers 204*d*-0 (or metal layer 224, if provided). The vias may be laid out in a "staircase" pattern with the active layer closest the substrate connected by the longest via, and the active layer closest to the top connected by the shortest via. The vias (not shown) have the advantage that more than one plane can be contacted in one masking-and-etch step, as is well-known to a person of ordinary skill in the art.

In an integrated circuit incorporating multiple arrays of NOR memory strings, the arrays of NOR memory strings may each be provided as a modular circuit or tile, as discussed above. Each array of NOR memory strings may include an "array" portion, in which the FeFETs of the NOR memory stings are provided, and one or more "staircase" portions for routing signals into or out of the NOR memory strings, using either the buried contact inverted staircase-like structure, or by conductor-filled vias in a staircase structure, as known to those of ordinary skill in the art. Each tile may have, for example, a regular-shape footprint (e.g., a rectangular footprint) on the planar surface of the semiconductor substrate, thus allowing many tiles to be formed and arranged on a substrate in a regular manner (e.g., a m×n matrix, where m and n are integers.)

Through a switch circuit, each of contacts 206-0 to 206-7 may apply a pre-charge voltage $V_{bl}$ to the respective bit line or source line of the corresponding NOR memory strings. During a read operation, each selected bit line may be connected by the switch circuit to an input terminal of a sense amplifier or a latch. The switch circuit may selectively connect each of contacts 206-0 to 206-7 to any of a number of specific voltage sources, such as a programming voltage ($V_{pgm}$), inhibit voltage ($V_{inhibit}$), erase voltage ($V_{erase}$), or any other suitable predetermined or pre-charge reference voltage $V_{bl}$ Or $V_{ss}$. In some embodiments, discussed below, taking advantage of the relatively large parasitic distributed capacitance along a bit line or source line in an active strip, a virtual voltage reference (e.g., a virtual ground, providing ground voltage $V_{ss}$) may be created in the source line (i.e., $n^+$ silicon layer 204*d*, or a metal line) of each active strip by pre-charging the source line, as discussed below. The virtual ground approach eliminates the need for hard-wiring $n^+$ silicon layer 204*d* to a voltage source in the substrate, making it possible to more efficiently use the staircase via structure to connect each active strip from the top to the substrate.

FIG. 2*c* also shows buried contacts 261-0 to 261-*n* for connecting global word lines 208*g-s*—which are to be formed running along the X-direction—to contacts 262-0 to 262-*n* in semiconductor substrate 201. Global word lines 208*g-s* are provided to connect corresponding local word lines 208W-s yet to be formed to circuits 262-*n* in substrate 201. Landing pads 263 are provided on the global word lines to allow connection to local word lines 208W-s, which are yet to be formed vertically on top of horizontally running global word lines 208*g-s*. Through a switch circuit and a global word line decoder, each of global word line contacts 262-0 to 262-*n* may be selectively connected, either individually, or shared among several global word lines, to any one of a number of reference voltage sources, such as stepped programming voltages ($V_{program}$), program-inhibit voltage ($V_{inhibit}$), read voltages (Vread) and erasure voltages ($V_{erase}$).

The buried contacts, the global word lines and the landing pads may be formed using conventional photo-lithographical patterning and etching steps, followed by deposition of one or more suitable conductors or by alloying (e.g., tungsten metal, alloy or tungsten silicide).

FIGS. 2*d* to 2*k* illustrates a portion of an exemplary process for forming a modular circuit or tile that includes an array of NOR memory strings, including the array portion (i.e., memory structure 200), according to one embodiment of the present invention; FIG. 2*k* illustrates a step the exemplary process that provides a channel layer for the FeFETs. The immediate steps following the step providing the channel layer in the exemplary process are illustrated by three groups of process steps, each group representing a different approach to "gate stack" formation. The groups of process steps are illustrated, respectively, in FIGS. 3*a* to 3*b*, 4*a* to 4*c* and 5*a* to 5*f*.

Figure 2D:
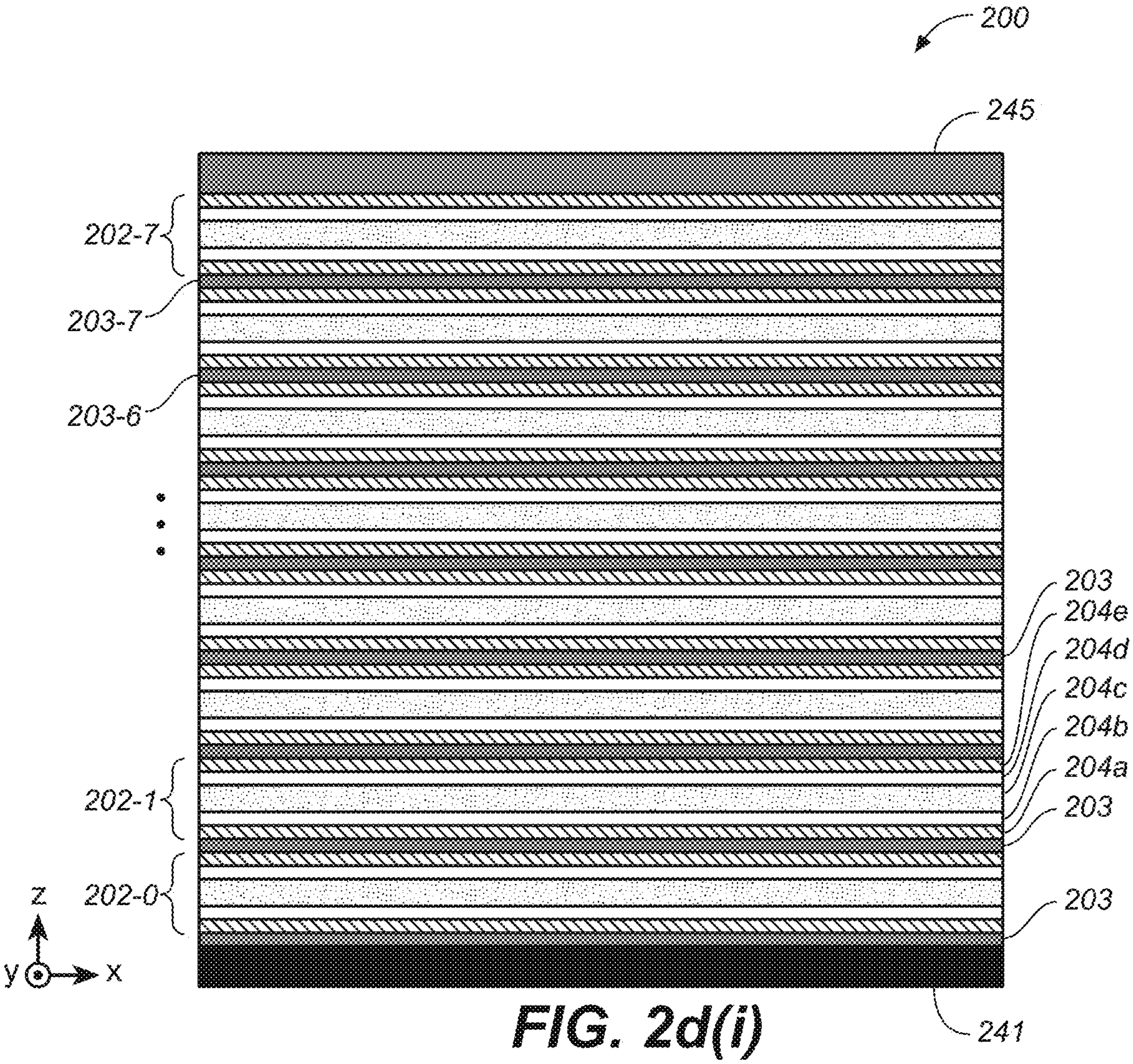
FIGS. 2*d*(*i*), 2*d*(*ii*), 2*e*(*i*), 2*e*(*ii*), 2*f*(*i*), 2*f*(*ii*), 2*g*(*i*), 2*g*(*ii*), 2*h*(*i*), 2*h*(*ii*), 2*i*(*i*), 2*i*(*ii*), 2*j*(*i*), 2*j*(*ii*), 2*k*(*i*) and 2*k*(*ii*) illustrate steps of an exemplary process for forming a modular circuit or tile that includes an array of NOR memory strings, including an array portion (i.e., memory structure 200), according to one embodiment of the present invention; in particular.

FIG. 2*d*(*i*) shows a cross section in the Z-X plane of memory structure 200 after depositions of active layers 202-0 to 202-7, in accordance with one embodiment of the present invention. Initially, in this embodiment, pad oxide 240 (e.g., silicon oxide) is provided over planar surface 201 of the semiconductor substrate. Etch-stop layer 241 (e.g., tungsten (W), tungsten nitride (WN), aluminum oxide (AlO), aluminum nitride (AlN), or any suitable etch-stop material) is then provided. Silicon oxycarbide (SiOC) layer 203-0 is then provided to isolate etch-stop layer 241 from the next active layer (i.e., active layer 202-0) to be deposited. Thereafter, active layers 202-0 to 202-7 (eight in total in this example; generically, each may be referred to as "active layer 202") are successively deposited, each active layer being isolated from the next active layer by a corresponding one of isolation layers 203-1 to 203-7 (active layers 203-0 to 203-7 are also each generically referred to as "isolation layer 203" and, collectively, "isolation layers 203"). Active layers 202 each include, in order of deposition, (i) silicon nitride (SiN) layer 204*a*, (ii) $n^+$-doped amorphous silicon (or polysilicon) layer 204*b*, (iii) sacrificial oxide layer 204*c*, (iv) $n^+$-doped amorphous silicon (or polysilicon) layer 204*d*, and (v) SiN layer 204*e*. Isolation layer 245 (e.g., an additional SiOC layer) is then deposited on top of active layer 202-7. The resulting structure is shown as memory structure 200 of FIG. 2*d*(*i*).

FIG. 2*d*(*ii*) illustrates successive recessing and etching steps to create staircase portion 200-*sc*, in accordance with one embodiment of the present invention. As shown in FIG. 2*d*(*ii*), on the top surface of memory structure 200 (i.e., isolation layer 245) is formed mask layer 210, which exposes first portion 211 of memory structure 200, as shown in FIG. 2*d*(*ii*)(1). The exposed portion of isolation SiOC layer 245 is then removed to expose a portion of active layer 202-7 underneath. That exposed portion of active layer 202-7 is then removed, exposing a portion of SiOC layer 203-6 underneath. The resulting structure is shown in FIG. 2*d*(*ii*)(2). Mask layer 210 is then recessed to expose a further portion of isolation SiOC layer 245. Removal of the exposed SiOC layers (e.g., SiOC layers 245 and 203-7), removal of exposed active layer 202 and recessing mask layer 210 are then repeated 7 more times, thereby forming a staircase structure. Thereafter, an oxide is deposited to fill the portions of active layers 204-1 to 204-7 removed. A chemical-mechanical polishing (CMP) step is carried out to remove mask layer 210 and to planarize the top surface of memory structure 200.

The steps illustrated in FIG. 2*d* form the staircase structures (e.g., on opposite sides of the array portion) prior to processing the array portion. However, the array portion may also be processed prior to formation of the staircase structures.

The surface of SiOC layer 245 is patterned and etched to create openings 218. FIG. 2*e*(*i*) is a top view of memory structure 200, showing shafts 218, after patterning and etching. In FIGS. 2*e*(*i*), shafts 218 are shown to have a circular X-Y plane cross section. However, any suitable X-Y plane cross section shape (e.g., oval) may also be used. A series of etching steps remove the exposed portions of isolation layers 203-0 to 203-7, and active layers 202-0 to 202-7 until etch-stop layer 241 is reached, thereby extending shafts 218 along the Z-direction. FIG. 2*e*(*ii*) shows an X-Z plane cross-section of memory structure 200 along line A-A' in FIG. 2*e*(*i*), after the etching steps through active layers 202-0 to 202-7 and isolation layers 203-0 to 203-7, in accordance with one embodiment the present invention. (In this detailed description, a "column" of objects denotes objects aligned along the Y-direction, whereas a "row" of objects denotes objects aligned along the X-direction.) In FIG. 2*e*(*i*), shafts of each column is staggered relative to the shafts of each of its immediate neighbor column, such that the closest shafts in adjacent columns have a greater separation between them than if such shafts are aligned along the X-direction. In one embodiment adjacent columns of shafts are 160 nm apart along the X-direction, and each of shafts 218 may have a diameter of 100.0 nm. Shafts 218 may each be up to 2.0 microns deep, so that the etching steps has an aspect ratio that is less than 20.

Shafts 218 may then be lined using an oxide liner 242 and filled using sacrificial material 243 (e.g., carbon or tungsten (W) with an adhesive layer of titanium nitride (TiN)). The surface of memory structure 200 may then be planarized using CMP or, when carbon is used as the sacrificial material, etched back. After shafts 218 are filled with sacrificial material 243, hard mask 244 (e.g., a carbon hard mask layer) is then deposited and photo-lithographically patterned over memory structure 200. Hard mask 244 may be patterned to provide rectilinear openings 246, each extending lengthwise along the Y-direction, exposing portions of memory structure 200 (e.g., each 60.0 nm wide, in one embodiment), and overlapping but not removing the columns of filled shaft 218. A top view and a cross-section view of resulting memory structure 200, after hard mask 244 is patterned, are shown in FIGS. 2*f*(*i*) and 2*f*(*ii*), respectively, according to one embodiment of the present invention. The cross-section view of FIG. 2*f*(*ii*) cuts through the X-Z plane along line A-A' of FIG. 2*f*(*i*).

From underneath rectilinear openings 246, successive etching steps remove portions of SiOC layer 245, isolation layers 203-0 to 203-7, active layers 202-0 to 202-7, and etch-stop layer 241, thereby dividing memory structure 200 into numerous active stacks separated by trenches 267. The etching steps are designed to be selective to oxide liner 242 and sacrificial material 243 in filled shafts 218, so that filled shafts 218 become pillars 248 of sacrificial material 243, surrounded on its cylindrical surface by oxide liner layer 242. An additional wet etch may be applied to remove any stringers of the various material. Hard mask 244 may then be removed (e.g., by CMP or by ashing, as appropriate). A top view and an X-Z plane cross section view along line A-A' of resulting memory structure 200, after hard mask 244 has been removed, are shown in FIGS. 2*g*(*i*) and 2*g*(*ii*), respectively, according to one embodiment of the present invention.

Trenches 267 may then be filled by dielectric material 247 (e.g., silicon oxide) using, for example, atomic layer deposition (ALD) or a spin-on technique. Excess oxide on the top surface of memory structure 200 may then be removed using, for example, CMP. Thereafter, pillars 248 are removed using, for example, a suitable wet etch to restore shafts 218. FIGS. 2*h*(*i*) and 2*h*(*ii*) show a top view and an X-Z plane cross-section view along line A-A' of resulting memory structure 200, respectively, after removal of pillars 248, according to one embodiment of the present invention.

Figure 2I:
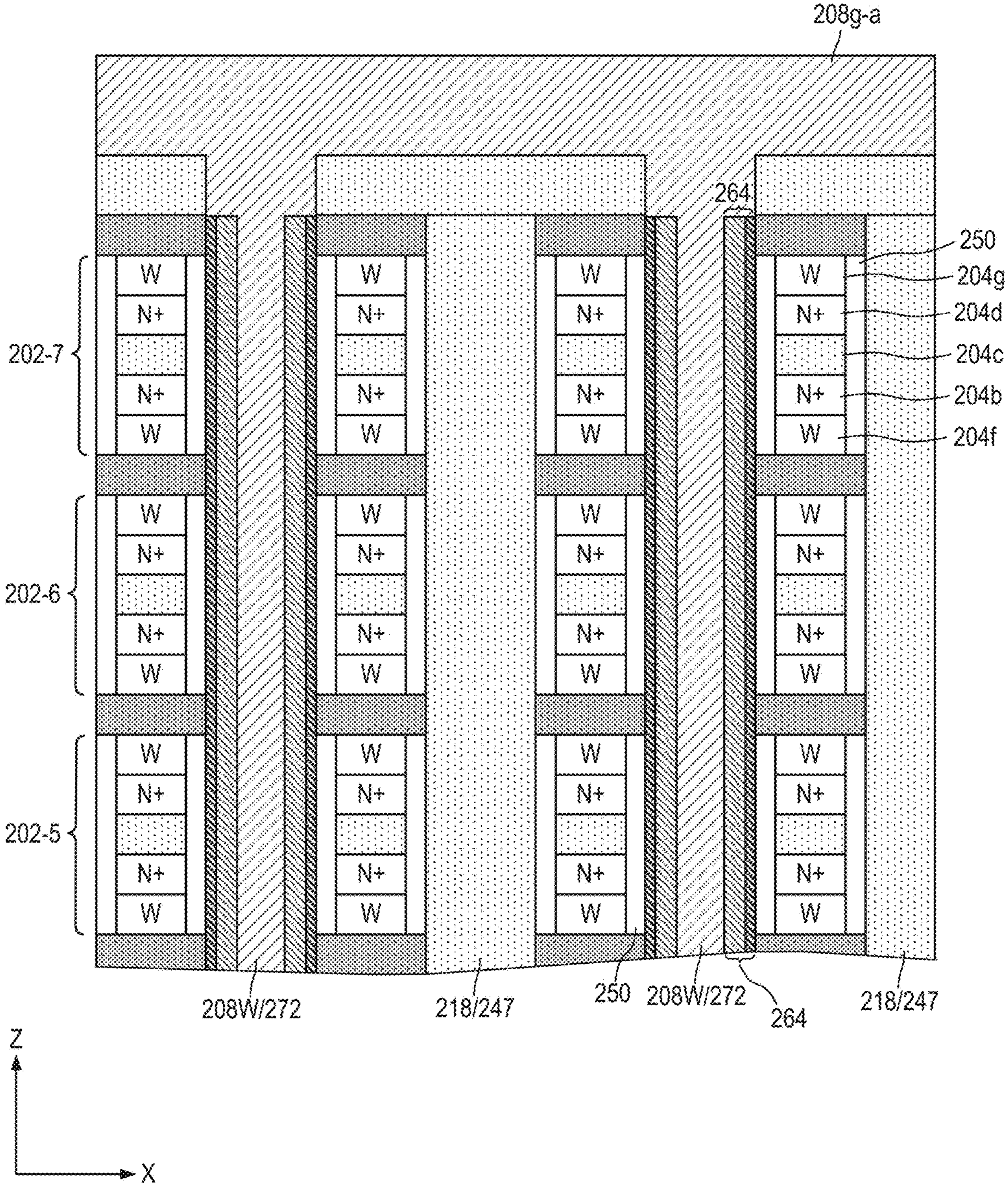

Removal of pillars 248 restores shafts 218 between filled portions of trenches 267 and exposes active layers 202-0 to 202-7 as sidewalls of shafts 218. Through shafts 218, SiN layers 204*a* and 204*e* of each of active layers 202-0 to 202-7 may be removed using, for example, a wet etch of silicon nitride. FIGS. 2*i*(*i*) and 2*i*(*ii*) show a top view and an X-Z plane cross-sectional view along line A-A' of resulting memory structure 200, respectively, after removal of SiN layers 204*a* and 204*e* from each of active multi-layers 202-0 to 202-7, according to one embodiment of the present invention.

An ALD step then deposits a conductive material into the cavities resulting from removal of SiN layers 204*a* and 204*e* in each of active layers 202-0 to 202-7. The conductive material may include, for example, a metal liner (e.g., titanium (Ti), titanium nitride (TiN), tantalum (Ta) or tantalum nitride (TaN)), followed by a refractory metal (e.g., tungsten (W), tungsten nitride (WN) or molybdenum (Mo)). Thereafter, an anisotropic separation etch removes the conductor material from shafts 218. Conductor layers 204*f* and 204*g* that respectively replace SiN layers 204*a* and 204*e* in each active layer may be recessed, for example, by 10.0 nm, to allow a subsequent filler material (e.g., silicon nitride) to prevent corrosion in the conductive material. FIGS. 2*j*(*i*) and 2*j*(*ii*) show a top view and an X-Z plane cross-sectional view along line A-A' of resulting memory structure 200, respectively, after replacement of SiN layers 204*a* and 204*e* in each active layer 202 by conductor layers 204*f* and 204*g*, according to one embodiment of the present invention. Conductor layers 204*f* and 204*g* are optional conductor layers that are formed adjacent and in contact with $n^+$-doped silicon layers 204*b* and 204*d*. As $n^+$ silicon layers 204*b* and 204*d* of each active layer 202 would become the common bit line and the common source line of a NOR memory string to be formed, conductor layers 204*f* and 204*g* desirably reduce the resistivities in the common bit line and the common source line.

Then, sacrificial oxide layer 204*c*, $n^+$ silicon layer 204*b*, and $n^+$ silicon layer 204*d* of each active layer 202 may be recessed (e.g., by 20.0 nm) to create a cavity into which a channel semiconductor material may be deposited. Polysilicon layer 250, intended for providing the channel regions of the thin-film storage transistors, is then deposited, etched back for separation, and recessed to remove stringers. Channel polysilicon layer 250 may be, for example, $p^-$-doped poly silicon (e.g., 7.0-14.0 nm thick, preferably about 10.0 nm thick). In some embodiments, the final thickness is preferably the depth of the cavity created in active layer 204 (e.g., 20.0 nm). FIGS. 2*k*(*i*) and 2*k*(*ii*) show a top view and an X-Z plane cross-sectional view along line A-A' of resulting memory structure 200, respectively, after channel polysilicon layer 250 is recessed, according to one embodiment of the present invention.

The next steps in the exemplary process form the "gate stacks" for FeFETs in the NOR memory strings. The gate stack for an FeFET includes (i) optionally, an interface layer, (ii) a ferroelectric or polarization layer, and (iii) a gate electrode. Optionally, a thin metal oxide (e.g., 1.0-2.0 nm thick aluminum oxide) may also be provided between the gate electrode and the polarization layer to reduce tunneling of charged species into the polarization layer. The inventors discover that superior performance in 3-dimensional arrays of NOR memory strings may be achieved when the polarization layers in the FeFETs are separated from each other. FIGS. 3*a* to 3*b*, 4*a*-4*c* and 5*a*-5*f* illustrate three exemplary, alternative groups of process steps suitable for fabricating the gate stacks of FeFETs in a NOR memory string, in accordance with some embodiments of the present invention. To provide greater clarity, each of FIGS. 3*a* to 3*b*, 4*a* to 4*c* and 5*a* to 5*f* shows only active stacks 261*a* and 261*b* and only active strips formed out of active layers 202-0 to 202-3. However, it is understood that the teachings provided therein apply to all active stacks and active strips in any array of NOR memory strings in that embodiment of the present invention.

Figure 3A:
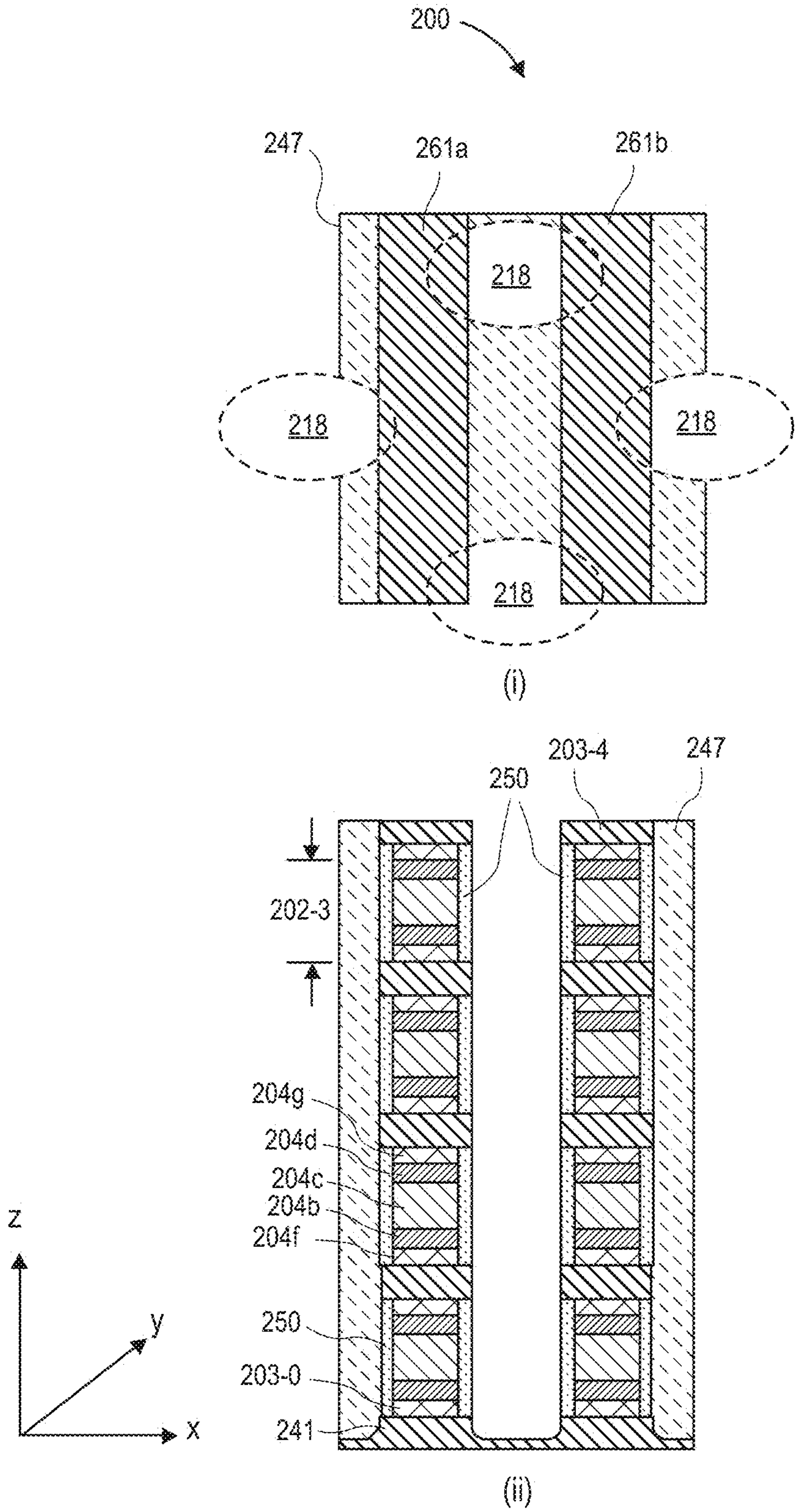
FIGS. 3*a* and 3*b* illustrate a first group of process steps for forming the gate stacks in the FeFETs of an array of NOR memory strings, according to one embodiment of the present invention.
Figure 3B:
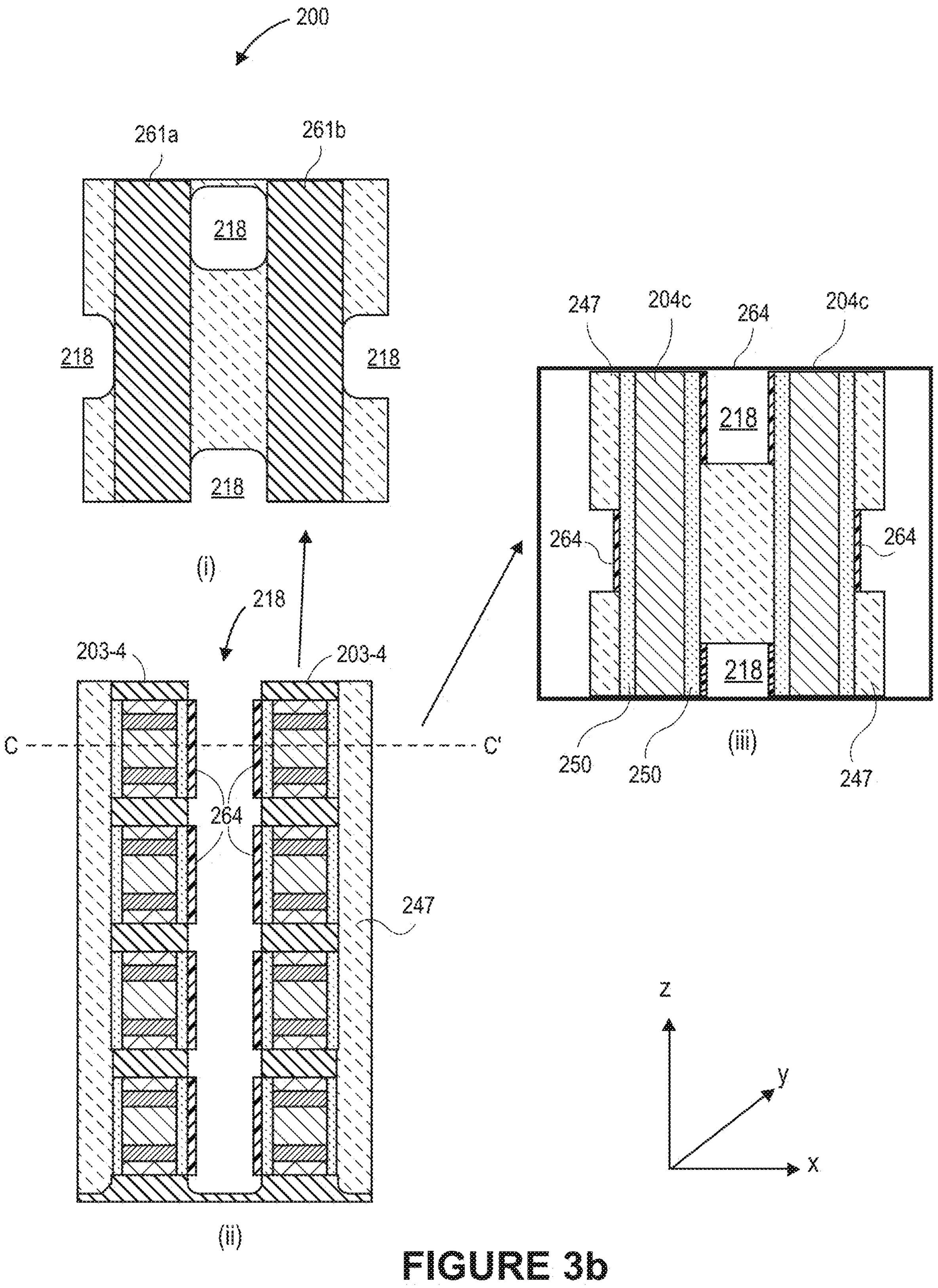

FIGS. 3*a* to 3*b* illustrate a first group of process steps for forming the gate stacks in FeFETs of an array of NOR memory strings, according to one embodiment of the present invention. FIGS. 3*a* to 3*b* each provide (a) an X-Y plane view across isolation layer 203-4 between the active strips that are formed out of active layers 202-3 and 202-4 in FIG. 2*k*(*ii*), and (b) an X-Z plane cross-sectional view, each showing active stacks 261*a* and 261*b* of memory structure 200 after completing the respective steps in this first group. FIG. 3*b* also includes a third view (iii), which is an X-Y plane cross-sectional view along line C-C' of FIG. 3*b*(*ii*).

After channel polysilicon layer 250 is conformally deposited, an etch-back step is performed, as discussed above in conjunction with FIGS. 2*k*(*i*) and 2*k*(*ii*). The etch-back step also exposes isolation layers 203-0 to 203-7 on the sidewalls of shafts 218, as illustrated on in FIG. 3*a*(*ii*). In some embodiments, the etch-back step may also be designed to form a recess in active layers 202 between exposed portions of adjacent isolation layers 203. Thereafter, a thin silicon nitride layer (e.g., 1 nm thick) may be formed on the exposed surfaces of channel polysilicon layer 250 in shafts 218. The silicon nitride layer may be formed using an ammonia nitridation step on a native oxide on the surface of polysilicon layer 250. (Alternatively, a thin oxide layer may be formed on polysilicon layer 250 by an oxidation step at a temperature of 400-650° C., and then converted to silicon nitride by any suitable nitridation process.) This nitride layer is used as an interface dielectric layer between channel polysilicon layer 250 and a polarization or polarization layer to be formed. Other suitable materials for the interface dielectric layer includes zirconium oxide ($ZrO_2$), silicon oxynitride (SiON), silicon nitride ($Si_3N_4$), or silicon oxide ($SiO_2$).

The native oxide layer—from which the interface dielectric layer is formed—may be formed by a chemical clean of the surface of polysilicon channel material 250. (The silicon nitride in interface dielectric layer may also be any combination of silicon oxynitride (SiON) or silicon nitride ($Si_3N_4$), and silicon oxide ($SiO_2$), 0.0 to 2.0 nm thick, with a refractive index between 1.5 to 2.0.) A densification treatment may be performed on the silicon nitride layer using, for example, pulsed ozone or by thermal annealing in a hydrogen or deuterium ambient, or any other techniques known to a person of ordinary skill in the art. The densification treatment reduces electronic leakage through the interface dielectric layer, reduces the surface states at the interface between the third semiconductor layer and the polarization layer, or both. The inventors believe that the interface dielectric layer should have a refractive index between 1.4 and 1.8, preferably 1.6, which may be achieved, for example, by annealing at 630° C. in ozone or deuterium gas.

Selective deposition techniques may be used to deposit polarization layer 264 on the exposed surfaces, other than on isolation layers 203-0 to 203-7. Suitable techniques include "surface poisoning" and self-assembled monolayers ("SAMs") techniques. In the SAM technique, for example, the exposed surfaces are treated with reactive species having active hydroxyl (—OH) bonds. Resulting memory structure 200 is shown in FIG. 3*a*(*i*). In this embodiment, as the interface dielectric layer is deposited in a recess in each active strip between adjacent isolation layers, the interface dielectric layer is not seen in the X-Y plane cross-sectional view of FIG. 3*a*(*ii*), which cuts through isolation layer 203-4.

Polarization layer 264 is then selectively deposited on the surfaces of the silicon nitride layer and channel material 250. (e.g., the treatment by SAMs prevents deposition of polarization layer 250 on the sidewalls of isolation dielectric layers 203.) Resulting memory structure 200 is shown in FIG. 3*b*(*i*). In this embodiment, the X-Y plane cross-sectional view of FIG. 3*b*(*iii*) shows polarization layer 264 deposited in the recessed portion of active layer 203-3, between adjacent exposed portions of isolation layers 203-3 and 203-4. Polarization layer 264 may be formed by the selective deposition using ALD techniques in an ozone ambient at temperature between 200° C. to 330° C. (e.g., around 300° C.), with a post-deposition annealing step at a temperature between 400° C. and 1000° C., based on the desired crystallization phase requirement of the ferroelectric material.

Deposition of the ferroelectric material may be achieved, for example, using any suitable deposition technique (e.g., chemical or physical vapor deposition, ALD, or evaporation) repeated cycles of hafnium oxide depositions and zirconium oxide depositions (e.g., in a $HfO_2$:$ZrO_2$ ratio of 4:1). Polarization layer 264 may be, for example, 2.0 to 8.0 nm thick, preferably, 2.5-5.0 nm thick). For the thicker polarization layers (e.g., greater than 4.0 nm), additional SAM treatments between deposition cycles may be advisable. Post deposition annealing may be performed, for example, in a temperature of 400-1000° C. to achieve a desired crystallization phase. Other suitable ferroelectric materials include aluminum zirconium-doped Hafnium oxide (HfZrAlO), aluminum-doped hafnium oxide ($HfO_2$:Al), silicon-doped hafnium oxide ($HfO_2$:Si) or lanthanum-doped hafnium oxide ($HfO_2$:La). The term HZO may encompass hafnium zirconium oxide (HfZrO), hafnium zirconium oxynitride (HfZrON), hafnium zirconium aluminum oxide (HfZrAlO) or any hafnium oxide that includes zirconium impurities.

The "surface poisoning" technique may be used to provide both the interface dielectric layer and polarization layer 264. In one embodiment, HZO is deposited directly onto polysilicon channel layer 250 after its formation. After a few atomic layers of HZO have been deposited, a layer of silicon oxide is formed as native oxide at the interface between channel polysilicon layer 250 and the atomic layers of HZO. Nitridation of the silicon oxide layer can proceed in the manner discussed above to form the interface dielectric layer, which is silicon nitride in this case. The remainder of polarization layer 264 may then proceed to completion.

The interface dielectric layer significantly reduces tunneling of charged species (i.e., electrons or holes) between channel polysilicon layer 250 and polarization layer 264. The charged species that tunnel into polarization layer 264 may adversely affect its polarization. Over time, the interface dielectric layer may break down as a result of a high number of program/erase cycles, thereby reducing the endurance of the FeFET. The interfacial layer may be formed out of a material with a dielectric constant greater than that of silicon oxide ("high-k" material; preferably, greater than 3.9). For example, aluminum oxide is a high-k material, having a dielectric constant as high as 9.0. A high-k material reduces both the electric field during program or erase operations and tunneling from the channel region. For a 0.0 nm thick interface dielectric layer, the polarization layer may be directly deposited by ALD onto the channel region (e.g., polysilicon). A native oxide of a self-limiting thickness (e.g., 1.0 to 10.0 angstrom) would be inherently formed at the interface between the channel region and the polarization layer. While this native oxide may be of low quality or prone to create a leakage current, it can be substantially improved by a self-limiting nitridation step. This approach is particularly advantageous when the channel region is formed after high temperature steps, such that contamination by dopant diffusion is a lesser concern. In some embodiments, a bandgap-engineered tunneling layer (e.g., a silicon oxide ($SiO_2$) and zirconium oxide ($ZrO_2$) multi-layer) may serve as the interface dielectric layer, providing the advantage of reduced tunneling into the polarization layer. In some embodiments, aluminum oxide (e.g., $Al_2O_3$) or silicon oxide nitride may be suitable. The high-k dielectric properties of the zirconium oxide and other high-k material reduce the electric field in the interface dielectric layer.

In other embodiments, polysilicon channel 250 may be replaced by a junction-less oxide semiconductor (e.g., indium gallium zinc oxide ("IGZO"), and indium aluminum zinc oxide ("IAlZnO")). With such a channel material, the interfacial layer between it and polarization layer 264 (e.g., HZO) may be subdued or even non-existent. The inventors believe that the oxide semiconductor channel region improves the endurance of the FeFET.

Thereafter, conductive material 272 (i.e., gate electrode) is deposited to fill shafts 218. Conductive material 272 may include tungsten (W), molybdenum (Mo), aluminum (Al), ruthenium (Ru), tantalum (Ta), titanium (Ti), or any combination or alloy of these metals.

Figure 4B:
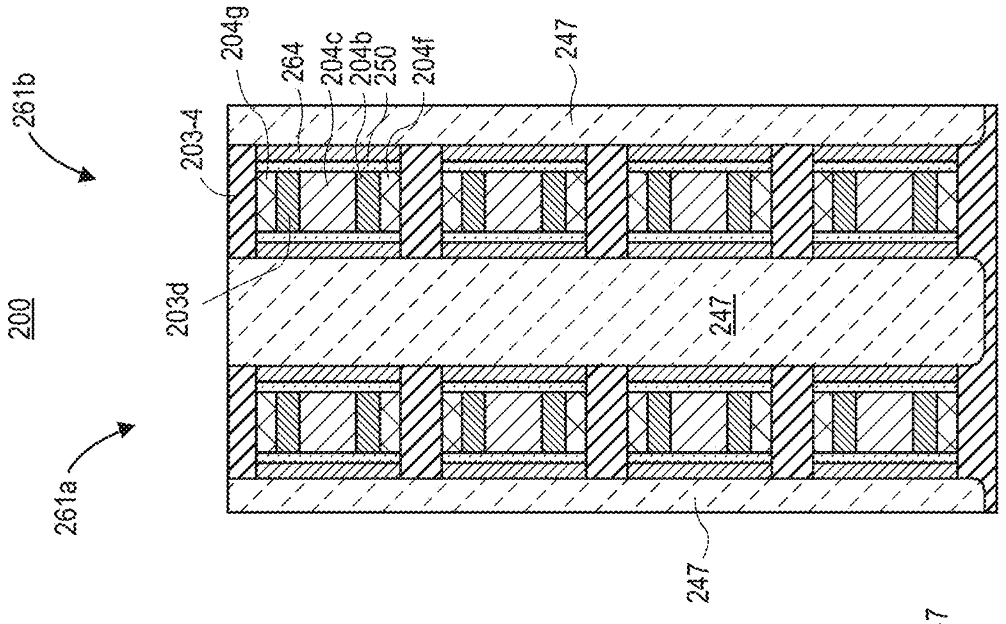
FIGS. 4*a*, 4*b* and 4*c* illustrate a second group of process steps for forming the gate stacks in the FeFETs in an array of NOR memory strings, according to one embodiment of the present invention.
Figure 4A:
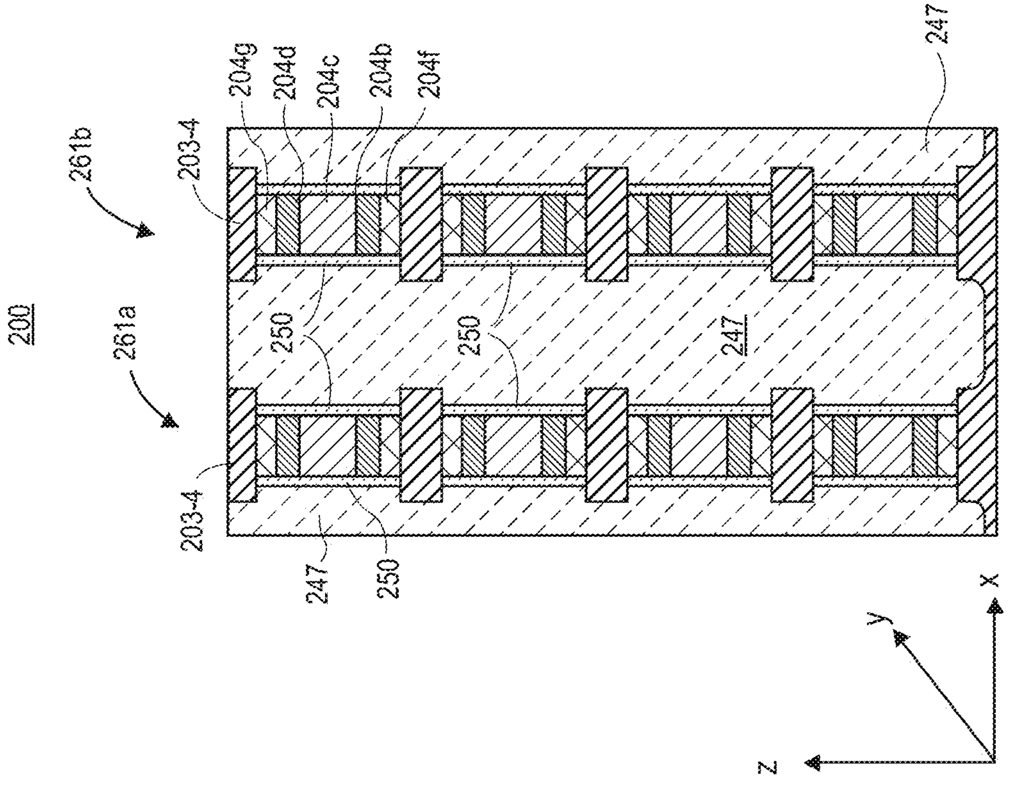
Figure 4C:
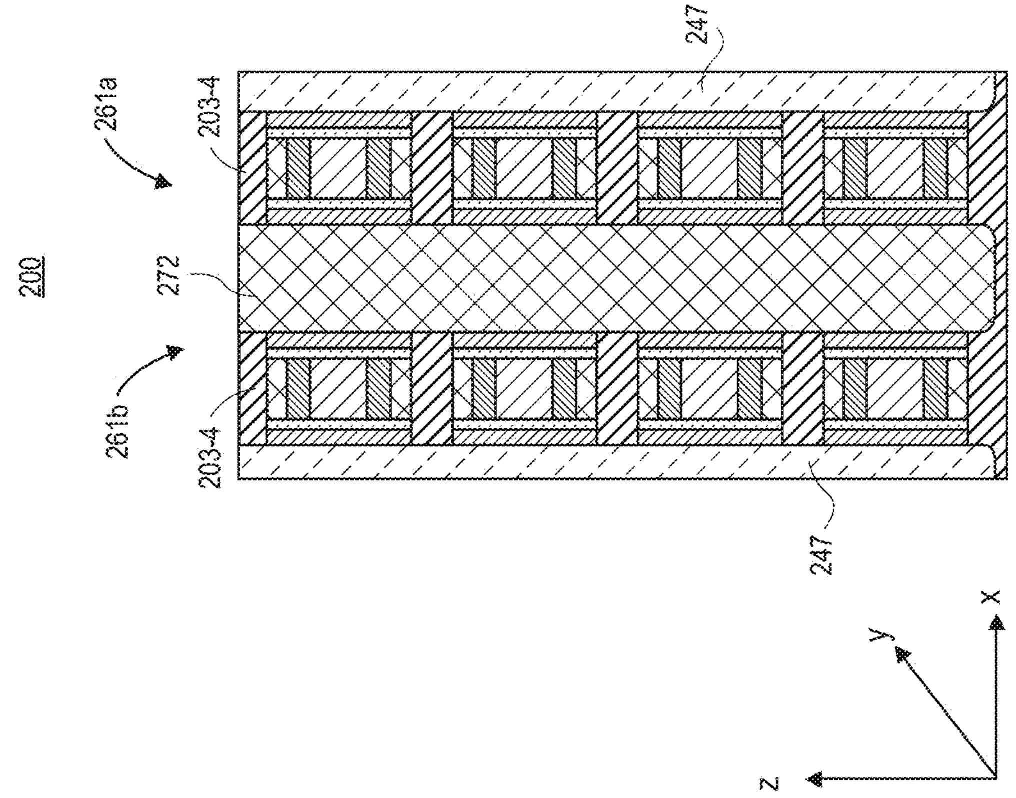

FIGS. 4*a* to 4*c* illustrate a second process flow for forming the gate stacks of the FeFETs in an array of NOR memory strings, according to one embodiment of the present invention. FIG. 4*a* shows an X-Z plane cross-sectional view of active stacks 261*a* and 261*b* of memory structure 200, after the interface layer (e.g., a 1.0 nm thick silicon nitride layer) has been formed, for example, in substantially the same manner as described above in conjunction with FIG. 3*a*. Relative to memory structure 200 of FIG. 3*a*, however, the recesses in the active strips that are formed out of active layers 202-0 to 202-3 in FIG. 4*a* are deeper. For example, for channel polysilicon layer 250 to have an ultimate thickness of 10.0 nm, the recesses in the active strips that are formed out of active layers 202-0 to 202-3 are made to be 20.0 nm deep. An etch-back step applied to polysilicon channel layer 250 (e.g., a wet etch) may reduce the thickness of channel polysilicon layer 250 to 10.0 nm.

Thereafter, polarization layer 264 may be formed by depositing using, for example, ALD techniques. Specifically, polarization layer 264 may be deposited on the interface layer in the recesses of active strips formed out of active layers 202-0 to 202-3. As discussed above, the polarization layer may be formed, for example, using repeated cycles of hafnium oxide depositions and zirconium oxide depositions (e.g., in a $HfO_2$:$ZrO_2$ ratio of 4:1). Resulting memory structure 200 is shown in FIG. 4*b*. Other suitable ferroelectric materials that may be used include aluminum-doped hafnium oxide (HfAlO) and aluminum zirconium-doped hafnium oxide (HfZrAlO). As shown in FIG. 4*b*, because of the recesses, polarization layer 264 in the active strips are separated from each other by the adjacent isolation dielectric layers 203. Thereafter, conductive material 272 is deposited to fill shafts 218, forming thereby the gate electrodes or local word lines.

Figure 5B:
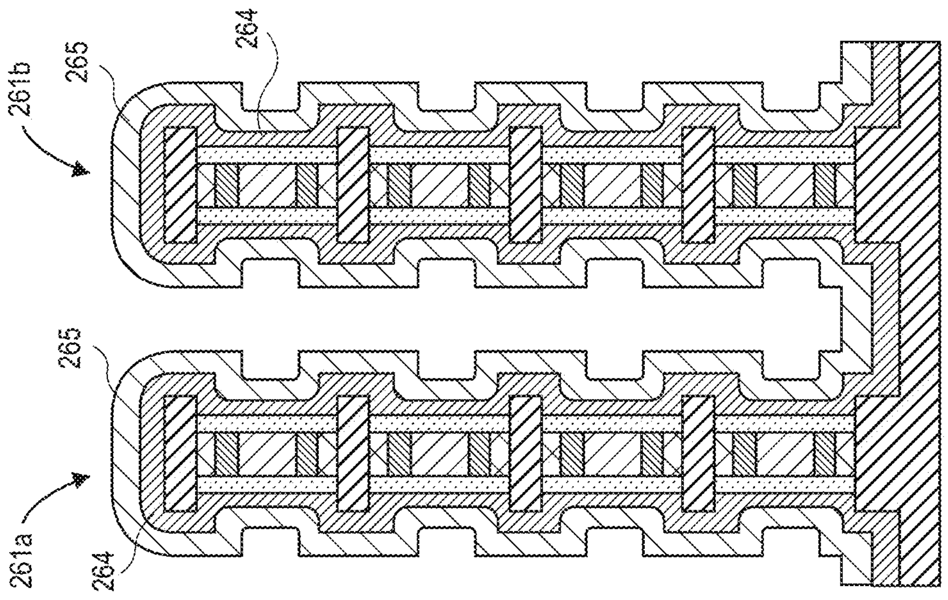
Figure 5A:
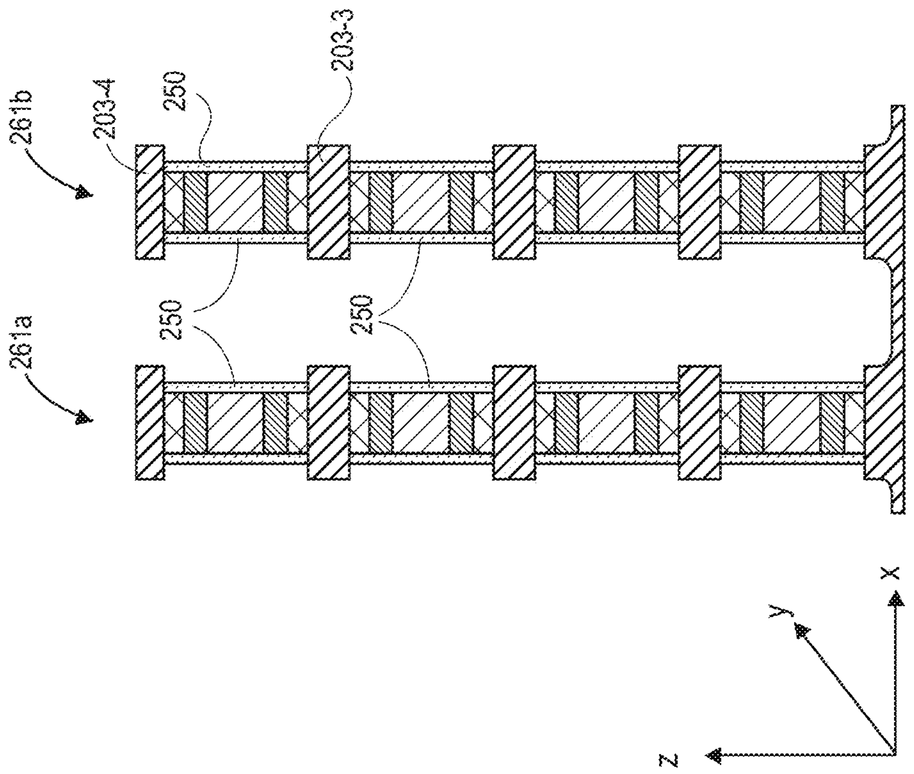

FIGS. 5*a* to 5*f* illustrate a third group of process steps for forming the gate stacks in FeFETs of an array of NOR memory strings, according to one embodiment of the present invention. FIG. 5*a* shows an X-Z plane cross-sectional view of active stacks 261*a* and 261*b* of memory structure 200, after deposition of channel polysilicon layer 250 into deep recesses of the active strips that are formed out of active layers 202-0 to 202-3 (e.g., 20 nm deep), an etch-back step and the formation of an interface dielectric layer in preparation for the ferroelectric material deposition. The etch-back step thins channel polysilicon layer 250 (e.g., to 10.0 nm thick) to expose the sidewalls of isolation dielectric layers 203-0 to 203-4. Memory structures 200 of FIGS. 5*a* may be formed using substantially the same process steps as those discussed above that are used to form memory structure 200 of FIG. 4*a*.

Figure 5C:
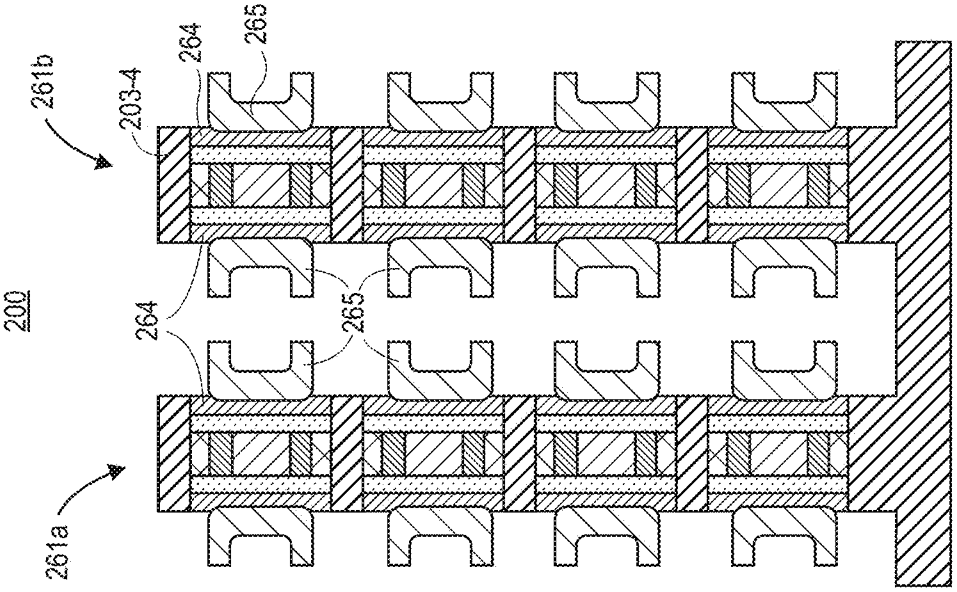
Figure 5C:
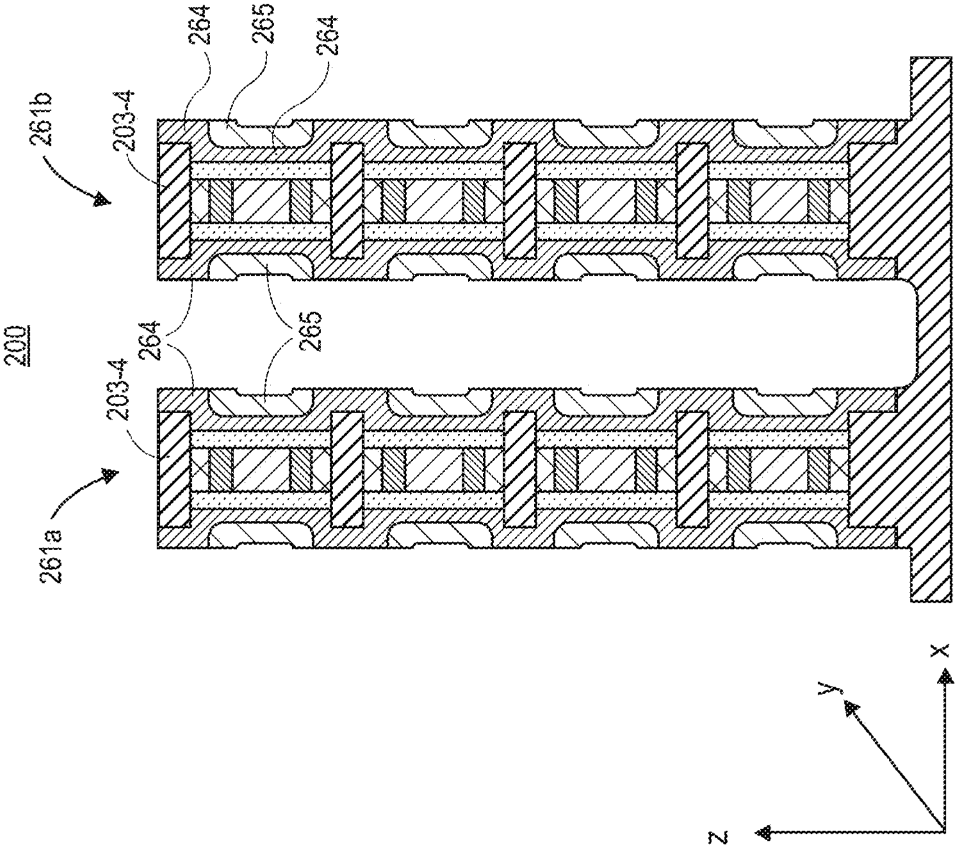

Thereafter, polarization layer 264 is formed on memory structure 200, using the ALD techniques discussed, for example, in conjunction with FIG. 4*b* above, followed by a conformal deposition of amorphous silicon liner 265. Resulting memory structure 200 is shown in FIG. 5*b*. Then, an anisotropic dry etch step removes portions of amorphous silicon liner 265, which exposes portions of polarization layer 264 on the sidewalls of isolation dielectric layers 203 in shaft 218, while allowing the remainder of amorphous silicon liner 265 protect the portions of polarization layer 264 in the recesses of the active strips. The anisotropic dry etch also sputters away amorphous silicon liner 265 and polarization layer 264 from top of memory structure 200. Resulting memory structure 200 is shown in FIG. 5*c*.

Thereafter, in a first variation, a wet etch step removes the ferroelectric material (e.g., hafnium zirconium oxide (HZO)) of polarization layer 264 from the sidewalls of isolation dielectric layers 203 in shafts 218. In a second variation, the wet etch step is allowed to remove a portion of the ferroelectric material of polarization layer 264 underneath amorphous liner layer 265. The inventors believe that reducing the extent of polarization layer 264 along the Z-direction allow greater control of the resulting polarization properties. In addition, the interface dielectric layer for the diminished polarization layer 264 results in a reduced electric field between the source region and the drain region of an FeFET. Resulting memory structure 200 for the first variation and resulting memory structure 200 for the second variation are respectively shown in FIGS. 5*d*(*i*) and 5*d*(*ii*). Thereafter, the remainder of amorphous silicon liner 265 may be removed by a wet etch. In the second variation, oxide 266 (e.g., silicon oxide) is deposited using, for example, ALD techniques to fill the recesses in active layers 202. An anisotropic etch-back step exposes diminished polarization layer 264 on the sidewalls of shafts 218. Resulting memory structure 200 for the first variation and resulting memory structure 200 for the second variation are shown in FIGS. 5*e*(*i*) and 5*e*(*ii*), respectively.

Conductive material 272 is then deposited into and fills shafts 218 (e.g., a titanium nitride (TiN) adhesion layer, followed by tungsten). Conductive material 272 provides a common gate electrode—i.e., the local word line—for vertically aligned FeFETs in the NOR memory strings of an active stack. Resulting memory structure 200 for the first and the second variations are shown in FIGS. 5*f*(*i*) and 5*f*(*ii*), respectively. In summary, memory structure 200 of FIG. 6*a* represents active stacks 261*a* and 261*b* fabricated under the first group of process steps, the second group of process steps, or the first variation of the third group of process steps, in accordance with one embodiment of the present invention. Memory structure 200 of FIG. 6*b* represents active stacks 261*a* and 261*b* fabricated under the second variation of the third group of process steps, in accordance with one embodiment of the present invention.

Figure 6B:
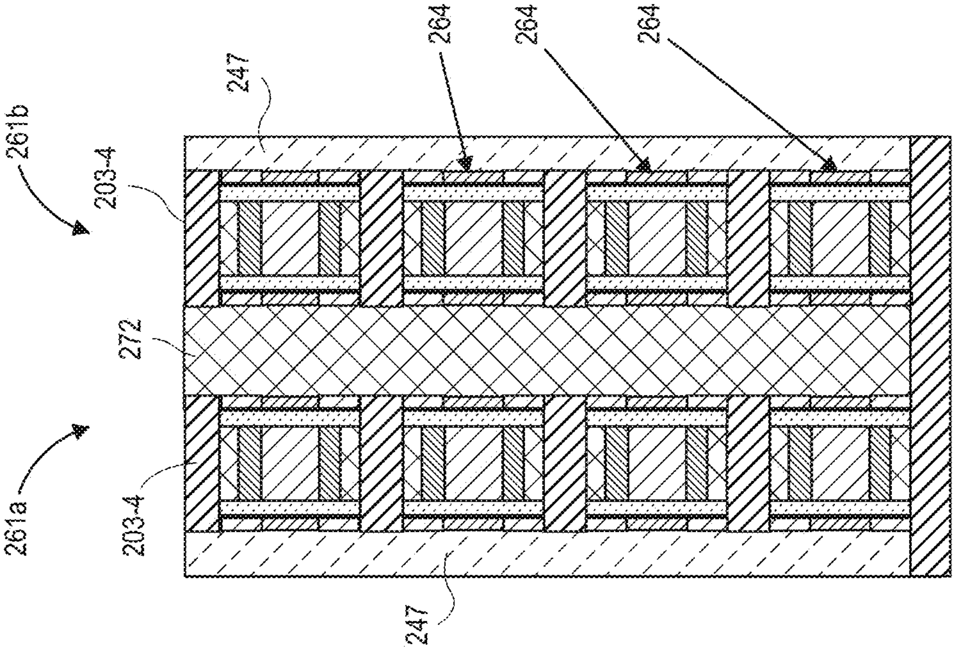
FIG. 6*b* shows an X-Z cross sectional view of memory structure 200, which represents active stacks 261*a* and 261*b* fabricated under the group of process steps illustrated by FIGS. 5*a*-5*f*(*ii*), in accordance with one embodiment of the present invention.
Figure 6A:
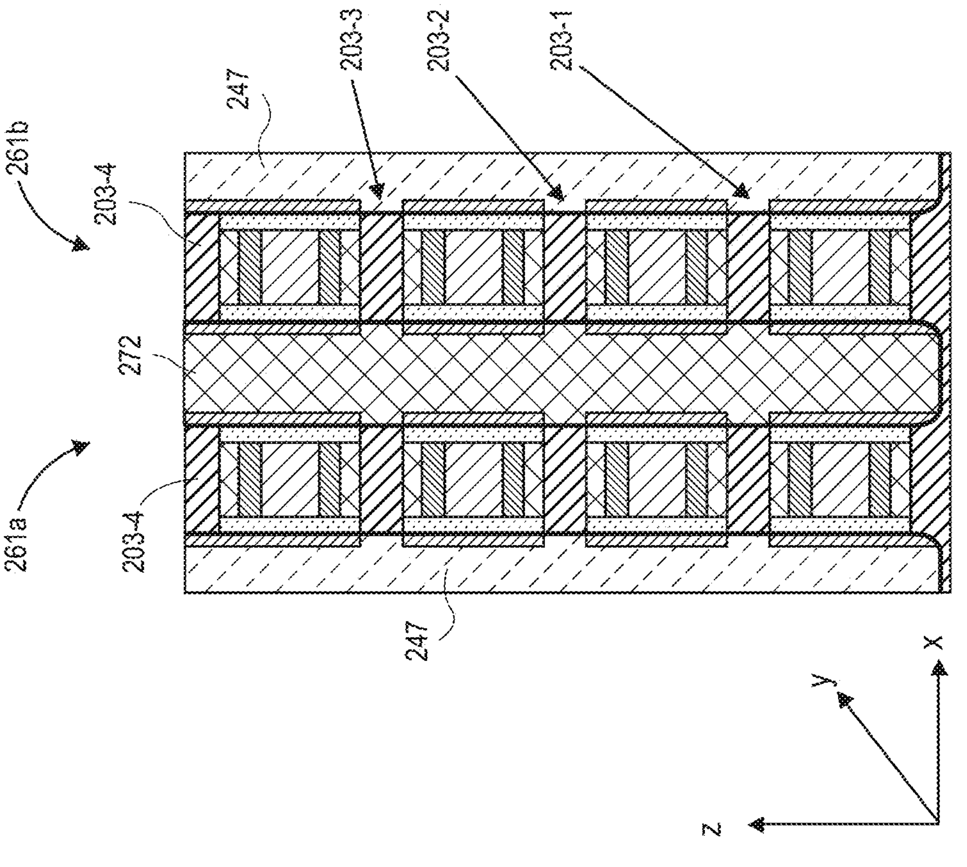
FIG. 6*a* shows an X-Z cross sectional view of memory structure 200, which represents active stacks 261*a* and 261*b* fabricated under any group of process steps illustrated by FIG. 3*a*-3*b*, FIGS. 4*a* to 4*c* and FIGS. 5*a* to 5*f*(*i*), in accordance with one embodiment of the present invention.

The device structures for FeFETs shown in FIGS. 6*a* and 6*b* suggest that the 3-dimensional NOR memory strings disclosed herein have a significant advantage in that they offer a relatively large surface area of polarizable material in polarization layer 264. A large surface area in polarization layer 264 provides a tight distribution of voltages in the erased and programmed states, which are difficult to achieve in planar FeFETs. Moreover, that relatively large surface area of polarizable material is provided entirely on the sidewalls of the active strips, and thus provides a high storage density without the penalty of substrate silicon real estate. Specifically, as the normal to polarization layer 264 is substantially horizontal, the polarization layer incurs little silicon real estate. In one embodiment, for example, the footprint of polarization layer 264 of each FeFET, as projected onto the planar surface of the semiconductor substrate, is merely 10.0 nm by 45.0 nm. (However, the Z-Y plane surface area of ferroelectric is 100.0 nm×45.0 nm, with a 100.0 nm channel length.) In some embodiments, the projected footprint of the polarization layer even lies within the projected footprint of the common bit line, as the ferroelectric or polarization layer is provided in a recess between the common bit line and the common source line. The advantage is amplified in a 3-dimensional array of NOR memory strings, as the footprint of the polarization material is substantially independent of the number of active strips in an active stack. Furthermore, the substantial advantage over planar storage transistors is achieved even if only one polarization layer is provided along the vertical or Z-direction. In that regard, the FeFETs of the present invention is advantageous even in embedded single-layer memory application.

In the process illustrated above, the channel region and the gate stack of each thin-film FeFETs are formed inside one of shafts 218, which may have a curved contour in an X-Y plane cross section. In that embodiment, each rectilinear portion of trenches 267 between shafts 218 provide an isolation between adjacent FeFETs in a NOR memory string. Alternatively, replacement of SiN layers 204*a* and 204*e* may begin from the rectilinear portions of trenches 267 between adjacent shafts 218, rather than through shafts 218. Subsequent to metal replacement, channel polysilicon 250 and the gate stacks may be formed as described above, except that the subsequent process steps take place in the rectilinear portions of trenches 267 between shafts 218, rather than in shafts 218.

After the gate stacks are formed using any group of the process steps illustrated herein by FIGS. 3*a*-3*b*, FIGS. 4*a*-4*c*, FIGS. 5*a*-5*c*, 5*d*(*i*), 5*e*(*i*) and 5*f*(*i*), and FIGS. 5*a*-5*c*, 5*d*(*ii*), 5*e*(*ii*) and 5*f*(*ii*)), an isolation layer is provided over memory structure 200. Thereafter, global interconnect conductors may be formed using any suitable conventional technique to provide connections to the local word lines in the array portion, and to the common bit lines in the staircase portions. FIG. 2*l* shows a X-Z plane cross section through a row of local word lines 208*g-a*, showing active strips formed out of active layers 202-7 and 202-6. Each local word line is formed by conductive material 272 in a rectilinear portion of one of trenches 267, between adjacent shafts 218. As shown in FIG. 2*l*, each active strip includes $n^+$ polysilicon layers 204*b* and 204*d*, and low-resistivity metal layer 204*f*. (In FIG. 2*k*, low-resistivity metal layer 204*g* is not shown.) Embedded in dielectric layers 231L and 231R are gate stack elements formed out of channel polysilicon layer 250 and polarization layer 264, each element being located between $n^+$ silicon layers 204*b* and 204*d* (along the Z-direction). The gate stack of each FeFET is formed by one such gate stack element and its adjacent local word line 208*g-a* (connected to a global word line conductor running above the array portion) or 208*g-s* (connected to a global word line conductor running between the array portion and the silicon substrate). This configuration represents a high packing density configuration for FeFETs, $N^+$ silicon layer 204*b*(i.e., the common source line) can be pre-charged to a suitable voltage required for an operation of the FeFETs at hand (e.g., program voltage $V_{prog}$, inhibition voltage $V_{inhibit}$, erase voltage $V_{erase}$, or the read reference voltage $V_{bl}$). During a read operation, any of FeFETs that are in the "on" state conduct current in the vertical or Z-direction between $n^+$ silicon layers 204*d* and 204*b*.

Optional metal layers 204*f* and 204*g* reduce the resistance of $n^+$ silicon layers 204*b* and 204*d*, respectively, thus facilitating fast memory device operations. $N^+$ silicon layer 204*b* in any active strip 202 may be left floating. One or more local word lines (referred to as a "pre-charge word line") may be used to bias $n^+$ silicon layer 204*b*. When a suitable voltage is applied to selected pre-charge word lines (i.e., rendering the associated pre-charge FeFET conducting), each pre-charge word line momentarily inverts its channel region (i.e., channel polysilicon layer 250 in its associated gate stack), so that $n^+$ silicon layer 204*b*(i.e., the common source line) may be pre-charged to the pre-charge voltage $V_{ss}$ in the associated $n^+$ silicon layer 204*d* from voltage source $V_{bl}$ in the substrate. When the voltage on the pre-charge word line is withdrawn, (i.e., when the pre-charge FeFET is returned to its non-conducing state) and all the other word lines on both sides of the active strip are also "turned off", device operation may proceed with $n^+$ silicon layer 204*d* left electrically charged to provide a virtual voltage reference at the pre-charged voltage $V_{ss}$ (typically, ~0V) because the distributed parasitic capacitor formed between $n^+$ silicon layer 204*b* and its multiple local word lines is sufficiently large to hold the virtual voltage reference long enough to support the program, program-inhibit or read operation (see below). Although the FeFETs in a NOR memory string may also serve as pre-charge FeFETs along each NOR memory string, to speed up the pre-charge phase for a read operation (read pre-charge requires a lower word line voltages of typically ~1.0 volts), some of the FeFETs (e.g., one in every 32 or 64 FeFETs along the NOR memory string) may also be activated. It is preferable that FeFETs dedicated entirely to serve as pre-charge FeFETs are provided, as they are more tolerant of program-disturb conditions than the FeFETs used in memory operations.

Figure 2M:
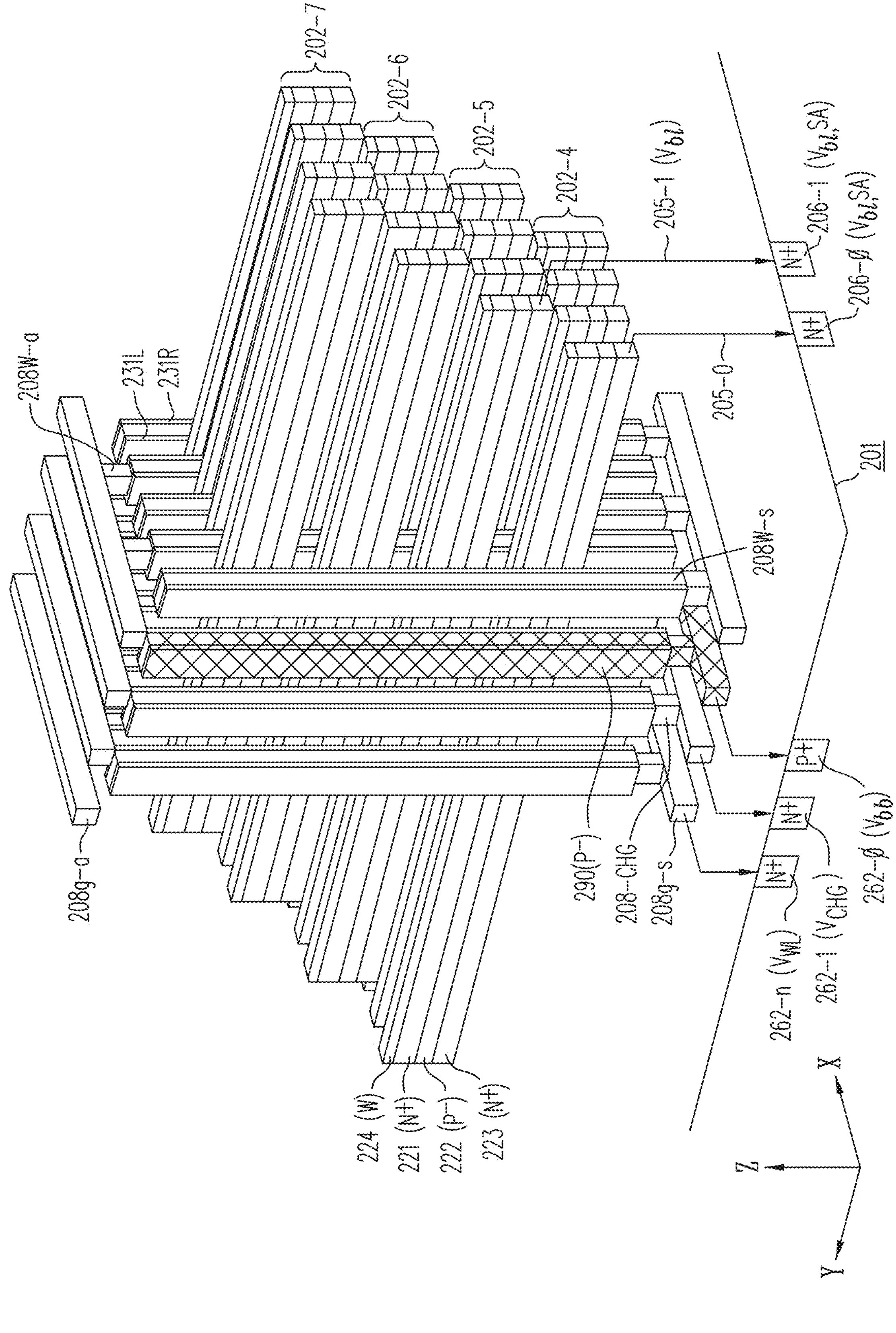
FIG. 2*m* shows a 3-dimensional view of horizontal active layers 202-4 to 202-7 in the embodiment of FIG. 2*k*, with local word lines or local pre-charge word lines connected to global word lines 208*g-s* and global word lines 208*g-a*, and showing each active strip as having its $N^+$ layer 204*d* (acting as a drain region) connected through select circuits to any of voltage supplies (e.g., $V_{ss}$, $V_{bl}$, $V_{pgm}$, $V_{inhibit}$, and $V_{erase}$), decoding, sensing and other circuits arranged either adjacent or directly underneath the memory arrays.

FIG. 2*m* shows a three-dimensional view of horizontal active layers 202-4 to 202-7 in the embodiment of FIG. 2*k*, with local word lines or local pre-charge word lines connected to global word lines 208*g-s* and global word lines 208*g-a*, and showing each active strip as having its $N^+$ layer 204*d* (acting as a drain region) connected through select circuits to any of voltage supplies (e.g., $V_{ss}$, $V_{bl}$, $V_{pgm}$, $V_{inhibit}$, and $V_{erase}$), decoding, sensing and other circuits arranged either adjacent or directly underneath the memory arrays. The substrate circuitry is represented schematically by 206-0 and 206-1 in substrate 201.

Figure 11A:
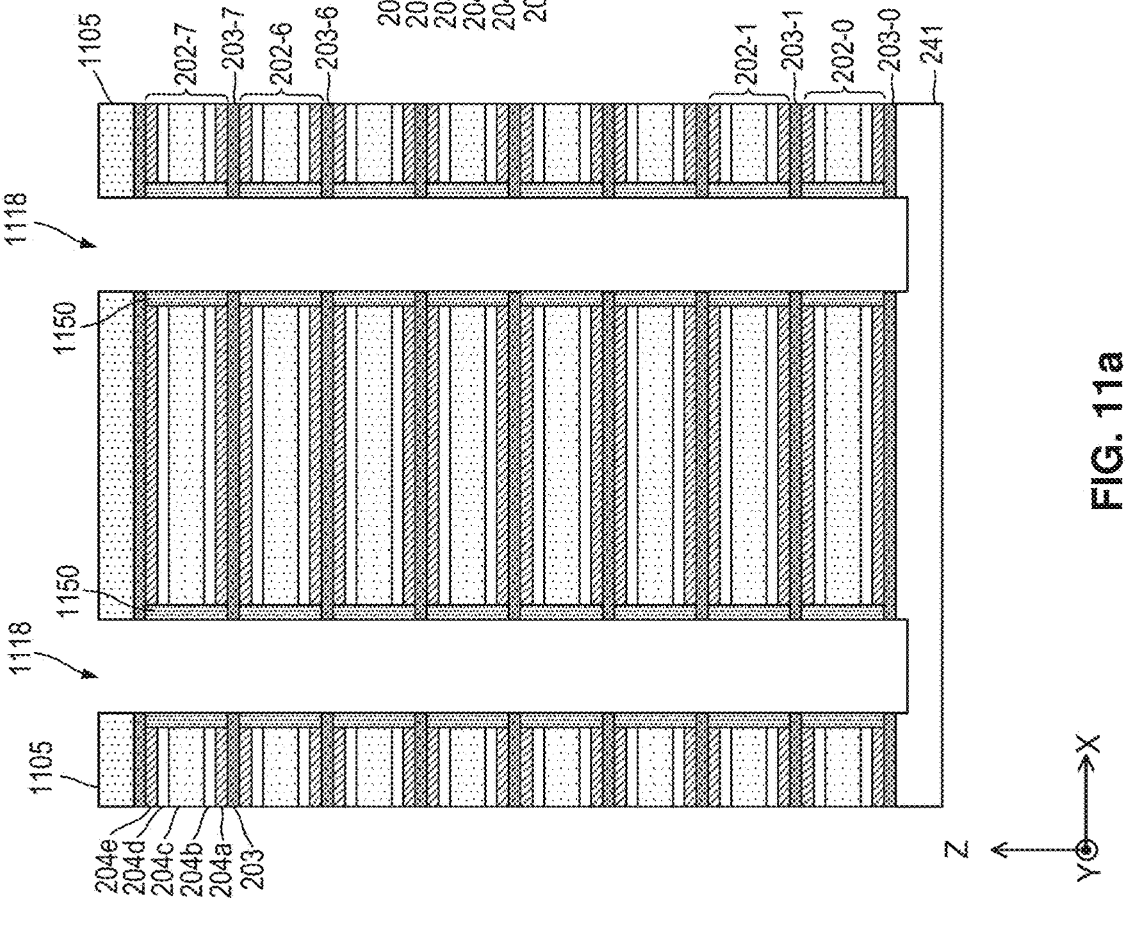
FIGS. 11*a*, 11*b*, 11*c*, 11*d*, 11*e*, 11*f*, 11*g*, 11*h*, 11*i*(*i*), 11*i*(*ii*), 11*j*(*i*), 11*j*(*ii*), 11*k*(*i*), 11*k*(*ii*), 111 (*i*), 111 (*ii*), 11*m*(*i*), 11*m*(*ii*), 11*n*(*i*), 11*n*(*ii*), 11*o*(*i*), 11*o*(*ii*), 11*p*(*i*), 11*p*(*ii*), 11*q*(*i*), 11*q*(*ii*), 11*r*(*i*), and 11*r*(*ii*) illustrate an additional process in which, subsequent to forming ferroelectric layers, the channel regions for the FeFETs of an array of NOR memory strings are formed by replacing an earlier-formed sacrificial layer, according to one embodiment of the present invention.
Figure 11B:
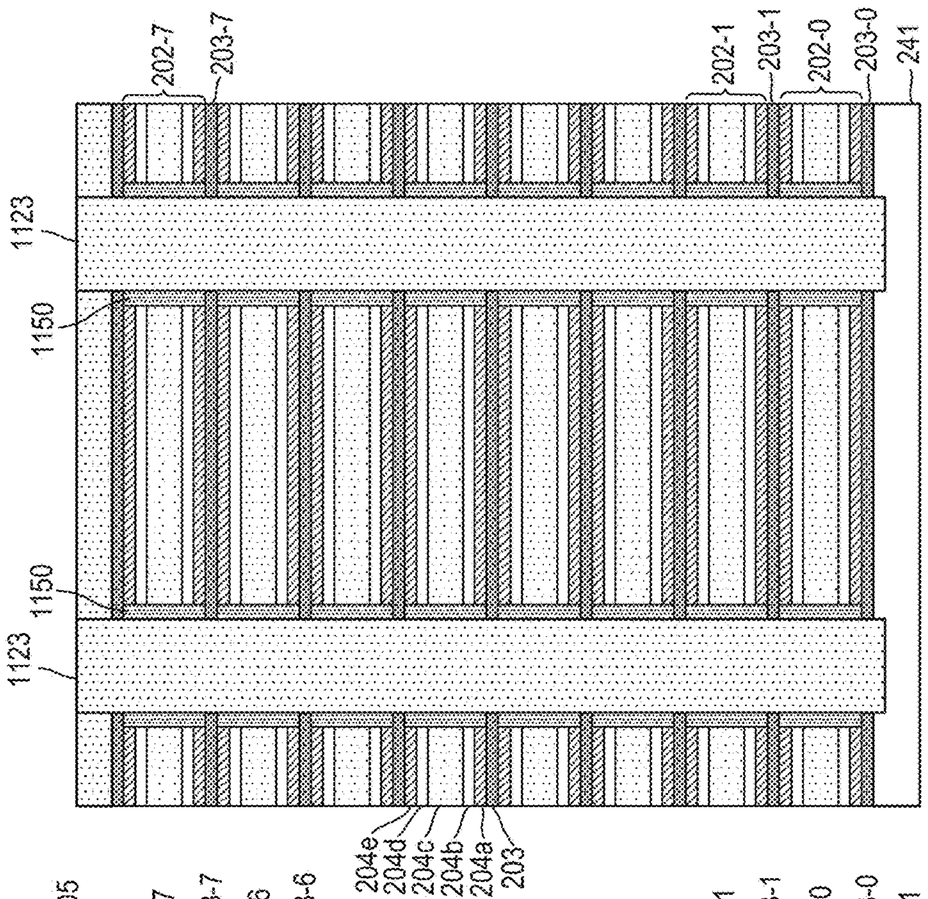
Figure 11D:
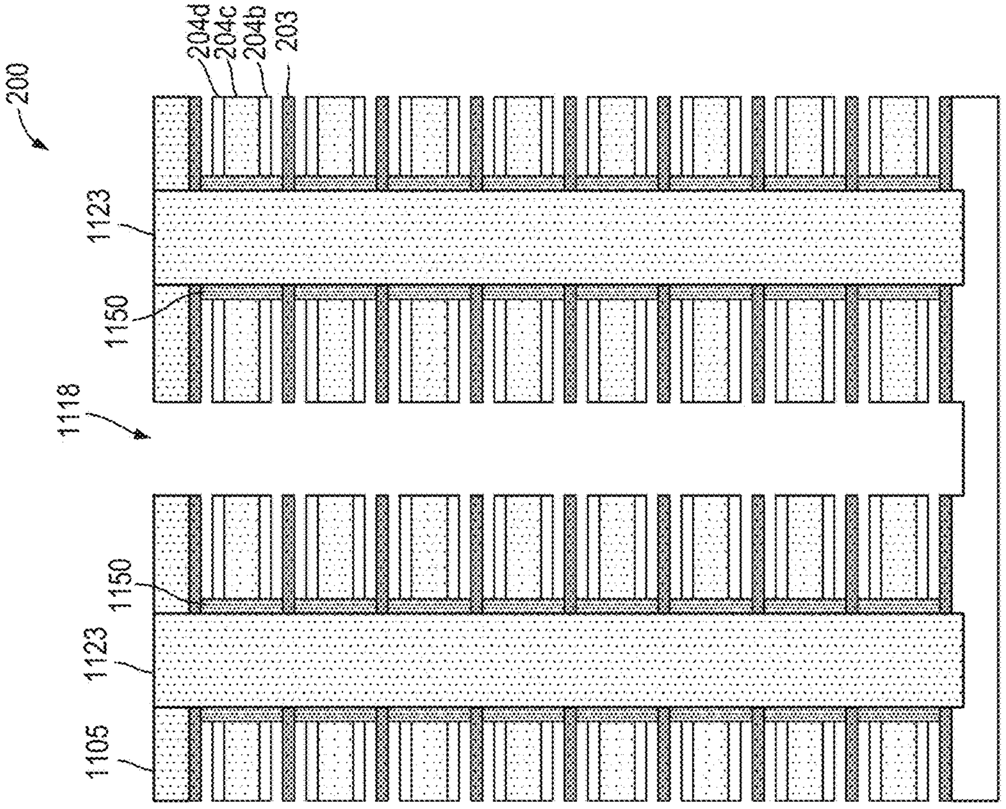
Figure 11C:
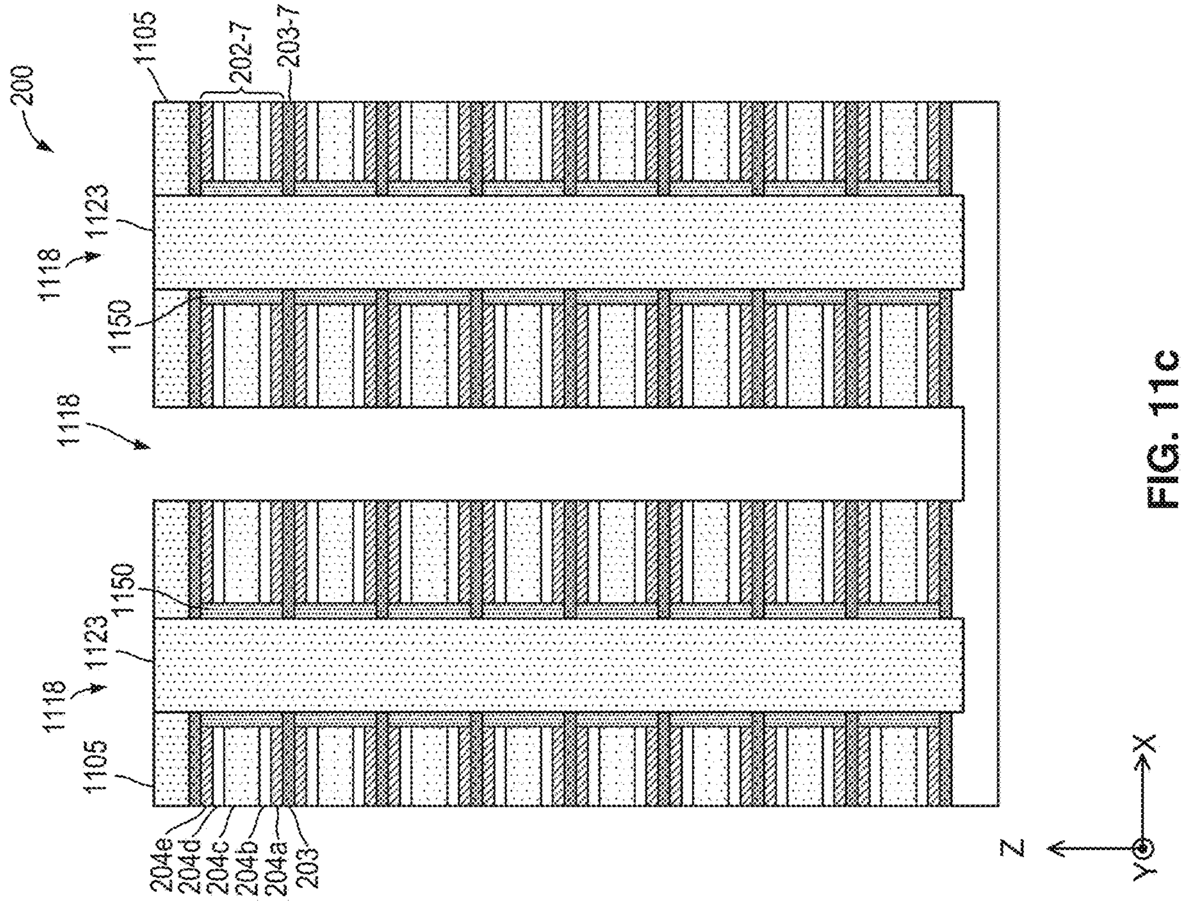
Figure 11F:
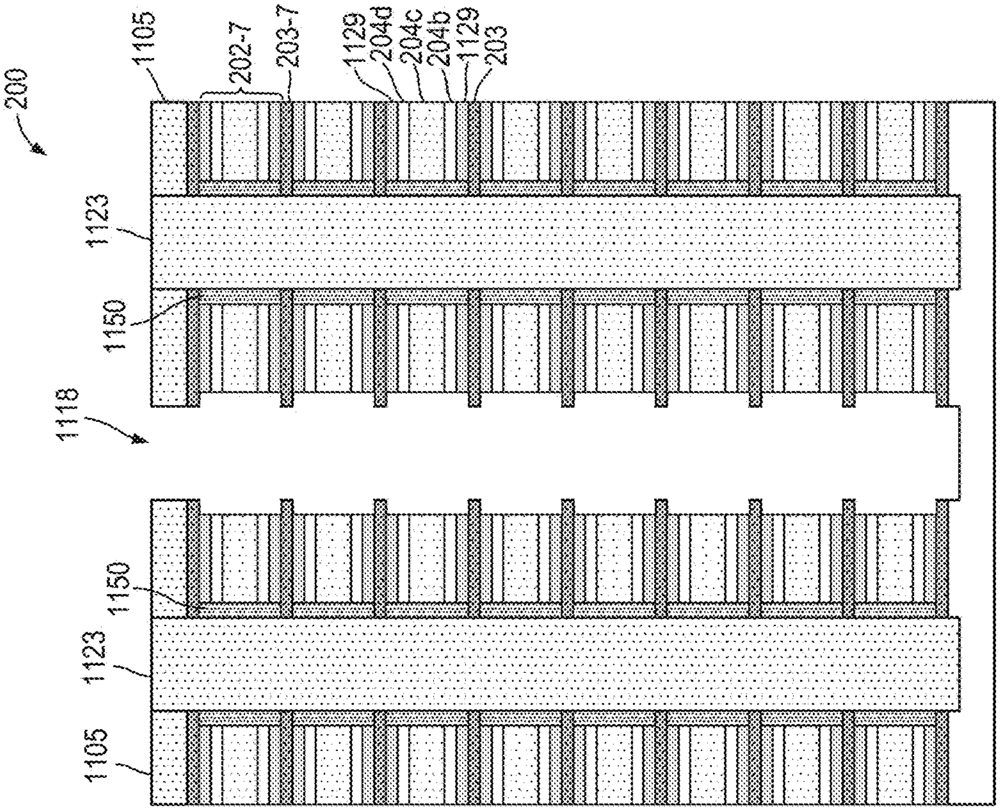
Figure 11E:
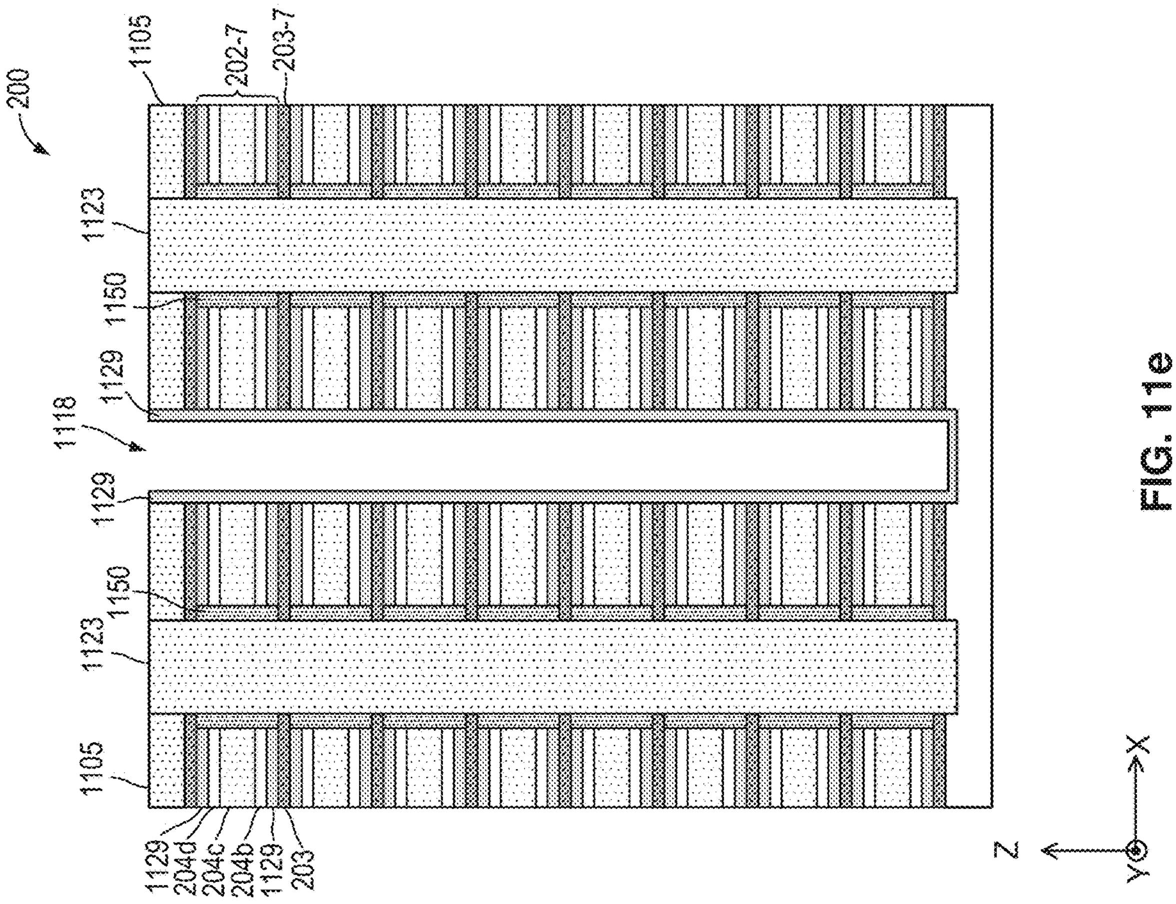
Figure 11H:
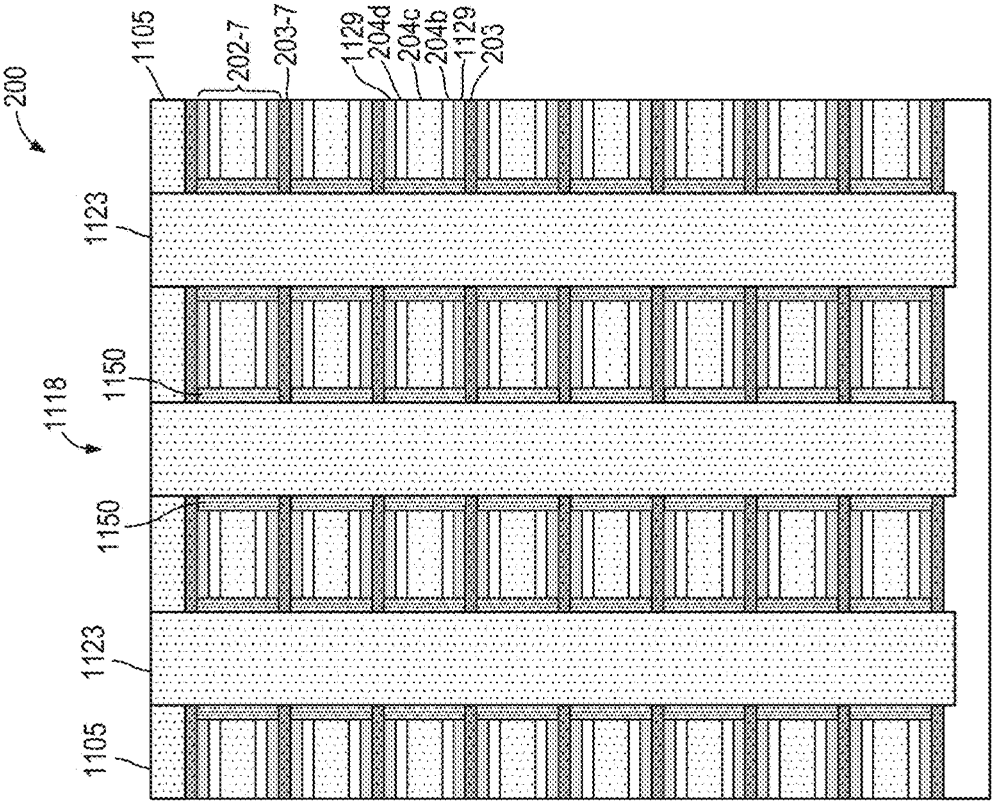
Figure 11G:
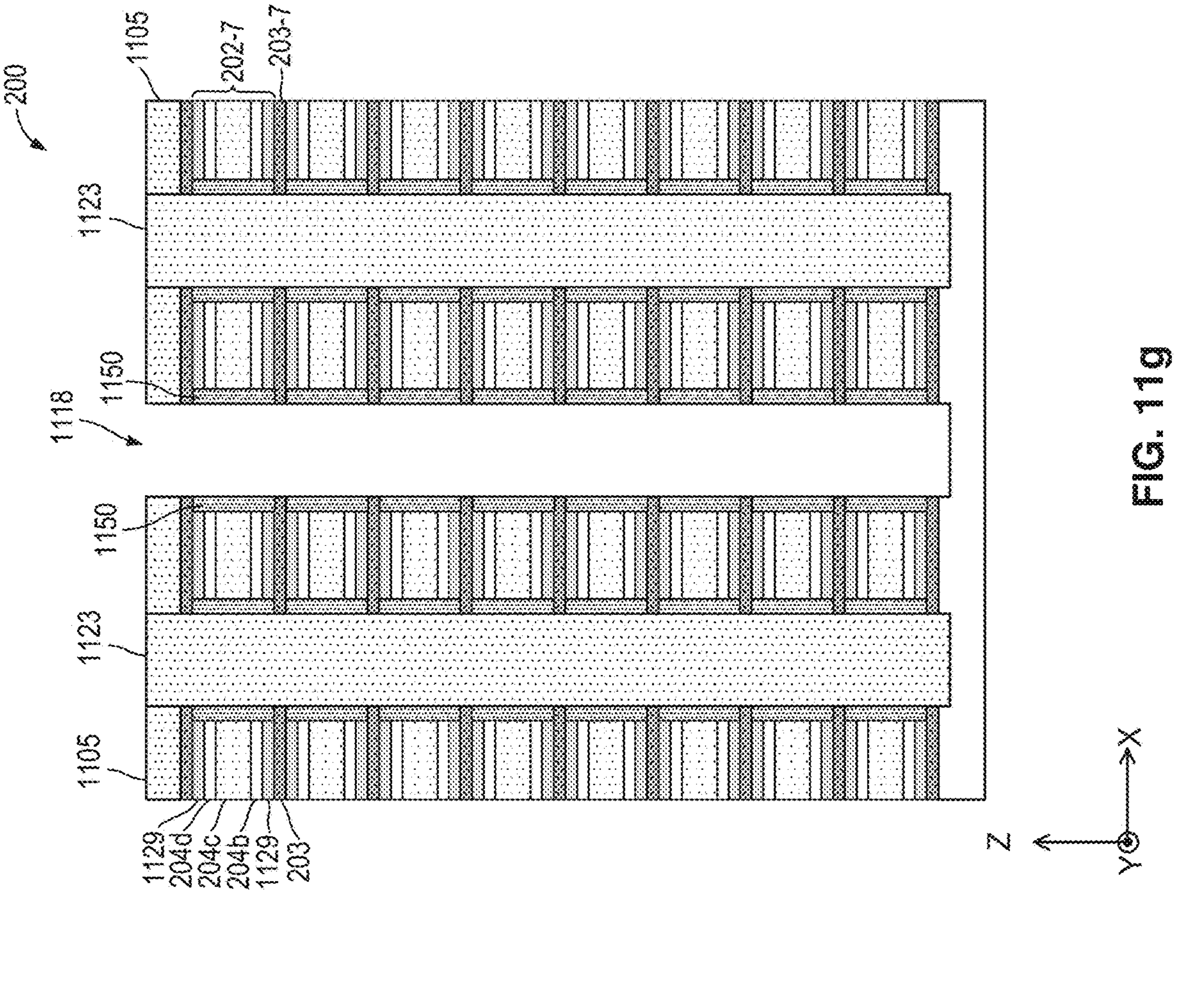
Figure 11I:
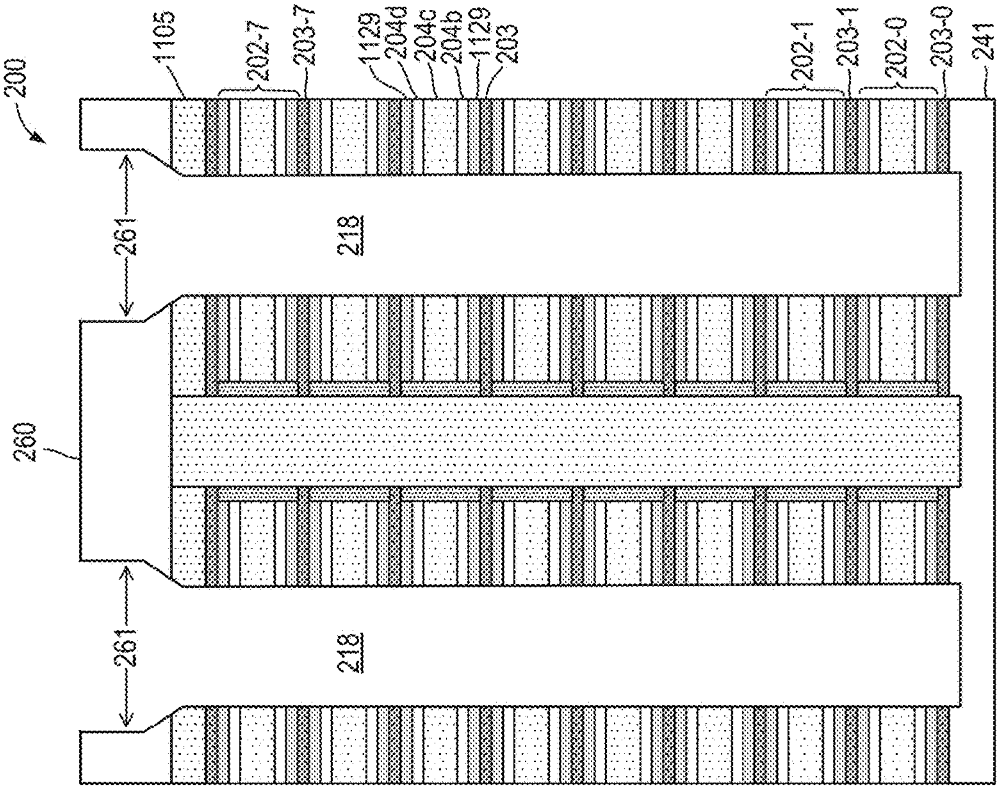
Figure 11I:
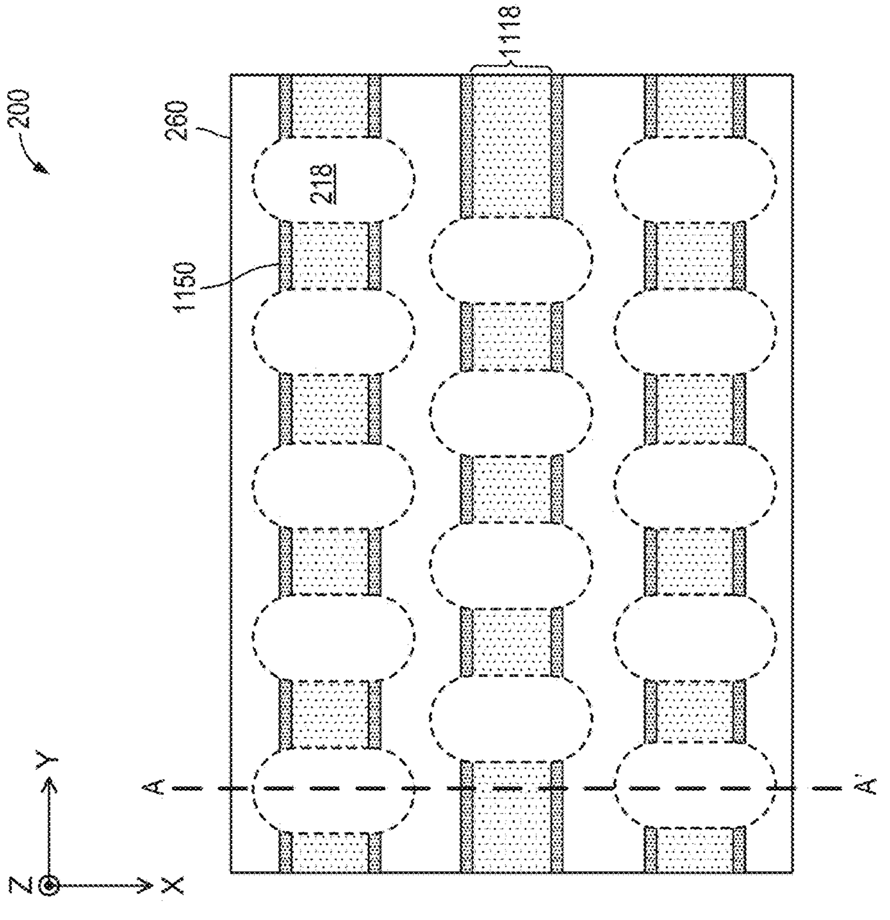
Figure 11J:
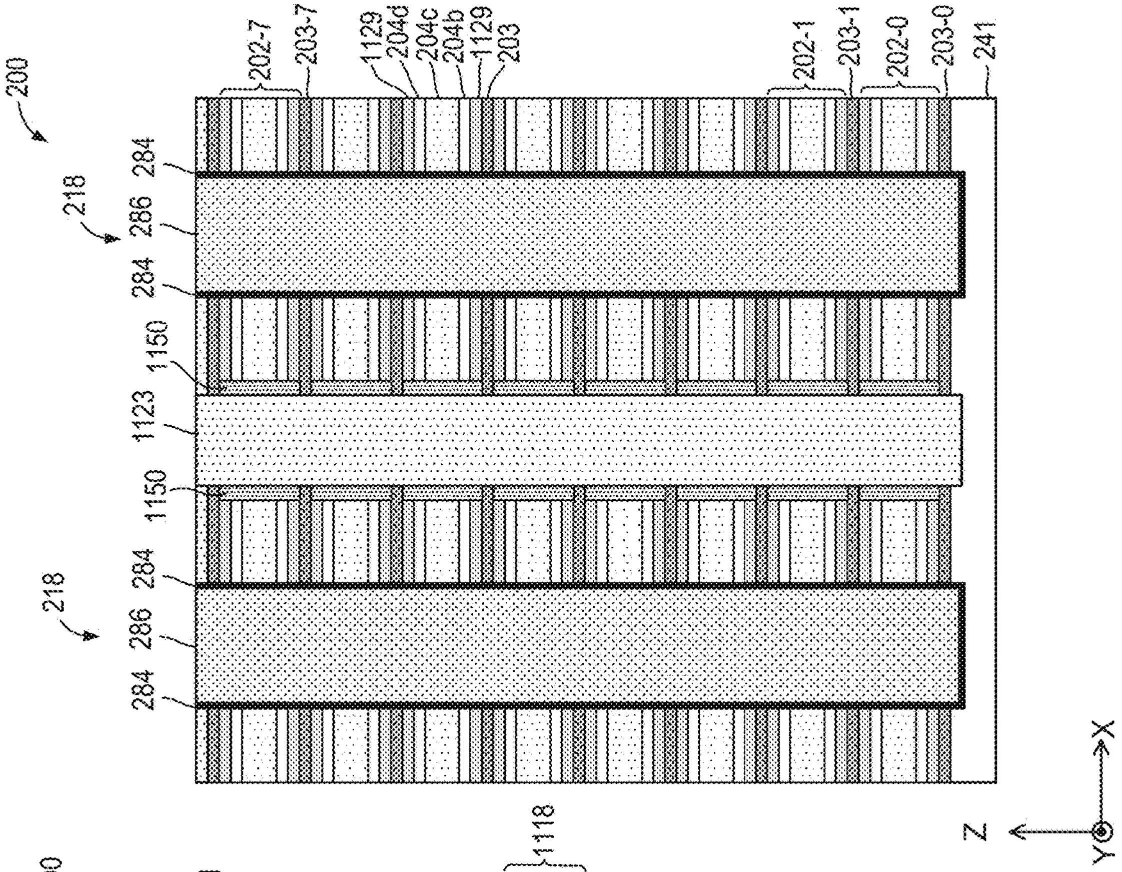
Figure 11J:
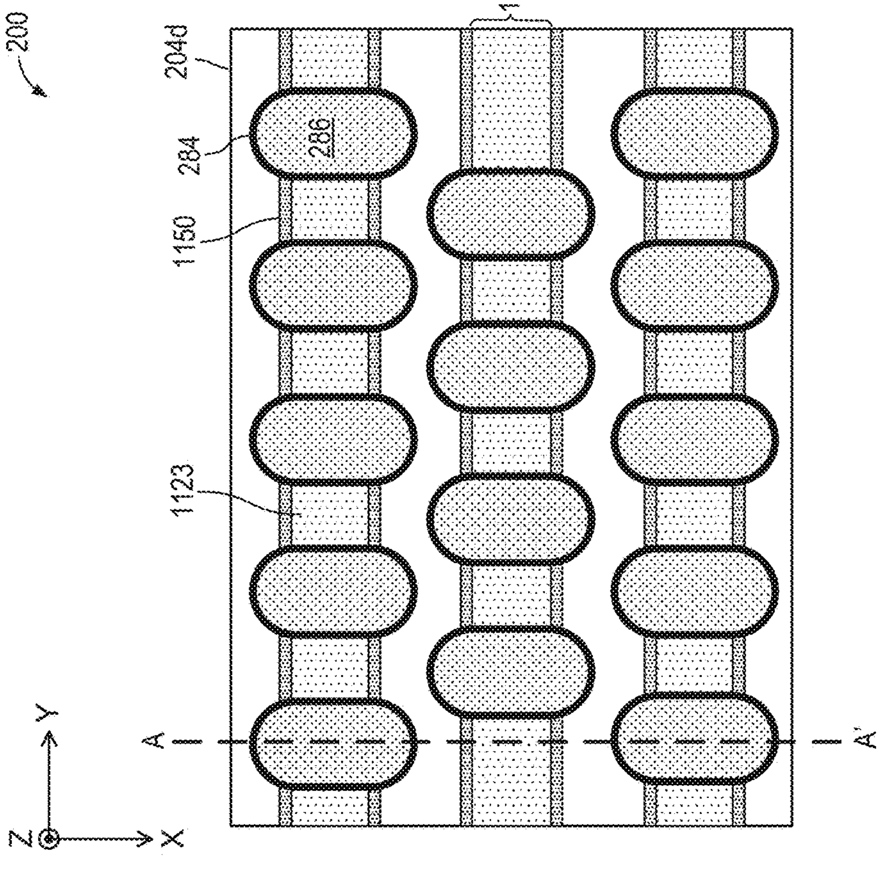
Figure 11K:
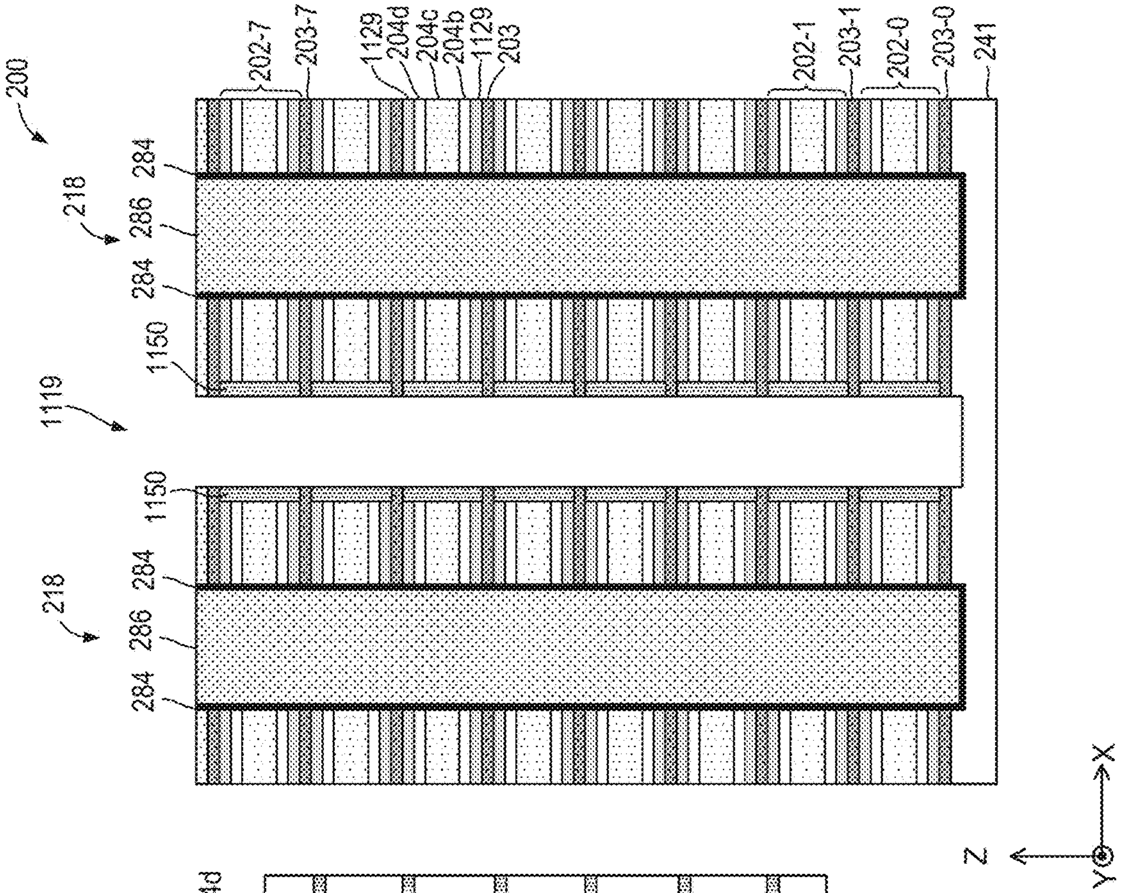
Figure 11K:
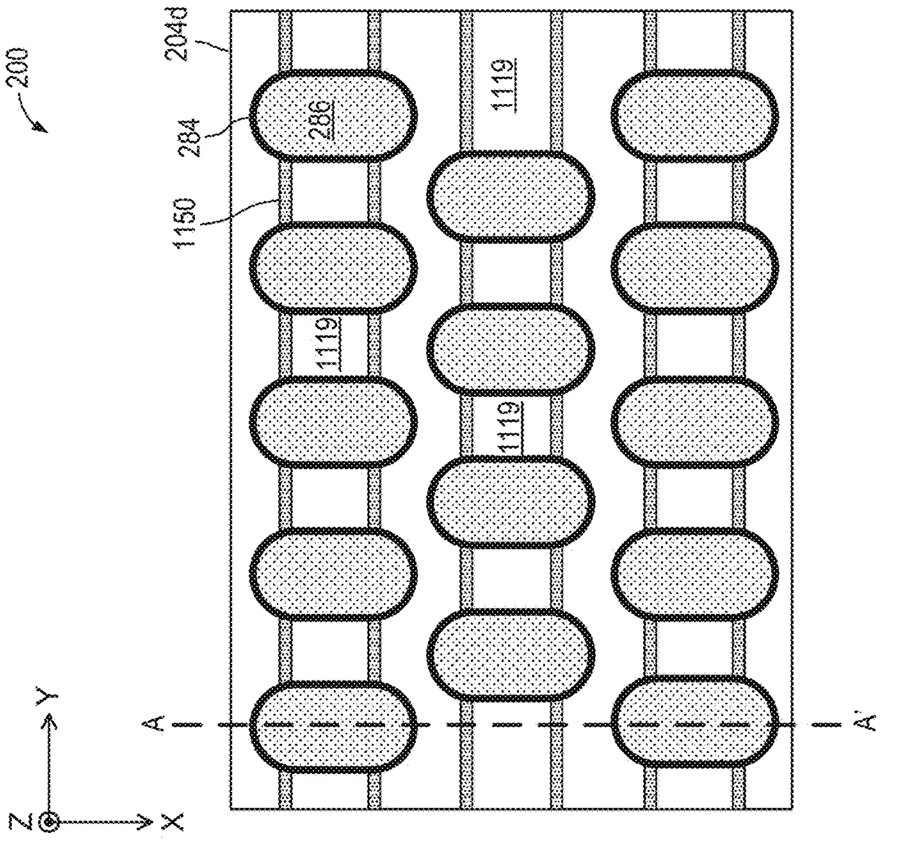
Figure 11I:
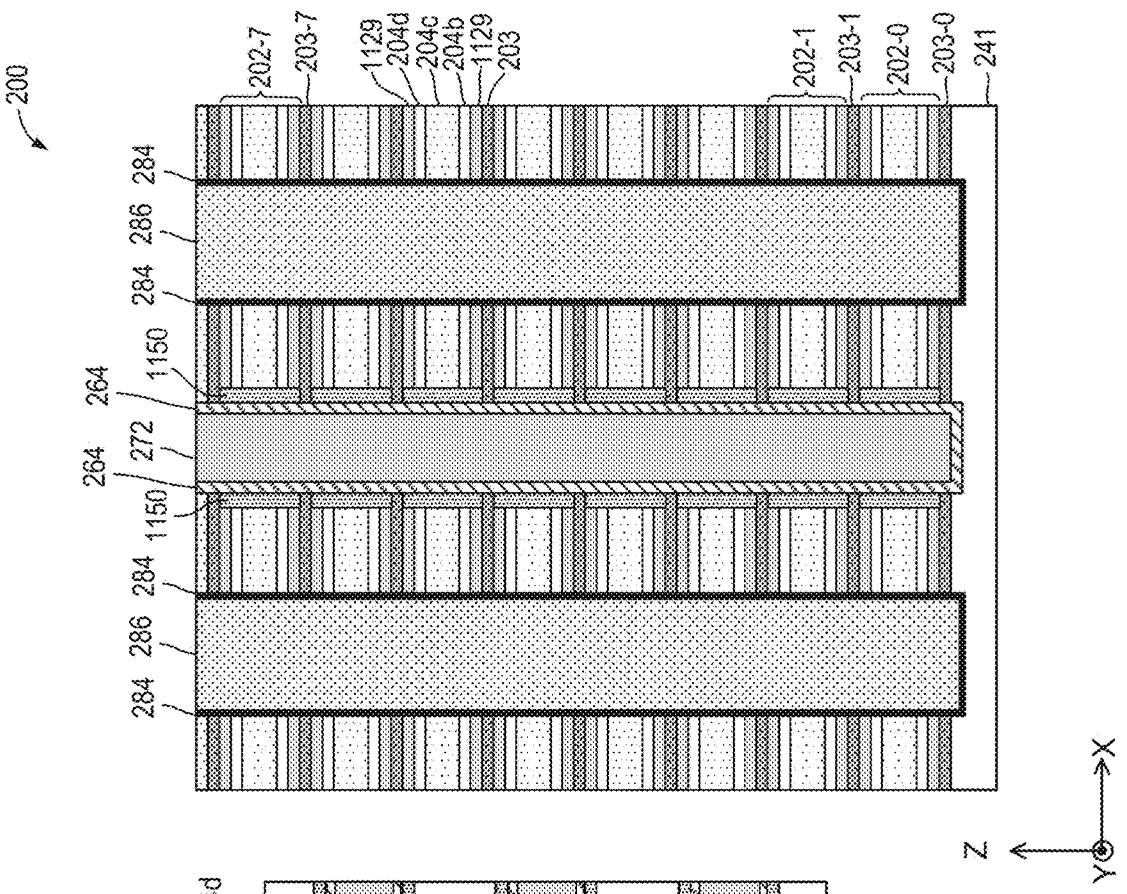
Figure 11I:
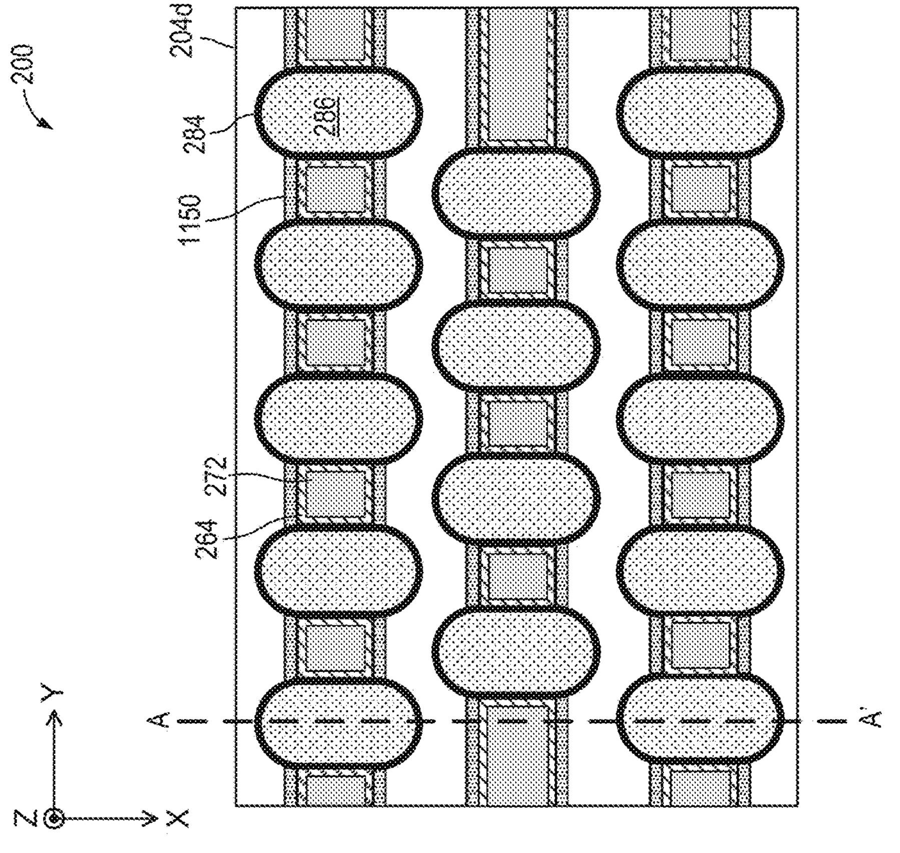
Figure 11M:
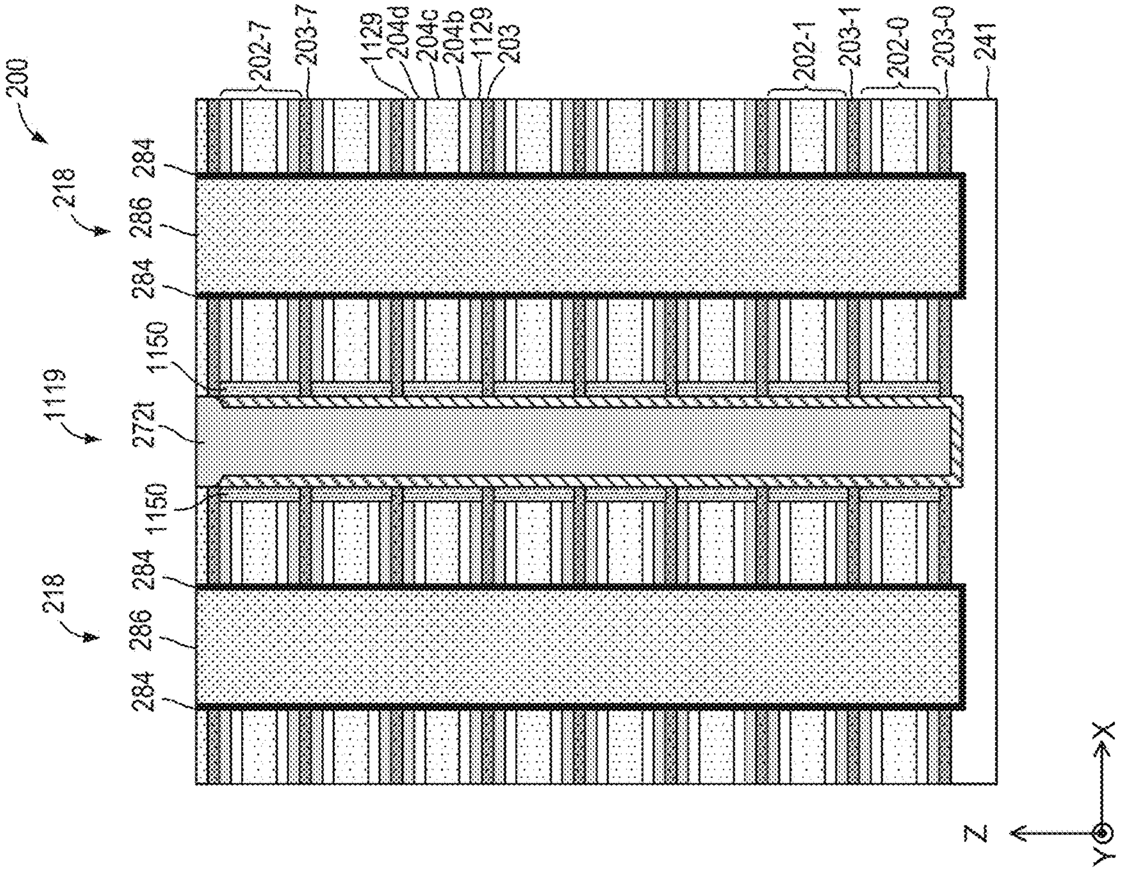
Figure 11M:
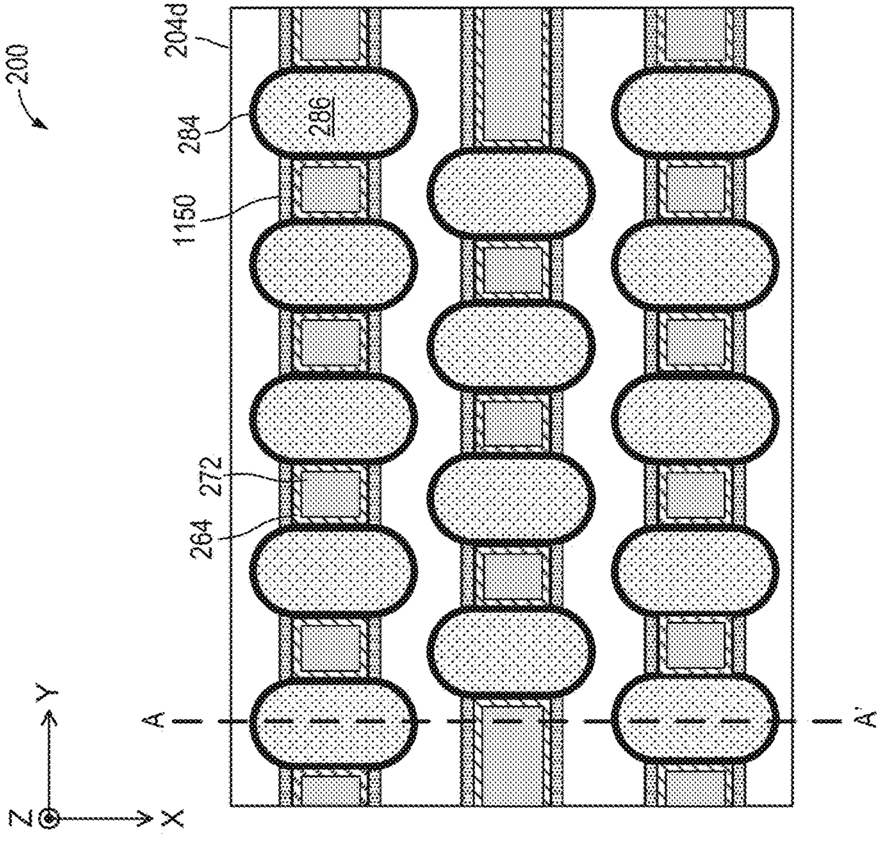
Figure 11N:
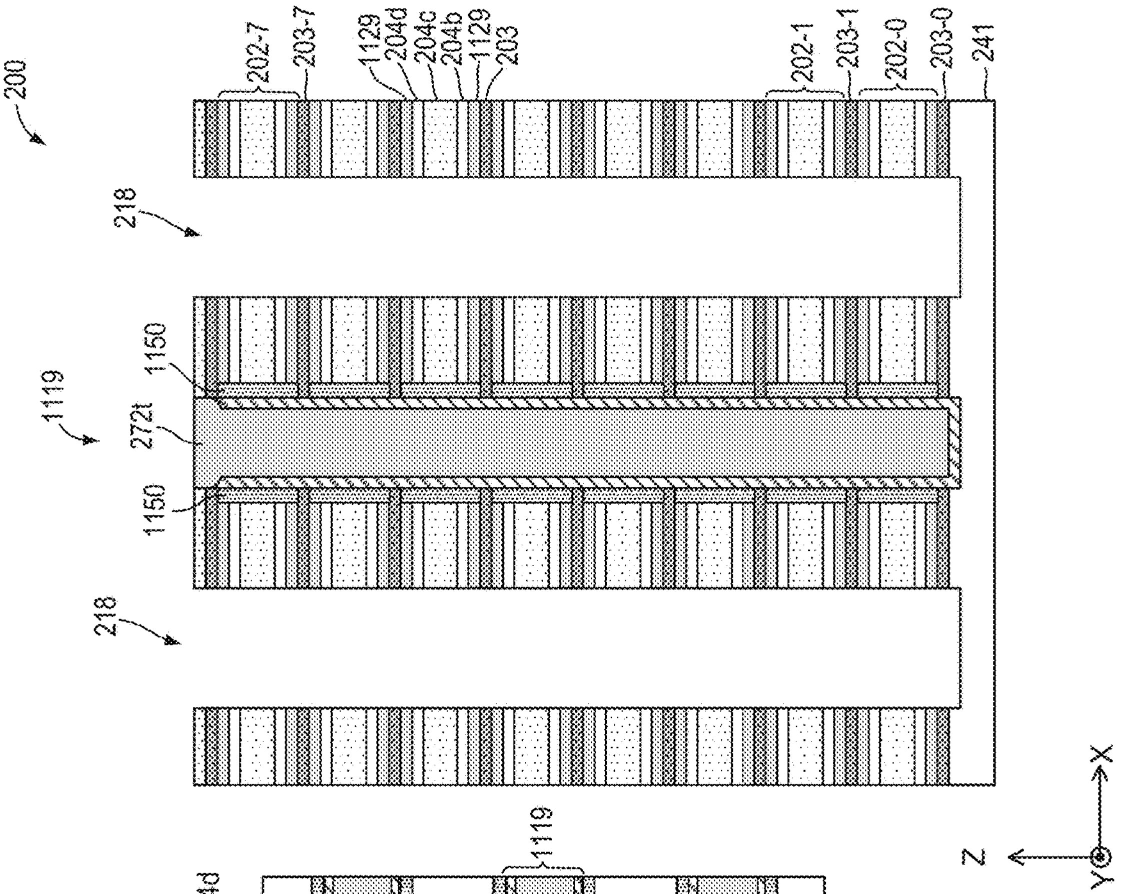
Figure 11N:
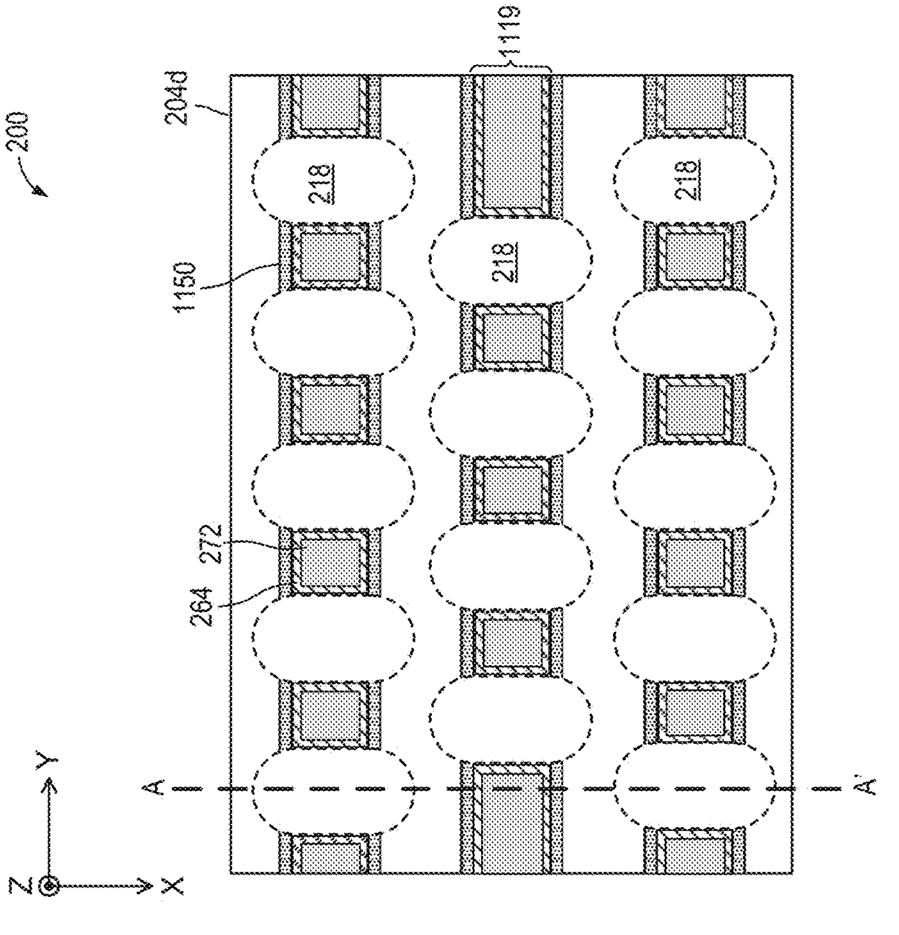
Figure 11O:
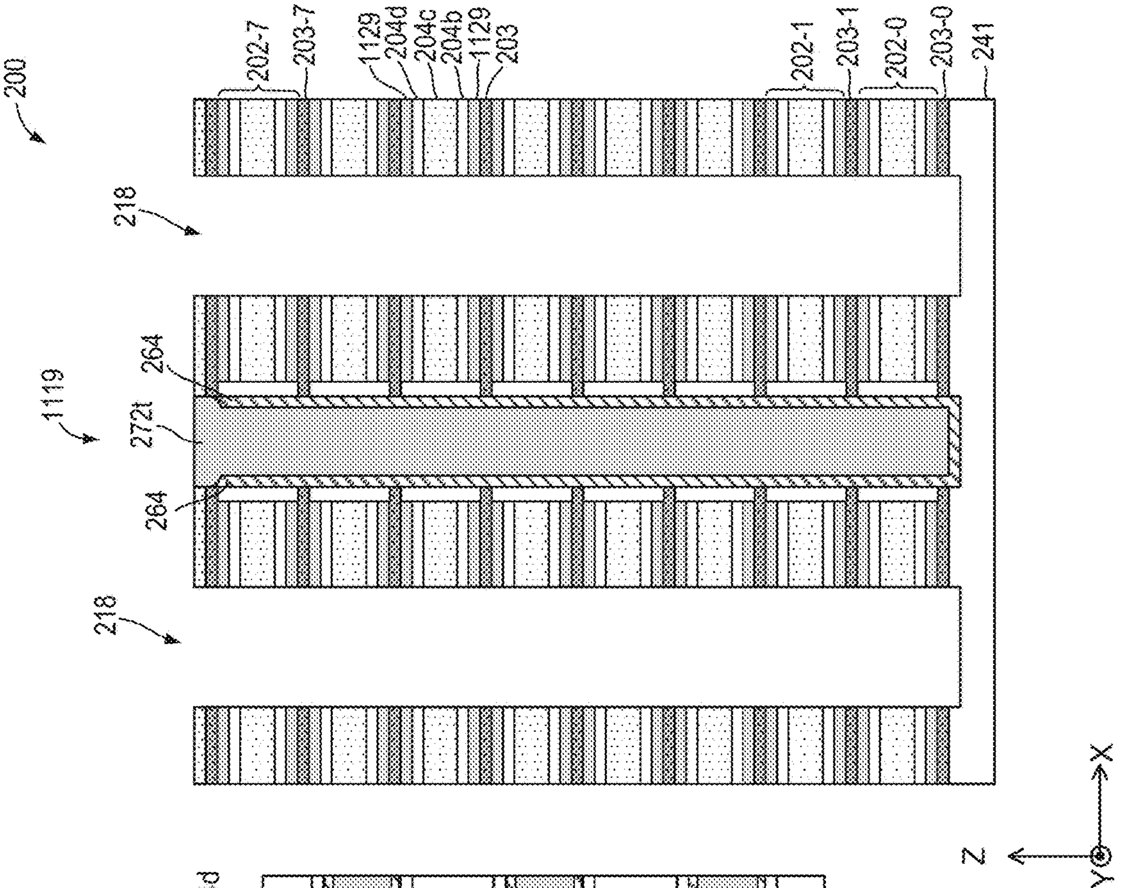
Figure 11O:
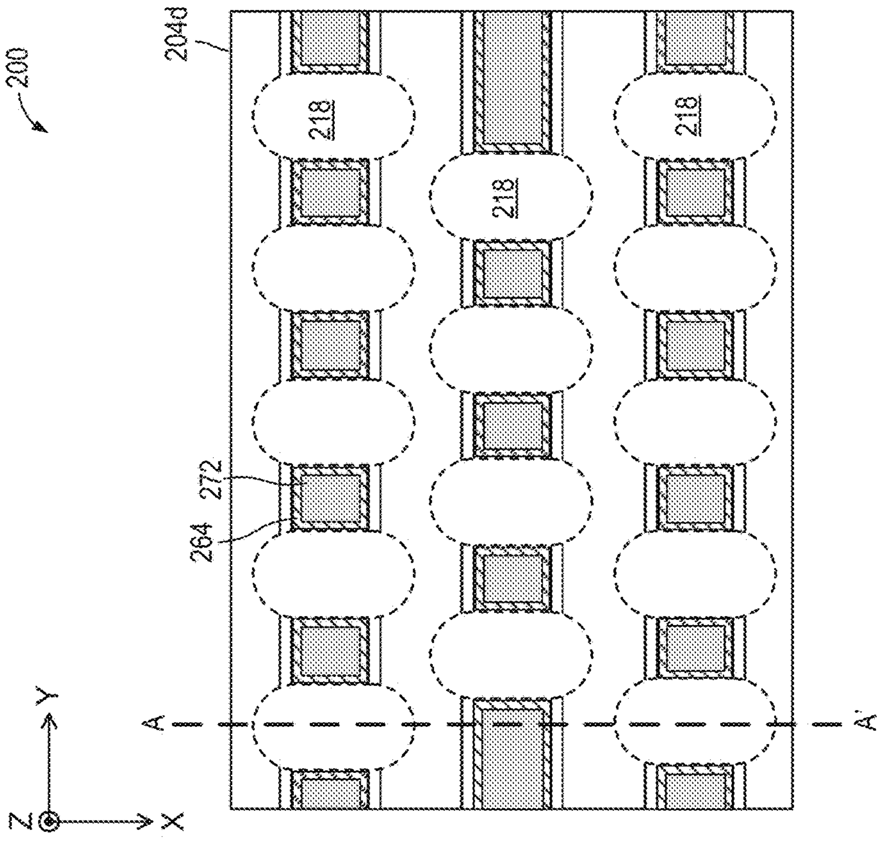
Figure 11P:
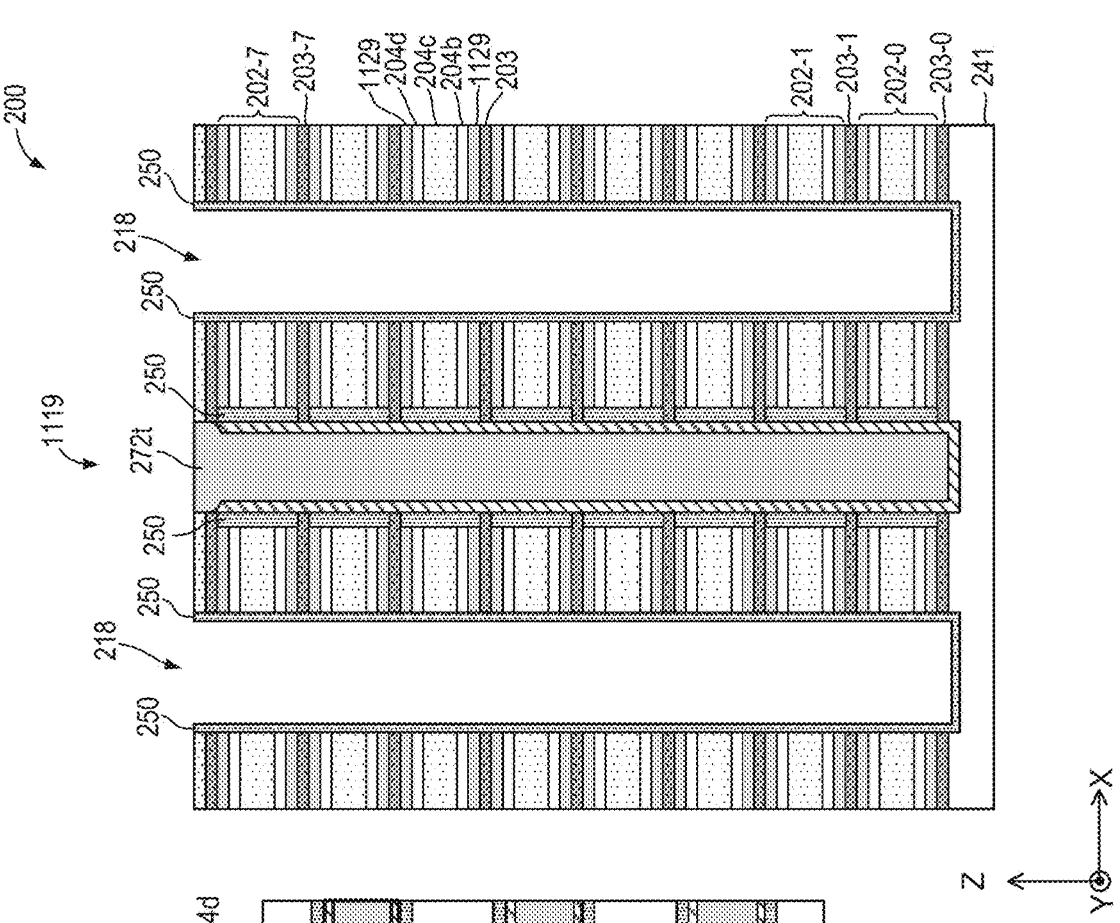
Figure 11P:
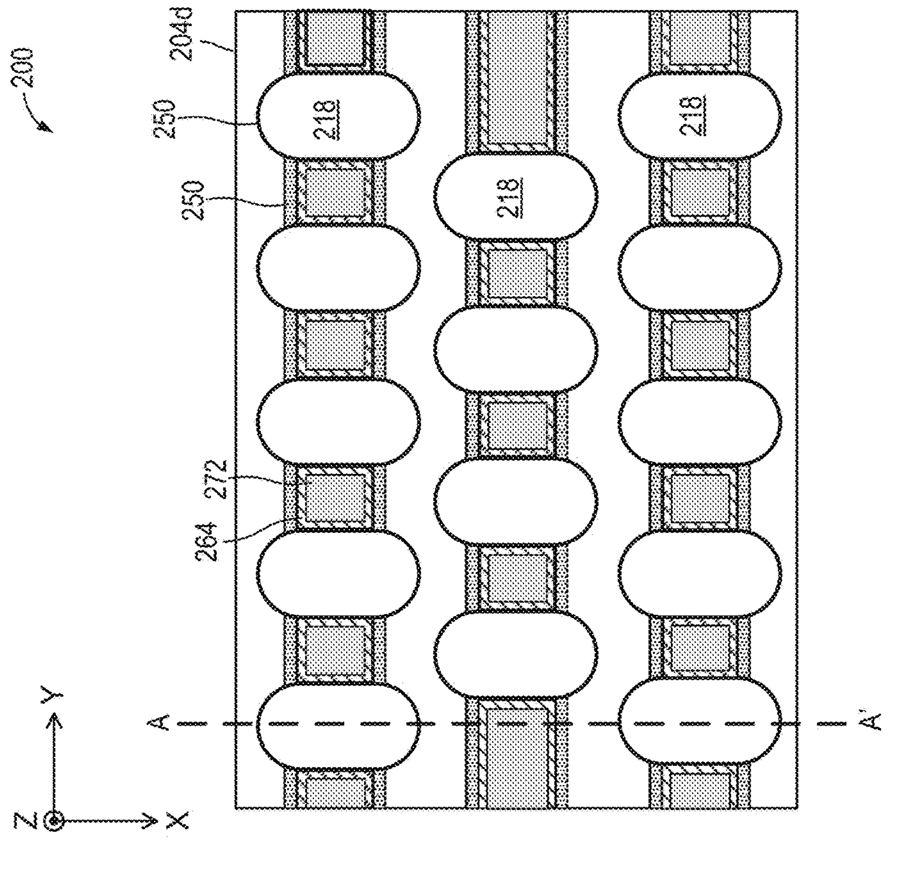
Figure 11R:
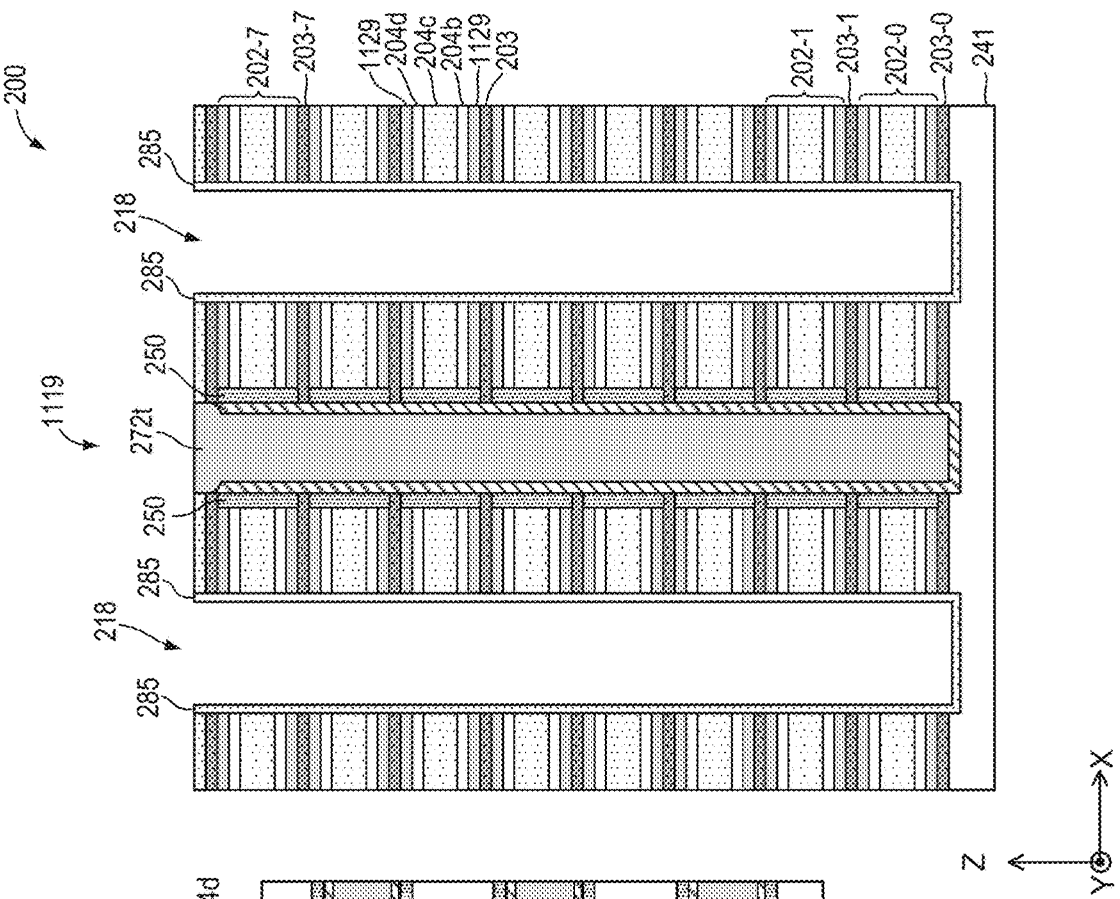
Figure 11R:
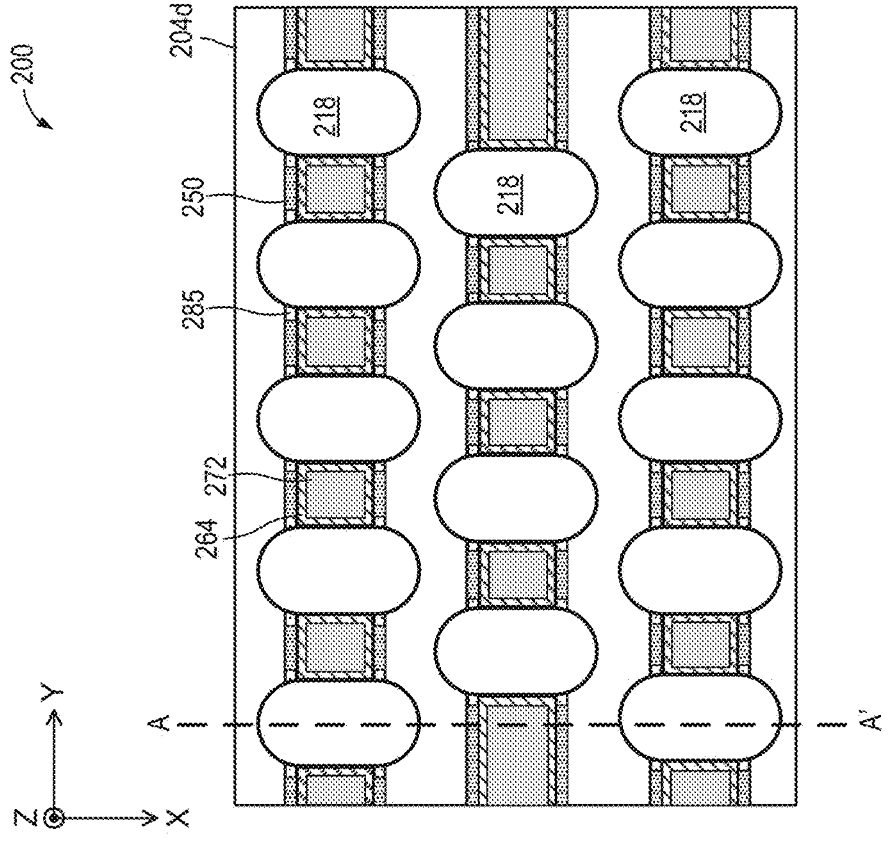

In the exemplary fabrication processes described in detail above, channel polysilicon 250 is formed prior to forming polarization layer 264. Higher quality channel regions for the FeFETs may be achieved in a process in which the channel region is formed after forming polarization layer 264. In such a "channel-last" approach, the polarization layer and the channel layer may be optimized independently, which improves both endurance and disturb immunity. FIGS. 11*a* to 11*r* illustrate a process in which the channel region for an FeFET is formed after forming the polarization layer. The channel region in such a process is achieved by replacing at least in part a previously formed sacrificial layer with a channel material after the polarization layer is formed, according to one embodiment of the present invention.

FIG. 11*a* illustrates, for example, at the beginning of processing the array portion of the 3-dimensional array of NOR memory strings (e.g., as described above in conjunction with FIG. 2*d* above), isolation layer 1105 (e.g., a SiOC layer) and a hard mask layer (e.g., a carbon hard mask) are deposited over the active layers. The hard mask layer is then photo-lithographically patterned, so that its pattern may be transferred to allow etching a first group of trenches (i.e., trenches 1118) in memory structure 200. Trenches 1118 each extend through isolation layers 1105 and 203-7 to 203-0, active layers 202-7 to 202-0 and etch-stop layer 241. Trenches 1118 are each substantially rectilinear in an X-Y plane cross section, each trench being 70.0 nm wide along the X-direction, for example, with corresponding edges of adjacent trenches separated 190.0 nm from each other. In that embodiment, trenches 1118 are etched at an aspect ratio that is less than 50 (and, in some embodiments, even less than 30).

A series of etching steps then recess silicon nitride layers 204*a* and 204*e*, $n^+$-doped silicon layers 204*b* and 204*d* and sacrificial oxide layer 204*c* of each active layer 202 by, for example, 10.0 nm. Thereafter, sacrificial layer 1150 (e.g., amorphous silicon or polysilicon layer, or any other suitable sacrificial material) is conformally deposited to provide a "stand-in" layer for the channel regions to be subsequently formed. Sacrificial layer 1150 is then etched back (i.e., a separation etching step). As described above, $n^+$ silicon layers 204*b* and 204*d* in each active layer 202 would provide the common bit line and the common source line for the FeFETs in a NOR memory string to be formed. The hard mask and any excess sacrificial material of sacrificial layer 1105 on top of memory structure 200 are then removed (e.g., by CMP). Resulting memory structure 200 is shown in the X-Z plane cross section of FIG. 11*a*.

Thereafter, dielectric material 1123 is deposited to fill trenches 1118. Any excess dielectric material is removed from the top surface of semiconductor structure 200, which is then planarization (e.g., by CMP). FIG. 11*b* shows resulting memory structure 200 in an X-Z plane cross section.

Subsequently, one or more additional groups of trenches may be etched in the same manner as described above for trenches 1118. Forming trenches in multiple groups allow each group of trenches to be etched at a favorable aspect ratio (e.g., less than 50). FIG. 11*c* shows resulting memory structure 200 in an X-Z plane cross section, after the second group of trenches are formed, according to one embodiment of the present invention. Both groups of trenches are shown in FIG. 11*c* and each indicated by reference numeral 1118.

In this embodiment, through the unfilled ones of trenches 1118, SiN layers 204*a* and 204*e* of each active layer 202 may be removed using a wet etch, for example. FIG. 11*d* shows resulting memory structure 200 in an X-Z plane cross section, after removal of SiN layers 204*a* and 204*e* from each of active layers 202-0 to 202-7, according to one embodiment of the present invention.

Conductive material 1129 may then be deposited using, for example, an ALD technique. Conductor material 1129 may be, for example, a liner (e.g., titanium, titanium nitride (TiN), tantalum (Ta), tantalum nitride (TaN), or any combination thereof), followed by a refractory metal (e.g., tungsten (W), tungsten nitride, or Molybdenum (Mo)). Conductive material 1129 may be deposited into the cavities resulting from removing SiN layers 204*a* and 204*e* from each of active layers 202-0 to 202-7. Thereafter, an etch-back step or an anisotropic etching step removes conductive material 1129 from the bottom of trenches 1118, leaving a substantially conformal layer on their sidewalls. FIG. 11*e* shows resulting memory structure 200 in an X-Z plane cross section, after replacement of SiN layers 204*a* and 204*e* from each of active layers 202-0 to 202-7 by conductive material 1129, according to one embodiment of the present invention.

Conductive material 1129 form optional conductor layers in contact with $N^+$ polysilicon layers 204*b* and 204*d* to reduce the resistivity in the common bit line and the common source line of a NOR memory string to be formed. Conductive material 1129 may be removed from the sidewalls of trenches 218 and to be further recessed by additional etching. A series of etching steps then recess $n^+$-doped silicon layers 204*b* and 204*d*, and sacrificial oxide layer 204*c* of each active layer 202 by, for example, 10 nm. FIG. 11*f* shows resulting memory structure 200 in an X-Z cross section, after recessing conductive material 1129, $n^+$-doped silicon layers 204*b* and 204*d* and sacrificial oxide layer 204*c* of each active layer 202, according to one embodiment of the present invention.

Thereafter, channel stand-in sacrificial layer 1150 may be conformally deposited on the sidewalls of trenches 1118, in substantially the same manner as described above in conjunction with FIG. 11*a*. FIG. 11*g* shows resulting memory structure 200 in an X-Z cross section, after deposition of sacrificial material 1150 into trenches 1118, according to one embodiment of the present invention.

Trenches 1118 may then be filled by dielectric material 1123 and planarized in the same manner as described above in conjunction with the steps for providing dielectric material 1123 of FIG. 11*b*. FIG. 11*h* shows resulting memory structure 200 in an X-Z cross section, after deposition of dielectric material 1123 into trenches 1118, according to one embodiment of the present invention.

After silicon oxide 1123 is deposited into trenches 1118 and planarized, the next steps form the gate stacks (i.e., polarization layer 264 and the gate electrode (i.e., the "word line" or the "local word line") for each FeFET of the NOR memory strings. After planarization of dielectric material 1123, hard mask 260 is provided over memory structure 200, photolithographically patterned and developed. Hard mask 260 includes columns of oval openings 261. (In this description, a "column" of objects denotes objects aligned along the Y-direction, whereas a "row" of objects denotes objects aligned along the X-direction.) FIG. 11*i*(*i*), oval openings 261 in each column are provide staggered relative to oval openings 261 in the immediately adjacent columns along the X-direction, such that the closest openings in adjacent columns have a greater separation between them than if such openings are aligned along the X-direction. In one embodiment, adjacent openings within each column are located at a 110.0 nm pitch along the Y-direction, while adjacent columns are also provided at 110.0 nm pitch along the X-direction. In this embodiment, the major and minor axes of each opening may be, for example, 100.0 nm and 60.0 nm along the X-direction and the Y-direction, respectively. A series of etchings through openings 261 excavates corresponding shafts 218, removing dielectric material 1123 from trenches 1118 and portions of isolation layers 203-0 to 203-7, and active layers 202-0 to 202-7, reaching down to etch step layer 241. FIGS. 11*i*(*i*) and 11*i*(*ii*) show, respectively, a top view and an X-Z plane cross section view (along line A-A' of FIG. 11*i*(*i*)) of resulting memory structure 200, after shafts 218 are formed, according to one embodiment of the present invention. The aspect ratio of the etch steps creating shafts 218 have an aspect ratio that is still substantially within the desirable range (e.g., less than 50).

Next, silicon nitride liner 284 (e.g., 5 nm thick) is deposited conformally on the sidewalls of shafts 218, which are then filled by sacrificial material 286. Sacrificial material 286 may be, for example, a deposited amorphous silicon. Hard mask 260 is then removed and the surface of memory structure 200 is planarized (e.g., by CMP). FIGS. 11*j*(*i*) and 11*j*(*ii*) show a top view and an X-Z plane cross section view (along line A-A' of FIG. 11*j*(*i*)) of resulting memory structure 200, after shafts 218 are filled by sacrificial material 286, respectively, according to one embodiment of the present invention.

A wet etch then removes dielectric material 1123 from portions 1119 of trenches 1118 between filled shafts 218. Portions 1119 are also referred to as shafts 1119. FIGS. 11*k*(*i*) and 11*k*(*ii*) show, respectively, a top view and an X-Z plane cross section view (along line A-A' of FIG. 11*k*(*i*)) of resulting memory structure 200, after dielectric material 1123 is removed from shafts 1119, according to one embodiment of the present invention.

Thereafter, within each of shafts 1119, gate stacks for FeFETs in the adjacent active strips are provided. As discussed above, each gate stack may be formed using any of the techniques illustrated above in conjunction with FIGS. 3*a*-3*b*, FIGS. 4*a*-4*c*, FIGS. 5*a*-5*c*, 5*d*(*i*), 5*e*(*i*) and 5*f*(*i*), or FIGS. 5*a*-5*c*, 5*d*(*ii*), 5*e*(*ii*) and 5*f*(*ii*). In some embodiments, as discussed above, each gate stack may include (a) polarization layer 264 having, for example, both an interface dielectric layer and the ferroelectric material (e.g., zirconium-doped hafnium oxide) and (b) a gate electrode formed out of conductive material 272 common to FeFET in the adjacent active strips. Conductive material 272 may include a metal liner (e.g., titanium (Ti), titanium nitride (TiN), tantalum (Ta) or tantalum nitride (TaN)) and a refractory metal (e.g., tungsten (W), tungsten nitride (WN) or molybdenum (Mo)). Formed in this manner, the gate electrode may be 60.0 nm×60.0 nm or less. A planarization step (e.g., CMP) may remove excess conductive material 272 from the top surface of memory structure 200. FIGS. 11*l*(*i*) and 11*l*(*ii*) show a top view and an X-Z plane cross section view (along line A-A' of FIG. 11*l*(*i*)) of resulting memory structure 200, respectively, after the gate stacks to FeFETs have been formed in each of shafts 1119, according to one embodiment of the present invention.

Cap 272*t* may be provided to facilitate contact to the underlying local word line and to protect polarization layer 264 in subsequent processing steps. Cap 272*t* may be formed using additional masking, patterning, deposition (e.g., conductive material 272). and planarization steps. FIGS. 11*m*(*i*) and 11*m*(*ii*) show a top view and an X-Z plane cross section view (along line A-A' of FIG. 11*m*(*i*)) of resulting memory structure 200, respectively, after cap 272*t* has been provided in each of shafts 1119, according to one embodiment of the present invention.

Sacrificial material 286 and silicon nitride liner layer are then removed from shafts 218 to provide access to sacrificial layer 1150. FIGS. 11*n*(*i*) and 11*n*(*ii*) show a top view and an X-Z plane cross section view (along line A-A' of FIG. 11*n*(*i*)) of resulting memory structure 200, respectively, after sacrificial material 286 and silicon nitride liner layer 284 have been removed from each of shafts 1119, according to one embodiment of the present invention.

Thereafter, sacrificial material 1150 is removed by a wet etch, for example. FIGS. 11*o*(*i*) and 11*o*(*ii*) show a top view and an X-Z plane cross section view (along line A-A' of FIG. 11*o*(*i*)) of resulting memory structure 200, respectively, after sacrificial material 1150 is removed from each of shafts 218, according to one embodiment of the present invention.

$P^-$-doped polysilicon is then deposited as channel polysilicon layer 250 into the cavities resulting from removing sacrificial material 1150 from underneath polarization layer 264. At the same time, p"-doped polysilicon is also deposited up to 10.0 nm on the sidewalls of shafts 218. FIGS. 11*p*(*i*) and 11*p*(*ii*) show a top view and an X-Z plane cross section view (along line A-A' of FIG. 11*p*(*i*)) of resulting memory structure 200, respectively, after a wet etch recesses channel polysilicon layer 250 underneath polarization layer 264 in shafts 1119, according to one embodiment of the present invention.

Channel polysilicon layer 250 may be further recessed to provide greater isolation. This etching step also likely removes p-doped channel polysilicon layer 250 from the sidewalls of shafts 218. FIGS. 11*q*(*i*) and 11*q*(*ii*) show a top view and an X-Z plane cross section view (along line A-A' of FIG. 11*q*(*i*)) of resulting memory structure 200, respectively, after channel polysilicon layer 250 is deposited into the cavities resulting from removing sacrificial material 1150 from shafts 1119, according to one embodiment of the present invention.

Thereafter, an ALD silicon oxide liner 285 (e.g., 10 nm) is deposited into the space under polarization layer 264 resulting from recessing channel polysilicon layer 250. At the same time, silicon oxide liner 285 is also deposited on the sidewalls of shafts 218 to seal access to channel polysilicon 250 from shafts 218. FIGS. 11*r*(*i*) and 11*r*(*ii*) show a top view and an X-Z plane cross section view (along line A-A' of FIG. 11*r*(*i*)) of resulting memory structure 200, respectively, after channel polysilicon material 250 is deposited into the cavities resulting from removing sacrificial material 1150 from shafts 1119, according to one embodiment of the present invention.

Figure 6C:
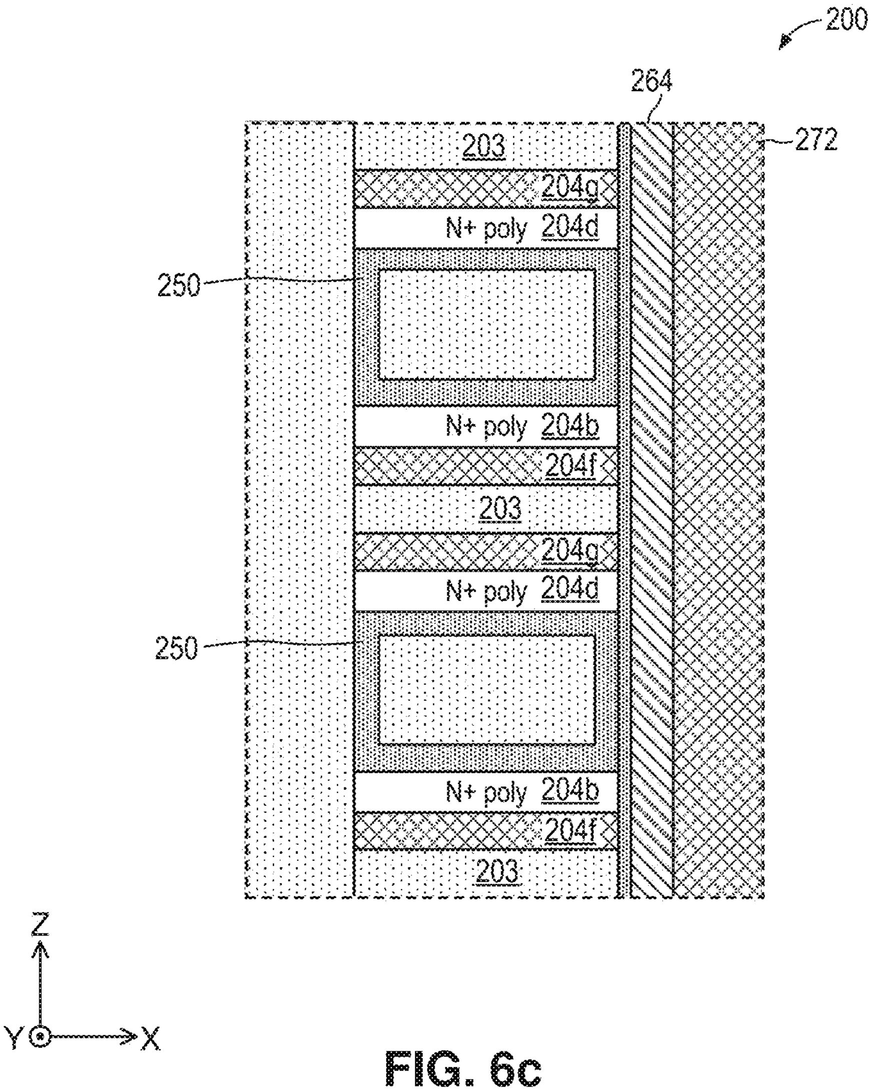
FIG. 6*c* shows an X-Z cross sectional view of memory structure 200, fabricated under a channel-last fabrication process, in accordance with one embodiment of the present invention.

FIG. 6*c* shows memory structure 200, fabricated under a channel-last fabrication process, in accordance with one embodiment of the present invention. As shown in FIG. 6*c*, channel polysilicon layer 250 is deposited conformally to the walls of the cavity resulting from removal of sacrificial layer 1150. In the example of FIG. 6*c*, channel polysilicon layer 250 does not completely fill the cavity.

A silicon oxide may then be deposited into shafts 218 to provide further isolation between the FeFETs. Alternatively, shafts 218 may also be left unfilled, allowing the air gaps to serve as the isolation between thin-film storage transistors.

According to yet another embodiment of the present invention, the FeFETs of the present invention need not have a silicon channel region. Instead, the channel region may be formed using an 8.0 to 15.0 nm thick oxide semiconductor material. Suitable oxide semiconductor materials include (i) indium zinc oxide (InZnO, or "IZO") and (ii) indium gallium zinc oxide (InGaZnO, or "IGZO"). An IZO or IGZO channel region has the advantage of a high mobility for greater switching performance and without concern for electron or hole tunneling. For example, a 10.0 nm thick IZO film has an electron mobility of 40.6 $cm^2/V$, relative to an electron mobility of 5.6 $cm^2/V$ in an aluminum zirconium oxide (AZO) film of comparable thickness, and an electron mobility of 1.0-4.0 $cm^2/V$ in a polysilicon film with the same comparable thickness. Similarly, an IGZO film has an electron mobility of 10.0-100.0 $cm^2/V$, depending on the relative compositions of indium, gallium and zinc.

IZO and IGZO each can provide a junction-less transistor channel, and each may be deposited at a temperature lower than 400° C., even as low as 250° C. Thus, they may be used to provide the channel regions of storage transistors in a 3-dimensional memory array, regardless of whether such storage transistors are FeFETs (i.e., transistors with a polarizable layer) or a quasi-volatile (QV) storage transistors, such as those described in the Related Application. Modifying conventional storage transistors to use IZO or IGZO as channel material imposes only a relatively modest burden on the thermal budget. This is particularly advantageous in applications where planar support logic and analog circuitry is provided at the surface of the substrate beneath the 3-dimensional array of memory strings.

Furthermore, in a junction-less transistor, the source region and the drain region (i.e., bit line) are redundant, and may be replaced by a metal layer (e.g., Mo), thereby dispensing with the need for the n+ polysilicon layers to be strapped to metal strapping layers (e.g., metal layers 204*f* and 204*g*) in each active strip. These metal layers are referred to as the "metal common bit line" and the "metal source line." The gate stack may be substantially the same as that described above with respect to the FeFETs with the silicon channel (e.g., an silicon nitride interface dielectric layer, a polarization layer, and the gate electrode). As this alternative FeFET does not have a p/n junction, any leakage current from an FeFET in the programmed state is relatively small. Consequently, such an FeFET is particularly advantageous for high-temperature applications. Such an FeFET may also have a relatively shorter channel length, as there is no need for a margin in the channel length to allow for undesirable dopant diffusion during thermal cycles from the heavily-doped semiconductor common bit line and the common source line. The metal common bit line and metal common source line may each also have a reduced thickness. For example, in one embodiment, a 30.0-40.0 nm thick metal common bit line and a 30.0-40.0 nm thick metal common source line, a 30.0-40.0 nm thick IZO channel layer, and a 30.0 nm thick isolation layer (e.g., SiOC), for a relatively thinner total of 120.0-150.0 nm. The common source line and the common bit line may be formed by replacing a sacrificial material (e.g., carbon) by metal in a metal-replacement step carried out in a later portion of the fabrication process. These thinner layers reduce the aspect ratio for anisotropic etching of trenches through multiple layers of memory strings. Furthermore, the thinner layer of each string results in reduced parasitic capacitance C between local word-lines and the side walls of each string, which reduces the RC delays as well the power dissipation for the 3-dimensional memory array.

Programming, Erasing and Read

Figure 7A:
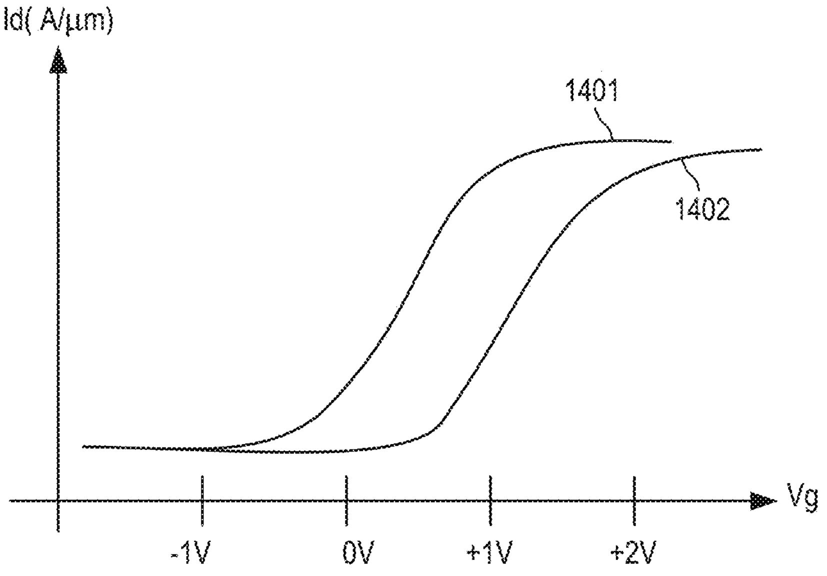
FIG. 7*a* shows hysteresis in the drain current ($I_d$) in response to an applied gate voltage ($V_g$) in a conventional FeFET.

An FeFET may be polarized to either (i) a conducting or "erased" state, or (ii) a non-conducting or "programmed" state. In an FeFET, its threshold voltage in the erased state is lower than its threshold voltage in the programmed state. FIG. 7*a* shows hysteresis in the drain current ($I_d$) in response to an applied gate voltage ($V_g$) in a conventional FeFET. (The conventional FeFET is formed at the planar surface of a monocrystalline semiconductor substrate and is not formed as a thin-film field effect transistor.) In FIG. 7*a*, waveform 1401 traces the drain current of the FeFET in its erased state, as the gate voltage increases from less than −1.0 volts to greater than 1.0 volts, and waveform 1402 traces the drain current of the FeFET in its programmed state, as the gate voltage decreases from greater than 1.0 volts to less than-1.0 volts. As seen in FIG. 7*a*, the conventional FeFET has a negative threshold voltage ($V_t$).

It is desirable in some applications, however, for an FeFET (e.g., a thin-film FeFET in a NOR memory string) to have a positive threshold voltage ($V_t$), such as around 0.5 volts, to prevent undesirable leakage current when it is subject to a disturb condition (e.g., as experienced by a neighboring non-selected FeFET in the NOR memory string) during a read operation.

Figure 7B:
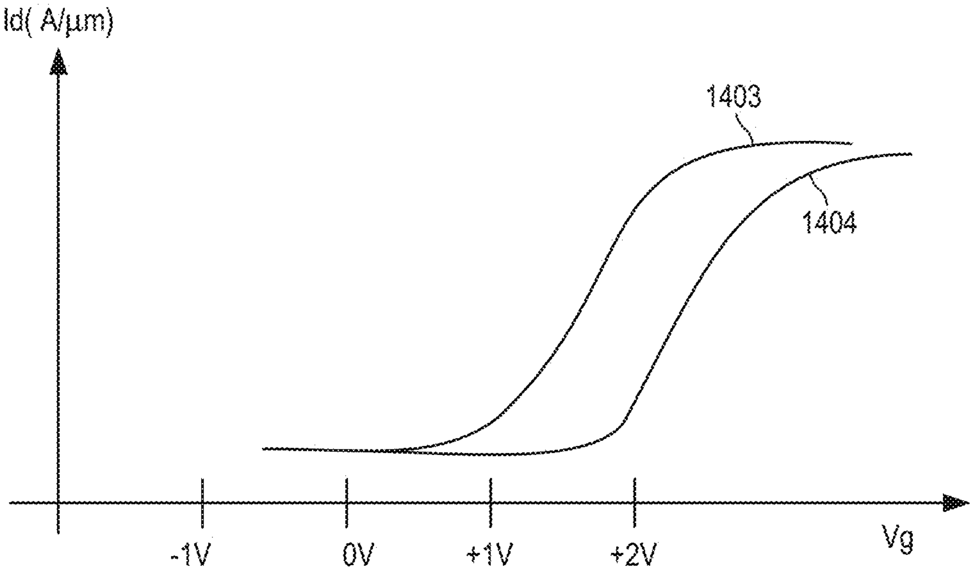
FIG. 7*b* shows a desirable hysteresis in the drain current ($I_d$) response to an applied gate voltage ($V_g$) in a thin-film FeFET in a NOR memory array, according to one embodiment of the present invention.

FIG. 7*b* shows a desirable hysteresis in the drain current ($I_d$) response to an applied gate voltage ($V_g$) in a thin-film FeFET in a NOR memory array, according to one embodiment of the present invention. In FIG. 7*b*, waveform 1403 traces drain current $I_d$ of the FeFET in its low-threshold voltage polarization state ("erased state", in this embodiment), as the gate voltage increases from less than −1.0 volts to greater than 1.0 volts, and waveform 1404 traces the drain current of the FeFET in its high-threshold voltage polarization state ("programmed" state, in this embodiment), as the gate voltage decreases from greater than 1.0 volts to less than −1.0 volts. As seen in FIG. 7*b*, the FeFET has a positive threshold voltage ($V_t$) of about 0.5 volts, and 1.0-2.5 volts threshold voltage difference ("window") between the polarization states. With a p polysilicon channel region (e.g., boron-doped), this window may be achieved by (i) increasing the boron dopant concentration in the channel region, (ii) providing a gate electrode that is formed out of a conductive material that has a high work function (e.g., tungsten (W), molybdenum (Mo), aluminum (Al), ruthenium (Ru), tantalum (Ta), or titanium (Ti), (iii) appropriate biasing in the common source region (see below), or (iv) the combination of (i), (ii) and (iii). In an embodiment in which the FeFET channel is an oxide semiconductor material (e.g. IGZO), the FeFET's low-threshold voltage state can be permanently shifted to a positive voltage by reducing the IGZO thickness or by a thermal anneal at a specific temperature.

Figure 7C:
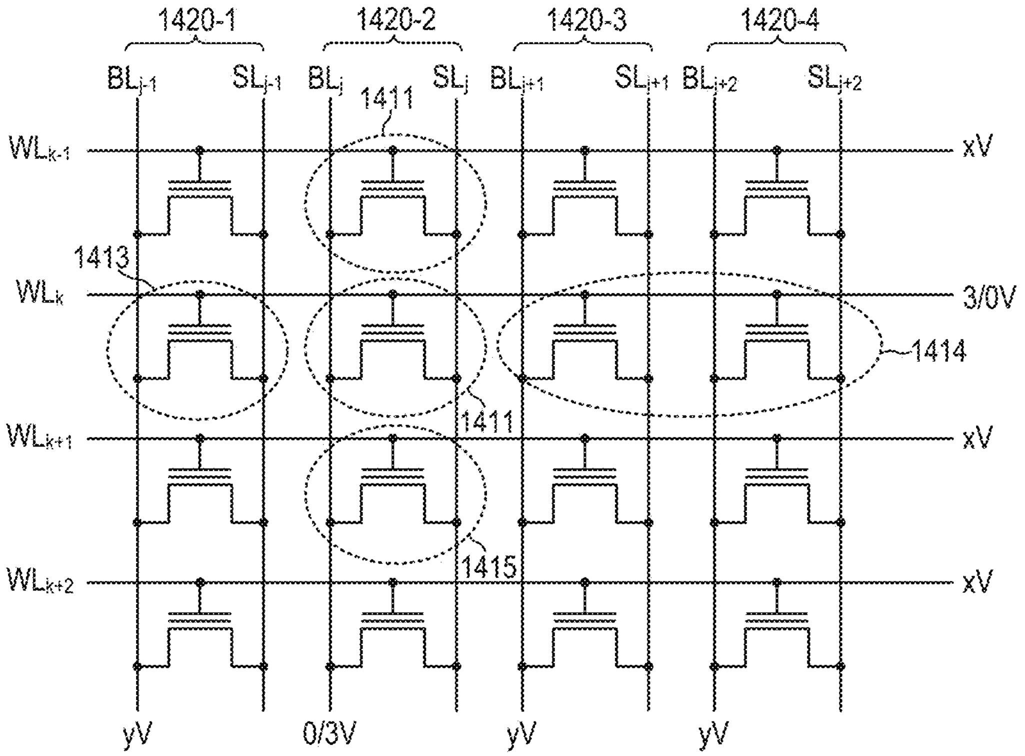
FIG. 7*c* shows a circuit schematic diagram of FeFETs in NOR memory strings 1420-1 to 1420-4, according to one embodiment of the present invention.

In an array of NOR memory strings, its FeFETs share a common bit line and a common source line. FeFETs in different NOR memory strings may share a common word line. For example, FeFETs at corresponding positions in NOR memory strings in the same active stack, or in NOR memory strings of adjacent active strips, may share a common word line. FIG. 7*c* shows a circuit schematic diagram of FeFETs in NOR memory strings 1420-1 to 1420-4, according to one embodiment of the present invention. In FIG. 7*c*, reference numerals 1411, 1412 and 1413 indicate the FeFETs that share common bit line $BL_j$ and common source line $SL_j$. Likewise, reference numerals 1412, 1413 and 1414 indicate FeFETs that share common word line $WL_k$. Even though not selected for a program, erase or read operation, an FeFET may experience a "disturb" condition affecting the stability of the threshold voltage state it is set. The disturb condition arises because the voltages on the FeFET's word line, source line or bit line may be subject to interference by signal changes in its vicinity as to affect a change in its polarization state during the program, erase or read operation. The signal changes are typically associated with the voltages imposed on the word line or bit line the FeFET shares with the selected FeFET.

To facilitate reference, in this detailed description, the term "affected FeFET" refers to a non-selected FeFET that shares a bit line or a word line with a selected FeFET of an intended program, erase or read operation. Any of the FeFETs indicated by reference numerals 1411, 1413, 1414 and 1415 is an affected FeFET. Likewise, the term "once-removed FeFET" refers to an FeFET that shares a word line or a bit line with an affected FeFET. All the unlabeled FeFETs shown in FIG. 7*b* are once-removed FeFETs.

Without mitigation, a disturb condition may cause an affected FeFET to move away from its polarization state and thereby loses the data value it is holding. To mitigate a disturb condition, the non-selected word line or the non-selected bit line of an affected FeFET may be biased to a predetermined voltage ("inhibit voltage") during the program, erase or read operation to counteract the effect of the voltage imposed on the word line or bit line it shares with the selected FeFET.

Table 1 provides exemplary bias voltages for the gate electrodes (or word lines), the source regions (or the common source lines), the drain regions (or the common bit lines) for the selected and affected FeFETs in a 3-dimensional array of NOR memory strings during erase, program and read operations, under a first disturb mitigation scheme ("V/2 scheme"; in which an affected FeFET is subject to one-half the "stress voltage" of a selected FeFET, during a program or erase operation). The stress voltage refers to the difference in voltage between the gate electrode and the bit line in an FeFET, during a program, erase or read operation. The bias voltages of Table 1 are based on the case when (i) an FeFET holding logic value '1' (i.e., in the low-threshold voltage polarization state, with a threshold voltage of approximately −0.25 volts), and (ii) an FeFET holding logic value '0' (i.e., in the high-threshold voltage polarization state, with a threshold voltage of approximately 0.6 volts).

TABLE 1

| Operation | Selected FeFET Gate/Word Line | Selected FeFET Source | Selected FeFET Drain/Bit Line | Non-selected FeFETs that Share a Bit Line or a Gate Electrode with the Selected FeFET Word Line | Non-selected FeFETs Source Line | Non-selected FeFETs Drain/Bit Line |
|---|---|---|---|---|---|---|
| Create Low-threshold Voltage Polarization State ('1') | 0.0 volts | 3.0 volts | 3.0 volts | 1.5 volts | 1.5 volts | 1.5 volts |
| Create High-threshold Voltage Polarization State ('0') | 3.0 volts | 0.0 volts | 0.0 volts | 1.5 volts | 1.5 volts | 1.5 volts |
| Read | 1.0 volts | 0.75 volts | 1.25 volts | 0.0 volts | 0.0 | 0.0 |

Under the V/2 scheme, during a program or erase operation, an affected FeFET (e.g., in FIG. 7*c*, any of the FeFETs indicated by reference numerals 1411, 1413, 1414 and 1415) experiences a stress voltage of −1.5 volts (write '1') or 1.5 volts (write '0'). The once-removed FeFETs each experience no stress voltage (i.e., a stress voltage of 0.0 volts).

In this example, as the threshold voltage of an FeFET in the '0' state is negative, during a read operation, the source voltage is set to 0.75 volts, or any suitable positive voltage sufficient to prevent conduction prior to the gate electrode achieving the read voltage. The higher bias voltage (the "boost") avoids both having to generate a negative voltage and having to provide corresponding additional isolation structures to protect the devices in the silicon substrate. During a read operation, to reduce read disturb under the V/2 scheme, the voltage difference between the word line and the common bit line or the common source line in the selected FeFET is maintained at less than the voltage that may change the polarization state of the selected FeFET.

Table 2 provides, during erase, program and read operations under a second disturb mitigation scheme ("V/3 scheme"), exemplary bias voltages for the gate electrodes (or word lines), the source regions (or the common source lines), the drain regions (or the common bit lines) of selected and affected FeFETs in a 3-dimensional array of NOR memory strings. Under the V/3 scheme, an affected FeFET is subject to one-third the stress voltage of a selected FeFET during a program or erase operation. The bias voltages of Table 2 are also based on the case when (i) an FeFET holding logic value '0' (i.e., in the "programmed" state) has a threshold voltage of approximately 0.6 volts, and (ii) an FeFET holding logic value '1' (i.e., in the "erased" state) has a threshold voltage of approximately-0.25 volts.

TABLE 2

| Operation | Selected FeFET Gate/Word Line | Selected FeFET Source | Selected FeFET Drain/Bit Line | Non-selected FeFETs that Share a Bit Line or a Gate Electrode with the Selected FeFET Word Line | Non-selected FeFETs Source Line | Non-selected FeFETs Drain/Bit Line |
|---|---|---|---|---|---|---|
| Create Low-threshold Voltage Polarization State ('1') | 0.0 volts | 3.0 volts | 3.0 volts | 2.0 volts | 1.0 volts | 1.0 volts |
| Create High-threshold Voltage Polarization State ('0') | 3.0 volts | 0.0 volts | 0.0 volts | 1.0 volts | 2.0 volts | 2.0 volts |
| Read | 1.0 volts | 0.75 volts | 1.25 volts | 0.0 volts | 0.0 volts | 0.0 volts |

Under the V/3 scheme, during a program or erase operation, an affected FeFET experiences a stress voltage of 1.0 volts (write '0') or −1.0 volts (write '1'). A once-removed FeFETs experiences a stress voltage of −1.0 volts (write '0') or 1.0 volts (write '1'). Thus, the V/3 scheme provides a lesser stress voltage in the affected FeFETs. However, because a voltage difference of 1.0 volt (write '1') or −1.0 volt (write '0') exists between the non-selected bit lines and the non-selected word lines, which accounts for the charge separation in the parasitic capacitors between the non-selected word lines and the non-selected bit lines, the V/3 scheme has a greater power dissipation than the V/2 scheme during a program, erase or read operation.

Under either the V/3 scheme or the V/2 scheme, the stress voltage for an affected FeFET sharing a word line with the selected FeFET is 1.0 volts during a read operation, which is equal to the lower stress voltage under the V/3 scheme for a program or erase operation. As a program or erase operation is expected to have a significantly longer duration (e.g., 100.0 ns) than a read operation (e.g., 10.0 ns), limiting the overall effects of the disturb conditions may be achieved by adequately addressing the disturb conditions during the program and erase operations.

Even though the data retention time of an FeFET of the present invention is expected to be significantly longer (e.g., tens of days to tens of years) than the data retention time of a quasi-volatile (QV) storage transistor (e.g., any of those transistors described in the Related Application), the methods for maintaining data integrity beyond the data retention time for QV storage transistors are also applicable to maintaining data retention in the FeFETs of the NOR memory strings of the present invention. For example, Provisional Application VII discloses one or more methods for reducing the effects of disturb conditions by refreshing a subset of the storage transistors that share a word line with a selected storage transistor during a program or erase operation ("refresh in-place"). Refresh in-place takes advantage of the activated selected word line in the program or erase operation to write back the data values in the storage transistors in the affected subset.

In some mobile applications, the device's battery life is shorter than the data retention time, periodic refresh may be triggered when the battery is detected to be connected to a charger. In this manner, one can be assured that the data in the memory arrays in a fully charged device will persist until the next charge cycle. In addition, refresh operation is initiated when the time since the last refresh is within a threshold (e.g., 10% of the data retention time).

When the body region of an FeFET in a NOR memory string is floating, its programming speed may be slower than its erase speed. In such a condition, the gate-induced drain leakage (GIDL) effect may be harnessed to improve the programming speed. The GIDL effect may be activated by creating a voltage difference (e.g., 0.5 to 2.0 volts) between the common bit line and the common source line (Vas) during programming, for example. This voltage difference may be achieved by first momentarily pre-charging the common source line to a predetermined source line voltage through the common bit line, and then setting the common bit line to its target voltage, as disclosed in the Related Application.

Figure 8:
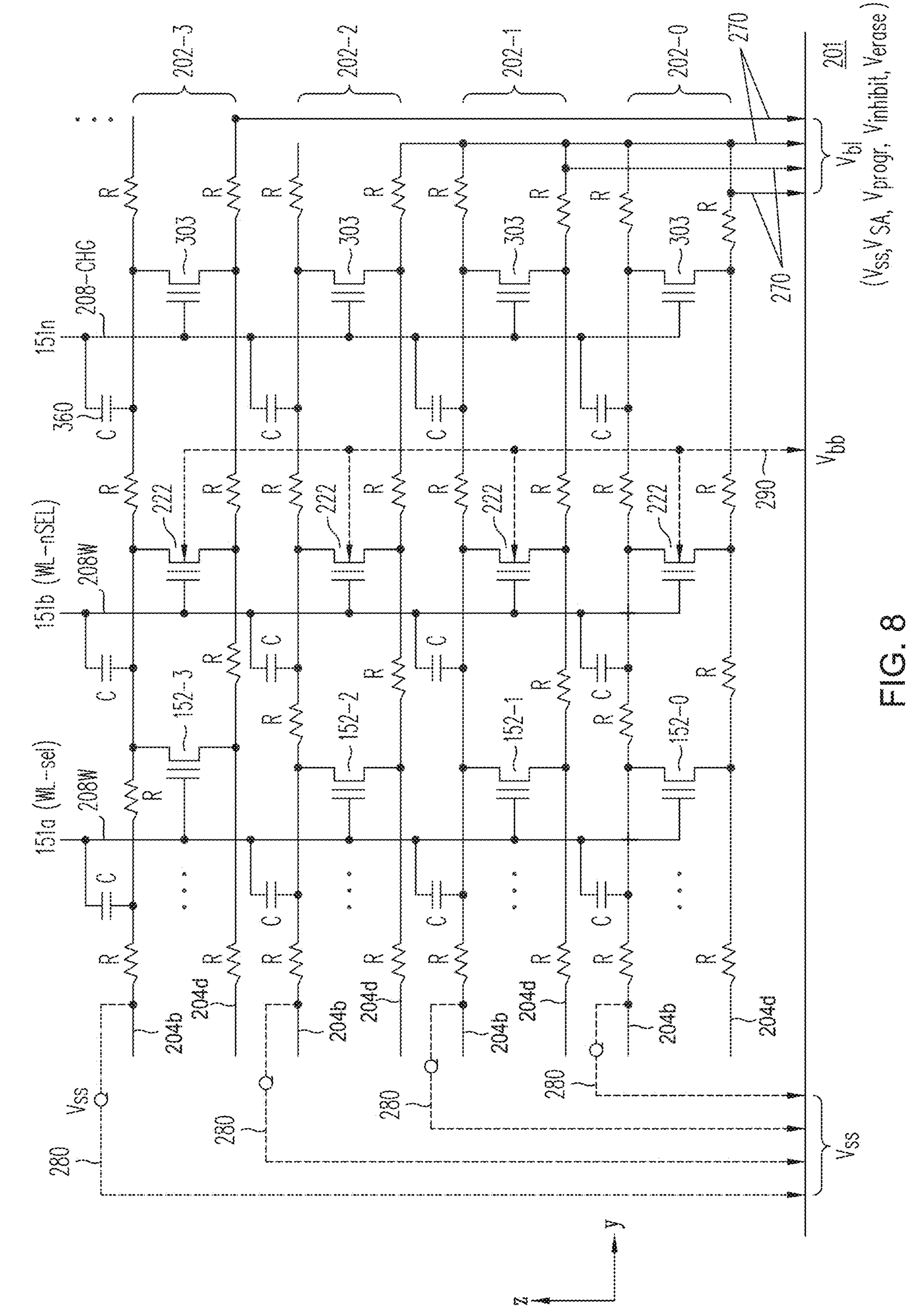
FIG. 8 illustrates the methods and circuit elements used for setting source voltage $V_{ss}$ in $n^+$ silicon layers 204*d*; specifically, source voltage $V_{ss}$ may be set through hard-wire decoded source line connections 280 (dashed line) or alternatively, by activating pre-charge FeFETs 303 and decoded bit line connections 270, to any one of voltage sources for bit line voltages $V_{ss}$, $V_{bl}$, $V_{pgm}$, $V_{inhibit}$ and $V_{erase}$.

FIG. 8 illustrates the methods and circuit elements used for setting source voltage $V_{ss}$ in $n^+$ silicon layer 204*b*. Specifically, source voltage $V_{ss}$ may be set through hard-wired decoded source line connections 280 (shown in dashed line) or alternatively, by activating pre-charge thin film transistors 300 (which, preferably, is not implemented by a FeFET) and decoded bit line connections 270 to any one of bit line voltages $V_{ss}$, $V_{bl}$, $V_{pgm}$, $V_{inhibit}$ and $V_{erase}$. Alternatively, source reference voltage $V_{ss}$ may be accessed through a metal or $n^+$-doped polysilicon conductor connecting from the top of the memory array through staircase vias. Each of the conductors in hard-wired connections 280 may be independently connected, so that the source voltages for different planes or within planes need not be the same. In some embodiments, it is advantageous to dispense with the hard-wired source voltage $V_{ss}$ connections, by taking advantage of a virtual voltage source in the intrinsic parasitic capacitance of the NOR memory string.

The present invention takes advantage of the cumulative intrinsic parasitic capacitance that is distributed along each NOR memory string to increase the number of FeFETs that can be programmed, read or erased in parallel in a single operation (though, preferably, on separate strings), while also significantly reducing the operating power dissipation. As shown in FIG. 8, local parasitic capacitor 360 (contributing to a cumulative capacitance C) exists at each overlap between a local word line (as one plate) and the $n^+/p/n^+$ active layer (as the other plate). Each local parasitic capacitor may be approximately 0.005 femtofarads (each femtofarad is $1\times10^{-15}$ farad), too small to be of much use for temporary storage of charge. However, since there may be a thousand or more FeFETs contributing capacitance from one or both sides of an active strip, the total distributed capacitance C of $n^+$ silicon layer 204*b* (the common source line) and $n^+$ silicon layer 204*d* (the common bit line) in a long NOR memory string can be in the range of ~10.0 to 100.0 femtofarads. This is also roughly the capacitance at sensing circuitry connected through connections 270 (e.g., voltage source $V_{bl}$).

During a program or erase operation in a selected FeFET, and their respective inhibit operations on a non-selected FeFETs, both $n^+$ silicon layers 204*d* and 204*b* are preferably held at the same voltage, therefore the leakage current between $n^+$ silicon layers 204*d* and 204*b* is insignificant. During a program or erase operation, charge leakage from cumulative capacitance C flows primarily to the substrate through the substrate selection circuitry, which has very little transistor leakage, as it is formed in single crystal or epitaxial silicon. Nevertheless, even a 100-microsecond polarization state retention time is sufficient to complete the sub-100 nanosecond read operation or the sub-100 microsecond program operation (see below) of the selected FeFET on the NOR memory string.

An FeFET in a NOR memory string, unlike a DRAM cell, may operate as a non-volatile memory transistor, so that, even if parasitic capacitor C of the NOR memory string is completely discharged, the information stored in the selected FeFET remains intact in the ferroelectric storage material (i.e., polarization layer 264). In a DRAM cell, however, the information would be lost without frequent refreshes. Accordingly, distributed capacitance C of a NOR memory string of the present invention is used to temporarily hold the pre-charge voltage on $n^+$ silicon layers 204*d* and 204*b* at one of voltages $V_{ss}$, $V_{bl}$, $V_{progr}$, $V_{inhibit}$, or $V_{erase}$, and is not used to store actual data for any of the FeFETs in the NOR memory string. Pre-charge transistor 303 of FIG. 3*a*, controlled by word line 151*n*(i.e., word line 208-CHG), is activated momentarily immediately preceding each read, program, or erase operation to transfer voltage $V_{bl}$ (e.g., through connections 270) from the substrate circuitry (not shown) to $n^+$ silicon layer 204*b*. For example, under the V/3 scheme described above, voltage $V_{bl}$ can be set at 0.75 V to pre-charge $n^+$ silicon layer 204*b* to a virtual ground voltage ~0.75 V during a read operation, or to pre-charge both $n^+$ silicon layers 204*d* and 204*b* to either 1.0 Volts and 2.0 volts in non-selected bit lines involved in refresh in-place during a program or erase operation.

The value of cumulative capacitance C may be increased by lengthening the NOR string to accommodate the thousands more FeFETs along each side of the active strip, correspondingly increasing the retention time of pre-charge voltage $V_{ss}$ on $n^+$ silicon layer 204*b*. However, a longer NOR memory string suffers from an increased line resistance as well as higher leakage currents between $n^+$ silicon layer 204*d* and $n^+$ silicon layer 204*b*. Such leakage currents may interfere with the sensed current when reading the one FeFET being addressed with all other FeFETs of the NOR memory string in their "off" (and somewhat leaky) states. Also, the potentially longer time it takes to pre-charge a larger capacitor during a read operation can conflict with the desirability for a low read latency (i.e., a fast read access time). To speed up the pre-charging of the cumulative capacitance C of a long NOR memory string, pre-charge transistors—which may be constructed separately from the memory FeFETs—may be provided spaced apart along either side of the active strip (e.g., once every 128, 256 or more FeFETs).

Because the variable-threshold FeFETs in a long NOR memory string are connected in parallel, the read operating condition for the NOR memory string should preferably ensure that all FeFETs along both edges of an active strip operate in enhancement mode (i.e., they each have a positive threshold voltage, as applied between control gate 151*n* and voltage $V_{ss}$ at source 204*d*). With all FeFETs being in enhancement mode, the leakage current between $n^+$ silicon layer 204*d* and $n^+$ silicon layer 204*b* of the active strip is suppressed when all control gates on both sides of the active strip are held at, or below $V_{ss}$ ~0V. This enhancement threshold voltage can be achieved by providing polysilicon channel layer 250 with a suitable dopant concentration (e.g., a boron concentration between $1\times10^{16}$ and $1\times10^{18}$ per $cm^3$ or higher, which results in an intrinsic FeFET threshold voltage of between ~0.5 V and ~1 V). Alternatively, to substantially shut off a source-drain leakage current in any of the FeFETs along a NOR memory string that is programmed into a depletion threshold voltage state, the common source region and the common drain region may be boosted into a "virtual enhancement" threshold voltage state by pre-charging the common source line and the common bit line of the NOR memory string to voltages $V_{ss}$ and $V_{bl}$, respectively. This biasing condition substantially shuts off source-drain conduction currents in the FeFETs of the same NOR memory string. The "virtual enhancement" mode of operation is advantageous because it allows the same voltage polarity to be applied to source, drain and gate terminals for all program, erase and read operations of the FeFETs in the NOR memory string. Furthermore, implementation of the "virtual enhancement" mode of operation provides the flexibility of not having to rely on a factory-based operation to apply a fixed, potentially sub-optimal dopant concentration to the polysilicon channel of the FeFET.

Quasi-Volatile Nor Memory Strings

Endurance is a measure of a storage transistor's performance degradation after some number of write-erase cycles. Endurance of less than around $10^{12}$ cycles is considered too low for some applications. Greater endurance in an FeFET of the present invention may be achieved by, for example, increasing the dielectric constant k in the interface dielectric layer, typically a silicon oxide-nitride or silicon nitride film of thickness 0.1 to 3.0 nm. The interface dielectric layer may also be kept thin (i.e., even less than 0.1 nm), or eliminated altogether or replaced with another dielectric film of a higher dielectric constant k significantly greater than 4 (e.g., aluminum oxide).

A FeFET having a low data retention time (i.e., less than, for example, one year), may be referred to as "quasi-volatile FeFET". Such an FeFET may require refreshes to restore the weakened polarization. Because the quasi-volatile FeFET of the present invention provides a DRAM-like fast read access time with a low latency, the resulting quasi-volatile NOR memory strings may be suitable for use in some applications that currently require DRAMs. The advantages of quasi-volatile FeFETs in NOR memory strings, arranged in a planar structure or in 3-dimensional memory arrays, over DRAMs include: (i) a much lower cost-per-bit figure of merit because DRAMs cannot readily be built in 3-dimensional blocks, and (ii) a much lower power dissipation, as the refresh cycles need only be run approximately once every tens of minutes or once every few days, as compared to every ~64 milliseconds, as required in state-of-the-art DRAM technology. 3-dimensional memory arrays of FeFETs may also have advantages over the 3-dimensional NOR memory arrays of the Related Application ("3-D QV NOR memory strings"). For example, (i) FeFETs can be fabricated at significantly lower thermal cycles (e.g., at 400.0-500.0° C.) than the thermal cycle for fabricating direct tunneling, charge-trapping thin-film transistors (e.g. at 600.0-860.0° C.), and (ii) the erase and programming polarization states of some FeFETs can be switched at significantly lower voltages (e.g., less than 4.0 volts), as compared to the 6.0-8.0 volts required to inject electrons (i.e., to program) or eject trapped electrons (i.e., to erase) in 3-dimensional QV NOR memory strings.

The NOR memory string of FeFETs in the present invention appropriately adopt the program/read/erase conditions to incorporate the periodic data refreshes. For example, because each NOR memory string of quasi-volatile FeFETs is frequently read-refreshed or program-refreshed, it is not necessary to "hard-program" such FeFETs to open a large threshold voltage window between the '0' and '1' states, as compared to non-volatile FeFETs where a minimum 10-year data retention time may be required. Quasi-non-volatile threshold voltage window may be as narrow as 0.2 volts to 1.5 volts. The reduced threshold voltage window allows such FeFETs to be programmed and erased at lower programming/erase voltages and by shorter-duration programming pulses, which reduce the stress voltage, thereby extending endurance. Periodic refresh operations can be performed in a background mode so as to minimize collision with erase/program/read operations. During such a refresh operation, it is possible for the system to check the health of each FeFET, to restore its full window of operation or altogether retire the FeFET by replacing it with a redundant fresh FeFET.

Source-Drain Leakage in Long Nor Memory Strings

In long NOR memory strings, the current of the one accessed FeFET in a read operation competes with the cumulative subthreshold leakage currents from the thousand or more parallel non-selected FeFETs. Similarly, pre-charged strip capacitor C has to contend with charge leakage not just of one transistor (as in a DRAM circuit) but the charge leakage through the thousand or more transistors in the NOR memory string. That charge leakage reduces substantially the charge retention time on C to perhaps a few hundred microseconds, potentially requiring counter measures to reduce or neutralize such leakage. However, the leakage from a thousand or so transistors is only significant during read operations. During program, program-inhibit or erase operations, source layer 204*b* and bit line layer 204*d* are preferably held at the same voltage, therefore transistor leakage between the two layers is insignificant (the leakage of charge from capacitor C during program, program-inhibit or erase operations is primarily leaked to the substrate through the substrate selection circuitry, which is formed in single-crystal or epitaxial silicon where transistor leakage is very small). For a read operation, even a relatively short 100-microsecond retention time of charge on the source and bit line capacitors may be sufficient time to complete the sub-100 nanosecond read operation (see below) of the FeFETs of the present invention. One difference between a FeFET in a NOR memory string of the present invention and a DRAM cell is that, relative to the latter, the former is a non-volatile memory transistor for DRAM suitable applications, so that even if parasitic capacitor C is completely discharged, the information stored in the selected FeFET is not lost from the ferroelectric or polarizable element, unlike a DRAM cell where the stored information is lost unless refreshed. Capacitor C is used solely to temporarily hold the pre-charge voltage on $n^+$ silicon layers 204*d* and 204*b* at one of voltages $V_{ss}$, $V_{bl}$, $V_{progr}$, $V_{inhibit}$, or $V_{erase}$; capacitor C is not used to store actual data for any of the non-volatile FeFETs in the string. Pre-charge transistor 303, controlled by word line 151*n* (208-CHG)(FIG. 8) is activated momentarily immediately preceding read, program, program-inhibit or erase operations to transfer through connections 270 the voltage $V_{bl}$ from the substrate circuitry (not shown) to capacitor C of $n^+$ silicon layer 204*d*. For example, voltage $V_{bl}$ can be set at ~0V to pre-charge $n^+$ silicon layer 204*b* to a virtual ground voltage during read, or to pre-charge both $n^+$ silicon layers 204*d* and 204*b* to their programming or erase bias voltages during program inhibit. The value of cumulative capacitors C may be increased by lengthening the active string to accommodate thousands more FeFETs along each side of the string, correspondingly increasing the retention time of pre-charge voltage $V_{ss}$ on $n^+$ silicon layer 204*d*. To speed up the pre-charging of the capacitance C of a long active strip, several pre-charge thin-film transistor 303 may be provided spaced apart along either side of the active strip (e.g., once every 128, 256 or more FeFETs).

Revolving Reference Nor Memory String Address Locations to Extend Cycle Endurance.

In applications requiring a large number of write/erase operations, the threshold-voltage window of operation for the FeFETs in the NOR memory strings may drift with cycling, away from the threshold-voltage window that is programmed into the FeFETs of the reference NOR memory strings at the device's beginning of life. The growing discrepancy between FeFETs on the reference NOR memory strings and FeFETs on the addressed memory NOR memory strings over time, if left unattended, can be detrimental to data integrity. To overcome this drift, reference NOR memory strings in a block need not always be mapped to the same physical address and need not be permanently programmed for the entire life of the device. Since the programmable reference NOR memory strings are practically identical to the memory NOR memory strings sharing the same plane in a block, reference NOR memory strings need not be dedicated for that purpose in any memory array block. In fact, any one of the NOR memory strings can be set aside as a programmable reference NOR memory string. In fact, the physical address locations of the programmable reference NOR memory strings can be rotated periodically (e.g., changed once every 100 times the block is erased) among the sea of memory NOR memory strings, so as to level out the performance degradation of memory NOR memory strings and reference NOR memory strings as a result of extensive program/erase cycles. For example, the reference NOR memory strings may be rotated among the 8 planes (e.g., the reference NOR memory strings may be mapped in a round-robin fashion to one of the 8 planes of an active stack, kept track by a 3-bit counter).

According to the current invention, any NOR memory string can be rotated periodically to be designated as a programmable reference NOR memory string, and its address location may be stored inside or outside the addressed block. The stored address may be retrieved by the system controller when reading the NOR memory string. Under this scheme, rotation of reference NOR memory strings can be done either randomly (e.g., using a random number generator to designate new addresses), or systematically among any of the active memory NOR memory strings. Programming of newly designated reference NOR memory strings can be done as part of the erase sequence when all FeFETs on a slice or a block may be erased together, to be followed by setting anew the reference voltages on the newly designated set of reference NOR memory strings. In this manner, all active memory NOR memory strings and all reference NOR memory strings in a block drift statistically more or less in tandem through extensive cycling.

Programmable Reference Slices.

Figure 9A:
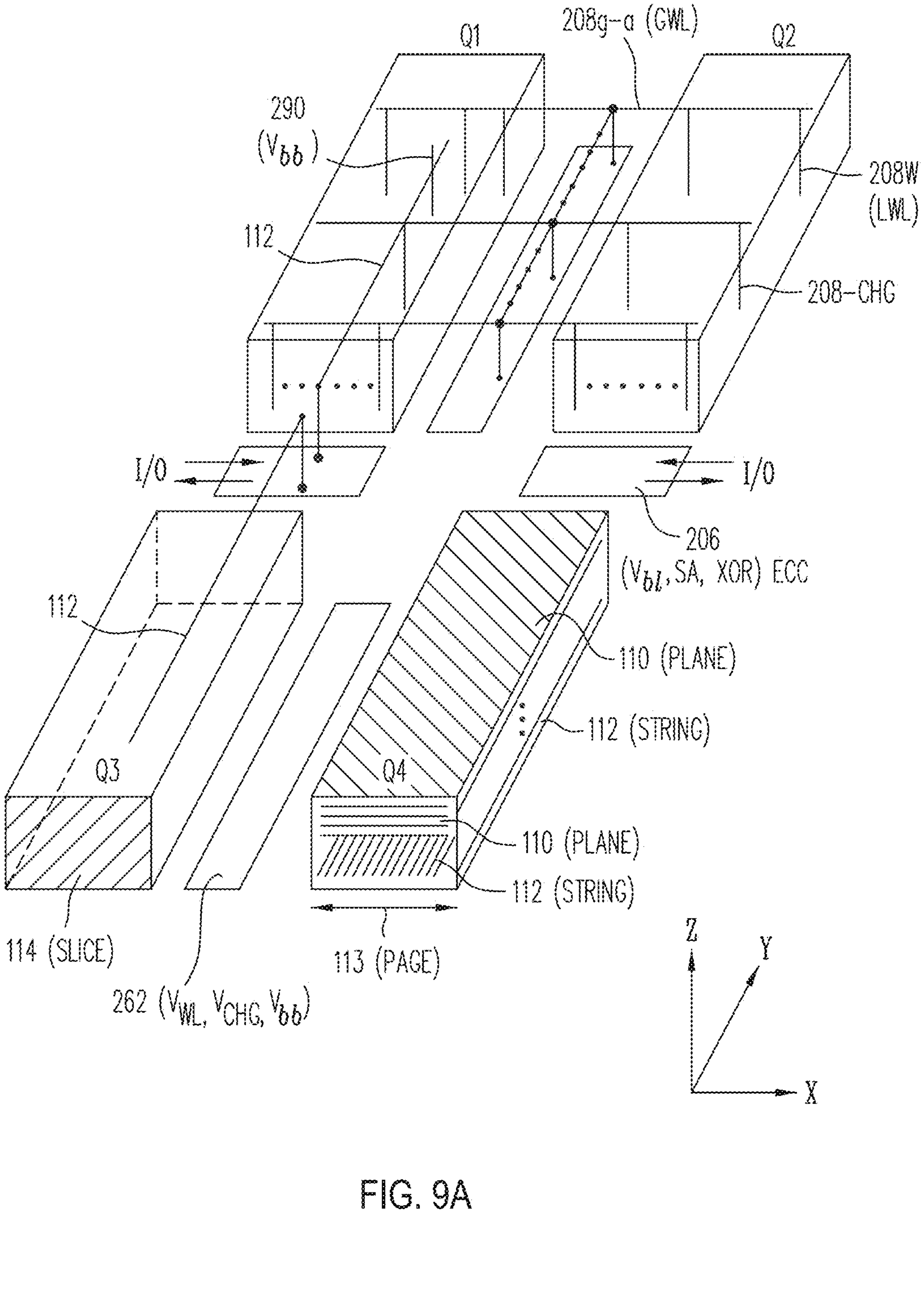
FIG. 9*a* shows semiconductor structure 600, which is a three-dimensional representation of an array of NOR memory strings organized into quadrants Q1-Q4; in each quadrant, (i) numerous NOR memory strings are each formed in an active strip extended along the Y-direction (e.g., NOR memory string 112), (ii) pages extending along the X-direction (e.g., page 113), each bit in the page corresponds to an FeFET from each NOR memory string at a corresponding Y-position, the NOR memory strings in the page being of the same corresponding Z-position (i.e., of the same active layer); (iii) slices extending in both the X- and Z-directions (e.g., slice 114), with the bits in each slice provided by the pages of the same corresponding Y-position, one page from each of the planes, and (iv) planes extending along both the X- and Y-directions (e.g., plane 110), the bits in each plane being provided by all pages at a given Z-position (i.e., formed out of the same active layer).

In some embodiments of the present invention, a block may be partitioned into four equal-size quadrants, as illustrated in FIG. 9*a*. FIGS. 9*a* show semiconductor structure 600, which is a three-dimensional representation of a NOR memory string array of FeFETs organized into quadrants Q1-Q4. In each quadrant, (i) numerous NOR memory strings are each formed in active strips extending along the Y-direction (e.g., NOR memory string 112), (ii) pages extending along the X-direction (e.g., page 113), each page consisting of one FeFET from each NOR memory string at a corresponding Y-position, the NOR memory strings in the page being of the same corresponding Z-position (i.e., of the same active layer); (iii) slices extending in both the X- and Z-directions (e.g., slice 114), with each slice consisting of the pages of the same corresponding Y-position, one page from each of the planes, and (iv) planes extending along both the X- and Y-directions (e.g., plane 110), each plane consisting of all pages at a given Z-position (i.e., of the same active layer).

Figure 9B:
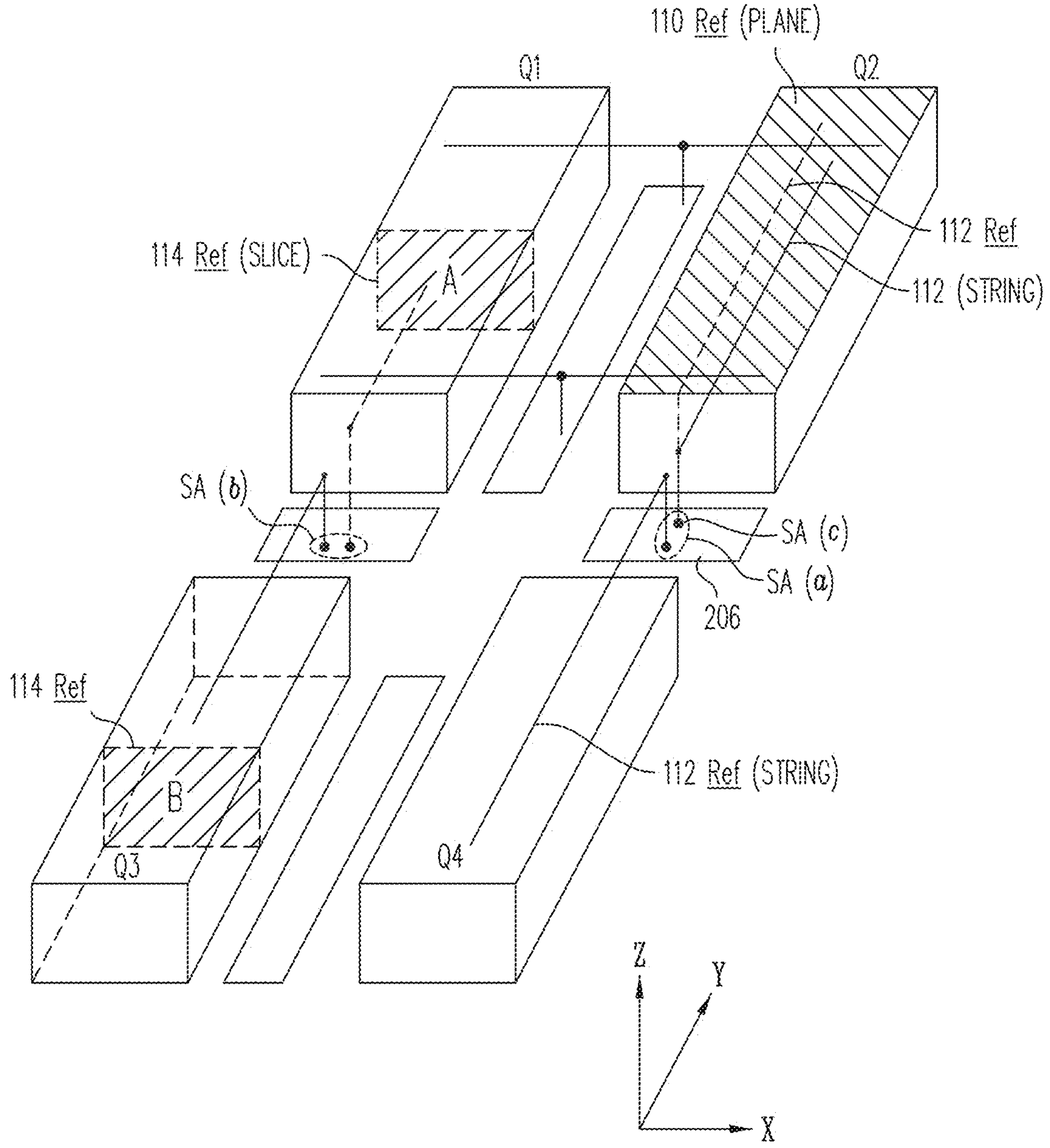
FIG. 9*b* shows structure 600 of FIG. 9*a*, showing FeFETs in programmable reference string 112-Ref in quadrant Q4 and FeFETs in NOR memory string 112 in quadrant Q2 coupled to sense amplifiers SA (a), Q2 and Q4 being "mirror image quadrants"

FIG. 9*b* shows structure 600 of FIG. 9*a*, showing FeFETs in programmable reference NOR memory string 112-Ref in quadrant Q4 and FeFETs in NOR memory string 112 in quadrant Q2 coupled to sense amplifiers SA (a), Q2 and Q4 being "mirror image quadrants." FIG. 9*b* also shows (i) programmable reference slice 114-Ref (indicated by area B) in quadrant Q3 similarly providing corresponding reference FeFETs for slice 114 in mirror image quadrant Q1, sharing sense amplifiers SA (b), and (ii) programmable reference plane 110-Ref in quadrant Q2 providing corresponding reference FeFETs to plane 110 in mirror image quadrant Q1, sharing sense amplifiers SA (c), and also providing corresponding reference FeFETs for NOR memory strings in the same quadrant (e.g., NOR memory string 112).

As shown in FIG. 9*b*, programmable reference NOR memory strings 112Ref of FeFETs may be provided in each quadrant to provide reference voltages for the NOR memory strings of FeFETs on the same plane in the same quadrant, in the manner already discussed above. Alternatively, programmable reference slices (e.g., reference slice 114Ref) are provided on mirror-image quadrants for corresponding memory slices. For example, when reading a memory slice in quadrant Q1, programmed reference slice 114Ref (area B) in quadrant Q3 is simultaneously presented to sense amplifiers 206 that are shared between quadrants Q1 and Q3. Similarly, when reading a memory slice in quadrant Q3, reference slice 114Ref (area A) of quadrant Q1 is presented to the shared sense amplifiers 206. There can be more than one reference slice distributed along the length of NOR memory strings 112 to partially accommodate mismatched in RC delay between the slice being read and its reference slice. Alternatively, the system controller can calculate and apply a time delay between the global word line of the addressed slice and that of the reference slice, based on their respective physical locations along their respective NOR memory strings. Where the number of planes is large (e.g., 8 or more planes), one or more planes can be added at the top of the block to serve either as a redundant plane (i.e., to substitute for any defective plane) in the quadrant, or as programmable reference pages, providing reference threshold voltages for the addressed pages sharing the same global word line conductor 208*g-a*. The sense amplifier at the end of each NOR memory string receives the read signal from the addressed page at the same time as it receives the signal from the reference page at the top of the block, since both pages are activated by the same global word line.

In one embodiment, each memory block consists of two halves, e.g., quadrants Q1 and Q2 constitute an "upper half" and quadrants Q3 and Q4 constitute a "lower half." In this example, each quadrant has 16 planes, 4096 (4K) NOR memory strings in each plane, and 1024 (1K) FeFETs in each NOR memory string. It is customary to use the unit "K" which is 1024. Adjacent quadrants Q1 and Q2 share 1K global word lines (e.g., global word line 208*g-a*) driving 2048 (2K) local word lines 208W per quadrant (i.e., one local word line for each pair of FeFETs from two adjacent NOR memory strings). 4K FeFETs from quadrant Q1 and 4K FeFETs from quadrant Q2 form an 8K-bit page of FeFETs. 16 pages form a 128K-bit slice, and 1K slices are provided in a half-block, thus providing 256 Mbits of total storage per block. (Here, 1 Mbits is 1K×1 Kbits.) The 4K strings in each plane of quadrants Q2 and Q4 share substrate circuitry 206, including voltage sources for voltage $V_{bl}$ and sense amplifiers (SA). Also included in each quadrant are redundant NOR memory strings that are used as spares to replace faulty NOR memory strings, as well as to store quadrant parameters such as program/erase cycle count, quadrant defect map and quadrant ECC. Such system data are accessible to a system controller. For blocks with high plane counts, it may be desirable to add one or more planes to each block as spares for replacing a defective plane.

Programmable Reference Planes, Spare Planes

High-capacity storage systems based on 3-dimensional arrays of FeFETs organized as NOR memory strings of the present invention require a high-speed system controller for error-free massively parallel erase and erase-inhibit, program and program-inhibit, and read operations that may span many "chips" including many memory blocks. In fact, in some applications, a hierarchy of controllers (e.g., organized as a tree structure) may be provided, with the controllers at the leaf level each managing the operations of multiple chips, each containing a large number of tiles. Controllers at a higher level in the hierarchy (i.e., closer to the root or roots) control controllers closer to the leaves. At the chip level, each tile is provided logic functions implemented in the memory circuits dedicated to assist the controllers in managing operations carried out by the tiles of the chip. Also, each memory circuit stores system parameters and information related to the files stored in the memory circuit. Such system information is typically accessible to the system controller, but not accessible by the user. It is advantageous for the system controller to quickly read the memory circuit-related information. A block under this organization (i.e., 256 Megabits) provides 2K slices. A terabit memory circuit may be provided by including 4K blocks.

As shown in FIGS. 9*a* and 9*b*, the FeFETs in quadrants Q2 and Q4 share voltage source $V_{bl}$, sense amplifiers SA, data registers, XOR gates and input/output (I/O) terminals to and from substrate circuitry 206. According to one organization, FIG. 9*a* shows NOR memory strings 112, quarter-planes 110, half-slices 114, and half-pages 113. Also shown are optional pillars 290 supplying back-bias voltage $V_{bb}$ from the substrate. FIG. 9*b* shows examples of locations of reference strings 112 (Ref), reference slices 114 (Ref) and reference planes 110 (Ref). In the case of reference strings, reference string 112 (Ref) of quadrant Q4 can serve as a reference string to NOR memory string 112 on the same plane in quadrant Q2, the two NOR memory strings being presented to a shared differential sense amplifier SA in circuitry 206. Similarly, reference slice 114 Ref (area A) in quadrant Q1 can serve as reference for a slice in quadrant Q3, while a reference slice B in quadrant Q1 can serve as reference for slices in quadrant Q3, again sharing differential sense amplifiers SA provided between quadrants Q1 and Q3. Global word lines 208*g-a* are connected to local word lines 208W and local pre-charge word lines 208-CHG. Substrate circuitry and input/output channels 206 are shared between FeFETs in quadrants Q2 and Q4. Under this arrangement, their physical locations allow cutting by half the resistance and capacitance of NOR memory strings 112. Similarly, global word line drivers 262 are shared between quadrants Q1 and Q2 to cut by half the resistance and capacitance of the global word lines, and pillars 290 (optional) connect p layers of NOR memory strings 112 to the substrate voltage.

Since silicon real estate on an integrated circuit is a valuable resource, rather than adding reference strings or reference pages to each plane, it may be advantageous to have some or all reference strings or reference pages provided in one or more additional planes. The additional plane or planes consume minimal additional silicon real-estate and the reference plane has the advantage that the addressed global word line 208*g-a* accesses a reference page at the same time it accesses an addressed page on any of the planes at the same address location along the active strings in the same quadrant. For example, in FIG. 9*b*, reference string 112Ref, which is shown as dashed line in quadrant Q2, resides in reference plane 110Ref in this example. NOR memory string 112Ref tracks memory NOR memory string 112 being selected for read in the same quadrant and the read signals from the two NOR memory strings reach the differential sense amplifiers SA for that quadrant practically at the same time. Although reference plane 110Ref is shown in FIG. 9*b* as being provided in the top plane, any plane in the quadrant can be designated a reference plane. In fact, it is not necessary for every NOR memory string on the reference plane to be a reference string: e.g., every one in eight NOR memory strings can be designated as a reference NOR memory string that is shared by eight NOR memory strings in other planes. The remainder of NOR memory strings in the reference plane may serve as spare strings to substitute for defective strings on the other planes in the block.

Figure 9C:
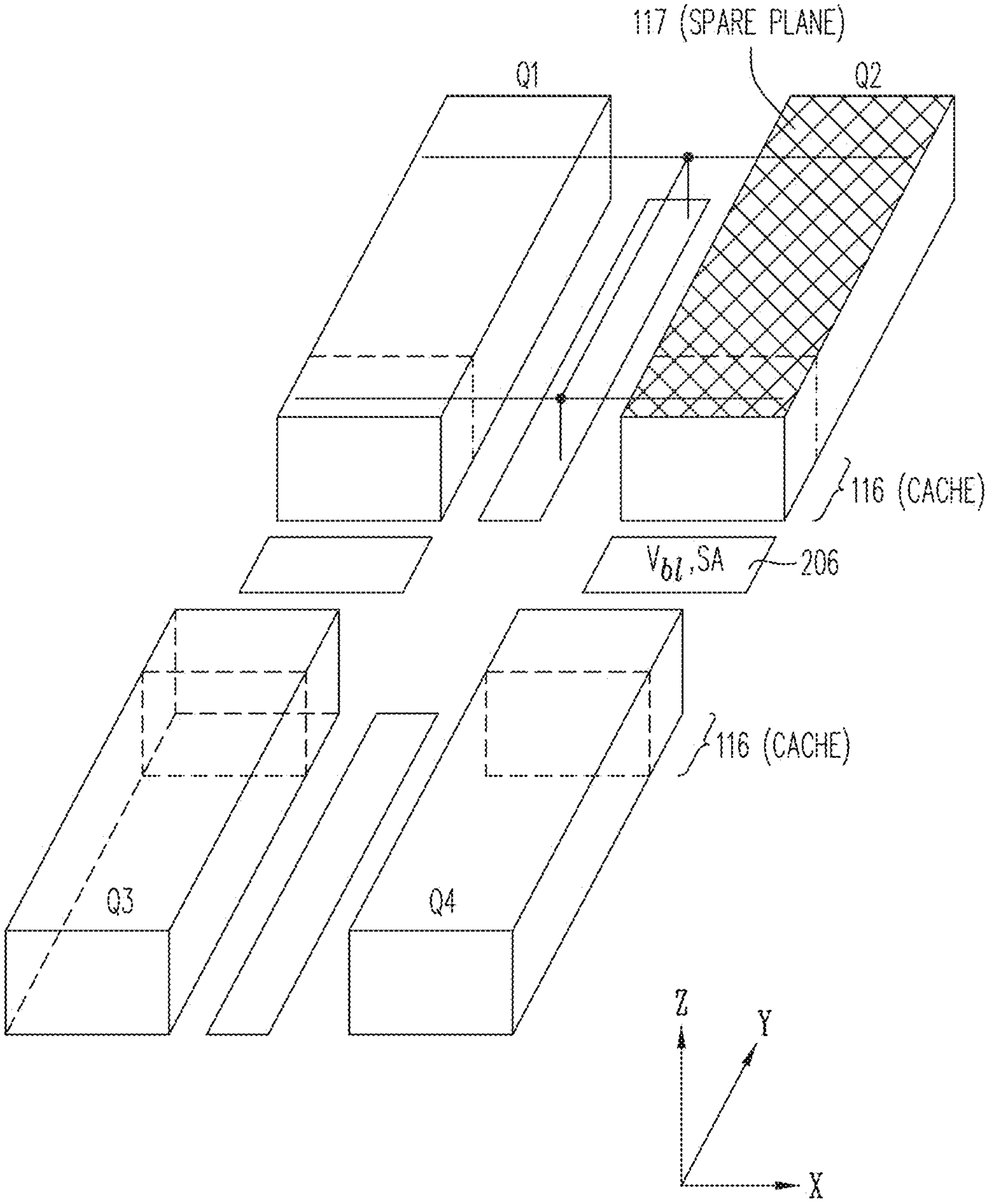
FIG. 9*c* shows structure 600 of FIG. 9*a*, showing slices 116 being used as a high speed cache because of their close proximity to their sense amplifiers and voltage sources 206.

Alternatively, one or more additional planes (e.g., plane 117 in FIG. 9*c*) can be set aside to serve as spare memory resources to substitute for defective NOR memory strings, defective pages or defective planes in the same quadrant.

As related to electrically programmable reference strings, slices, pages or planes, once set in their designated threshold voltage states, care must be exercised at all times to inhibit their inadvertent programming or erasing during programming, erasing or reading the non-reference strings.

A very large storage system of 1 petabyte ($8\times10^{15}$ bits) requires 8,000 1-terabit memory circuits ("chips"), involving 32M blocks or 64G slices. (1 Gbits is 1K×1 Mbits). This is a large amount of data to be written (i.e., programmed) or read. Therefore, it is advantageous to be able to program or erase, and read in parallel a great many blocks, slices or pages on numerous chips at once, and to do so with minimum power dissipation at the system level. It is also advantageous for a terabit capacity memory chip to have many input/output channels such that requested data can be streamed in and out in parallel concurrently from and to a large number of blocks. The time required to track down the physical location of the most current version of any given stored file or data set would require a significant amount of time for the system controller to maintain, such as the translation the logical address into the most current physical addresses. The translation between logical to physical addresses would require, for example, a large look-up file allocation table (FAT) to correctly access the slice in the right block on the right chip. Such a search could add considerable read latency (e.g., in the range of 50-100 microseconds) which would impede a fast-read access goal (e.g., under 100 nanoseconds). Accordingly, one aspect of the present invention significantly reduces the search time by introducing a system-wide parallel on-chip rapid file searches, so as to significantly reduce the latency associated with a large FAT, as described below.

Fast Reads: Pipelined Streaming and Random Access

At system initiation of a multi-chip storage system of the present invention, all chips may be erased and reference strings, reference slices or reference planes may be uploaded to their reference states. In one embodiment, one such multi-chip storage system includes a memory module that includes multiple memory chips connected to a module controller which interfaces with the host system controller and manages the multiple memory chips without participation by the host system controller. The memory circuits in the memory module may communicate with each other and with the module controller through an interposer substrate, through-silicon vias (when the memory circuits are stacked one on top of another), hybrid bonding or any other suitable multi-chip assembly technique.

The module controller (sometime also referred to as a "chiplet") designates as cache storage the memory slices (e.g., slice 116 in FIG. 9*c*) that are physically closest to the sense amplifiers and voltage sources 206. Because of the RC delays along the length of each NOR memory string, the FeFETs in each NOR memory string that are physically closest to substrate circuitry 206 may have their voltages $V_{bl}$ established a few nanoseconds sooner than the FeFETs furthest from substrate circuitry 206. For example, the first ~50 slices or so (shown as slice 116 in FIG. 9*c*) out of the 1K slices in each quadrant have the shortest latency and can be designated as a cache memory or storage, to be used for storing quadrant operational parameters, as well as information regarding the files or data set stored in the quadrant. For example, each memory page (2×4 Kbits) or slice (2×4 Kbits×16=128 Kbits) written into the upper half-block (i.e., quadrants Q1 and Q2) can have a unique identifier number assigned to it by the module controller, together with an index number that identifies the type of file that is stored.

The cache storage may be used to store on-chip resource management data, such as file management data. A file can be identified, for example, as "hot file" (i.e., associated with a large number of accesses, or a "high cycle count"), "cold file" (i.e., has not been altered for a long time, and is ready to be moved to slower storage or archival memory at a future time)," delete file" (i.e., ready for future erase in background mode), "defective file" (i.e., to be skipped over), or "substitute file" (i.e., replacing a defective file). Also included in the identifier may be a time stamp representing the last time and date the file associated with the identifier was written into the quadrant. Such unique identifier, typically between 32-bit and 128-bit long can be written into one or more of the cache slices as part of the writing of the file itself into the other memory slices in the same half-tile. Files are written sequentially into available erased space, and the identifiers can be assigned by incrementing the previous unique identifier by one for each new file written into memory. If desired, new files can be written into partial slices and the unwritten part of the slice can be used for writing part or whole of the next file, to avoid wasting storage space. Writing sequentially until the entire memory space of the system is used helps level out the wear-out of FeFETs throughout the system. Other on-chip resource management data may include chip, tile, plane, slice, page and string parameters, address locations of faulty strings and their replacement strings, defective pages, defective planes, defective slices and defective tiles and their substitute replacements, file identifiers for all files resident in the tile, look up tables and link lists for skipping over unusable memory, tile-erase cycle counts, optimum voltages and pulse shape and durations for erase, program, program-inhibit, program scrub, read, margin read, read refresh, read scrub operations, error correcting codes, and data recovery modes, and other system parameters.

Because of the modularity of each chip at the tile level and their low-power operations, it is possible to execute simultaneously erase of some tiles, programming at some other tiles, and reading one or more of remaining tiles. The module controller can use that parallelism of operations at the tile level to work in background mode; for example, the module controller may delete (i.e., erase, so as to free up space) some tiles or entire chips, de-fragment fragmented files into consolidated files, move files, tiles or chips that have been inactive for longer than a predetermined time to slower or archival storage, or to chips that group together files with close dates and time stamps, while rewriting the original file identifier with the latest time stamp into cache storage 116 of the next available physical tile.

To facilitate high-speed searches for the location of the most current version of any one file out of the many millions such files in a petabyte storage system, it is important that the unique identifier for each file, wherever it has been physically relocated to, be accessed quickly by the module controller. According to one embodiment of the present invention, a module controller broadcasts the unique identifier (i.e., the 32-128 bits word) for the file being searched simultaneously to some or all the chips in the system. Each chip is provided with a buffer memory to temporarily store that identifier and, using on-chip Exclusive-Or (XOR) circuits, compare the identifier in the buffer memory with all the identifiers stored on cache 116 of each tile and report to the module controller when a match has been found, together with the location where the corresponding file is located. If more than one match is found, the module controller picks the identifier with the most recent timestamp. The search can be narrowed to just a few chips if the file being searched has been written within a known time period. For a 1-terabit chip, just one 128-Kbit slice or 16×8 Kb pages would be sufficient to store all the 64-bit identifiers for all 2K slices of each tile.

FeFET Pairs for Fast Read Cache Memory.

To reduce read latency for cache storage 116, FeFETs in NOR memory strings that are physically nearest to sense amplifiers 206 can be arranged in pairs. For example, in adjacent NOR memory strings, two FeFETs sharing a common local word line may be used to store a single data bit between them. In a typical programming operation, FeFETs on both NOR memory strings are initialized to the erased state, then one of the FeFETs is programmed to the programmed state, while the other FeFET is program-inhibited, so as to remain in the erased state. Both FeFETs on the two adjacent active strips are read simultaneously by a differential sense amplifier in substrate circuitry when their shared local word line is raised to the read voltage, the first FeFET that start to conduct tips the sense amplifier into state '0' or state '1', depending on which FeFET is in the programmed FeFET.

This FeFET-pair scheme has the advantage of high-speed sensing and higher endurance because FeFETs of two adjacent NOR memory strings are almost perfectly matched, so that at the sense amplifier even a small programmed voltage differential between the two FeFETs being read will suffice to correctly trip the sense amplifier. In other words, among other roles, the FeFET-pair acts as its own reference, neutralizing any leakage current or noise along the FeFET-pair's respective NOR memory strings. In addition, as the threshold voltage of a programmable reference FeFET may drift over many write/erase cycle over the life of the device, under this scheme the reference FeFET and the read FeFET are both reset with each new cycle. In fact, either one of the two FeFETs in the pair can serve as the reference FeFET. If the two FeFETs making the pair are randomly scrambled to invert or not invert the data written in each cycle, to ensure that statistically each FeFET in each pair serves as the reference FeFET for approximately the same number of cycles as the other FeFET. (The invert/not invert code can be stored in the same page as the page being programmed, to assist in the descrambling during a read operation). Because the paired FeFETs are in close proximity to each other, i.e., on two adjacent active strips on the same plane, the FeFETs can best track each other for local variations in the manufacturing process or to best neutralize (i.e., cancel out) the strip leakage during a read operation. In one embodiment the first and second FeFETs of a pair share a common local word line and separate pre-charge transistors. The respective common bit lines of the first and second FeFETs of the pair function as the input or output terminals of a quasi-volatile data latch. Compared to an SRAM circuit with its low memory density and high leakage, or a DRAM circuit with its very short data retention time, a FeFET-pair in a 3-dimensional NOR memory strings of the present invention have a longer data retention time, lower power dissipation, and very high memory density as data latches.

Alternatively, the FeFET pairing scheme may be applied to FeFETs on different planes where the pair shares a common vertical local word line. The cost of this scheme is in silicon efficiency, as the two FeFETs are required to store one bit between them. For this reason, each tile can be organized such that only a small percentage (e.g., 1% to 10%) of the tile is used as high-speed dual FeFET pairs, while the rest of the tile is operated as regular NOR memory strings and programmable reference FeFET strings. The actual percentage set aside for the FeFET-pair scheme can be altered dynamically by the system controller, depending on the specific usage application. For example, the FeFET pairs can be used to store critical system parameters values and may be periodically refreshed, since they are quasi-volatile. Thus, these FeFET-pairs can maintain their polarization states for extended periods of time (e.g., hours to days) without consuming much power. In fact, such FeFET-pair implemented in 3-dimensional NOR memory arrays of the current invention (which are highly silicon efficient) can be employed as high-density data caches or buffer memory, to back up or altogether replace SRAM or DRAM cache memories that are manufactured on planar (i.e., two-dimensional) silicon substrate and are therefore costly and power consuming, even when they are in their standby modes. Such FeFET-pairs could be particularly useful in artificial intelligence and machine learning applications. The high level of flexibility for operating the NOR memory strings of FeFETs of the present invention result in part from the fact that the FeFETs in a NOR memory string are randomly addressable and operate independently of each other, or of FeFETs in other NOR memory strings, unlike conventional NAND strings.

Numerous applications of data storage, such as video or high-resolution imaging require data files that occupy many pages or even many slices. Such files can be accessed rapidly in a pipelined fashion, i.e., the system controller stores the first page or first slice of the file in the cache memory while storing the remaining pages or slices of the file in a low-cost memory and streaming out the data in a pipeline sequence. The pages or slices may thus be linked into a continuous stream, such that the first page of the file is read quickly into the sense amplifiers and transferred to a data buffer shift register to clock the first page out of the tile while pre-charging and reading the next, slower page in a pipeline sequence, thereby hiding the read access time of each page following the first page. For example, if the first page of 8 Kbits stored in the cache memory is read in 10.0 nanoseconds and then clocked out at 1 Gbit per second, the entire 8K bits would take approximately 1 microsecond to complete clocking out, which is more than sufficient time for the second page to be read from the slower, lower-cost pages. The flexibility afforded by pre-charging randomly selected FeFET strings makes it possible for one or more data files from one or more tiles to be written or read concurrently, with their data streams routed on-chip to one or more data input/output ports.

Random Access Reads

The pre-charging scheme of the current invention allows data to be programmed to be serially clocked into, or randomly accessed, and likewise read out serially in a stream or randomly accessed by words. For example, an addressed page in one plane can be read in one or more operations into the sense amplifiers, registers or latches of the addressed plane, after which it can be randomly accessed in 32-bit, 64-bit, 128-bit or 512-bit or more words, one word at a time, for routing to the input/output pads of the chip. In this manner, the delay attendant to streaming the entire page sequentially is avoided.

Reading FeFETs of the present invention is much faster than reading conventional NAND flash memory cells because, in a NOR memory string, only the FeFET to be read is required to be "on", as compared to a NAND string, in which all the FeFETs in series with the one FeFET being read must also be "on". To reduce read latency, some or all the planes in selected memory tiles may be kept pre-charged to their read voltages $V_{ss}$ (source line) and $V_{bl}$ (bit line), thereby rendering them ready to immediately sense the addressed FeFET (i.e., eliminating the time required for pre-charge immediately before the read operation). Such ready-standby requires very little standby power because the current required to periodically re-charge capacitor 360 to compensate for charge leakage is small. Within each tile, all NOR memory strings on all eight or more planes can be pre-charged to be ready for fast read; for example, after reading FeFETs in NOR memory strings of plane 207-0 (FIG. 2*a*), FeFETs in NOR memory strings of plane 207-1 can be read in short order because its source and bit line voltages $V_{ss}$ and $V_{bl}$ are already previously set for a read operation. The pre-charge operation of a selected FeFET in a NOR string can be performed as the final step following completion of a read operation so that it does not adversely impact the read latency.

In memory tile 100, only one FeFET per NOR memory string can be read in a single operation. In a plane with eight thousand side by side NOR memory strings, the eight thousand FeFETs that share a common global word line may all be read concurrently, provided that each NOR memory string is connected to its own sense amplifier. If each sense amplifier is shared among, for example, four NOR memory strings in the same plane using a string decode circuit, then four read operations are required to take place in four successive steps, with each read operation involving two thousand FeFETs. Each plane can be provided its own set of dedicated sense amplifiers or, alternatively one set of sense amplifiers can be shared among NOR memory strings in the eight or more planes through a plane-decoding selector. Additionally, one or more sets of sense amplifiers can be shared between NOR memory strings in quadrants and their mirror image quadrants (see, e.g., sense amplifiers (SA) 206 in FIGS. 6*a*, 6*b*, and 6*c*). Providing separate sense amplifiers for each plane allows concurrent read operations of NOR memory strings of all planes, which correspondingly improves the read operation throughput. However, such higher data throughput comes at the expense of greater power dissipation and the extra chip area needed for the additional sense amplifiers (unless they can be laid out in substrate 201 underneath tile 100). In practice, just one set of sense amplifiers per stack of NOR memory strings may suffice because of the pipeline clocking or data in and out of the memory tile, so that while a first page in one plane is being transferred out of its sense amplifiers to a high speed shift register or buffer memory, the first page of the second plane is being read into the second set of sense amplifiers, with the two sets sharing one set of input/output shift registers.

Parallel operations may also create excessive electrical noise through ground voltage bounces when too many FeFETs are read all at once. This ground bounce is substantially suppressed in all embodiments that rely on pre-charging capacitor 360 to set and temporarily hold the virtual $V_{ss}$ voltage for each active strip. In this case, source voltage $V_{ss}$ of all NOR memory strings is not connected to the chip's $V_{ss}$ ground line, allowing any number of active strips to be sensed simultaneously without drawing charge from the chip ground supply.

Read, Program, Margin Read, Refresh and Erase Operations for Quasi-Volatile 3-Dimensional Nor Memory Strings of FeFETs.

The quasi-volatile NOR memory strings or slices of the current invention may be used as alternatives to some or all DRAMs in many memory applications, e.g., the memory devices for supporting central processing unit (CPU) or microprocessor operations on the main board ("motherboard") of a computer. The memory devices in those applications are typically required to be capable of fast random read access and to have very high cycle-endurance. In that capacity, the quasi-volatile NOR memory strings of FeFETs of the present invention employ similar read/program/inhibit/erase sequences as the non-volatile NOR implementation. In addition, since the polarization stored on programmed FeFETs slowly depolarizes, the weakened polarization state may need to be restored by reprogramming the FeFETs in advance of a read error. To avoid the read error, one may employ "margin read" conditions to determine if a program-refresh operation is required, as are well known to a person skilled in the art. Margin read is an early-detection mechanism for identifying which FeFET will soon fail, to trigger a restoration to the correct programmed state. Quasi-volatile FeFETs typically may be programmed, program-inhibited or erased at reduced programming voltage ($V_{pgm}$), program inhibit voltage ($V_{inhibit}$) or erase voltage ($V_{erase}$) or are programmed using shorter pulse durations. The reduced voltages or shorter pulse durations result in a reduced stress on the ferroelectric material and, hence, improvement in endurance. All slices in a tile may require periodic reads under margin conditions to early-detect excessive threshold voltage shifts of the programmed FeFETs due to damage in the ferroelectric storage material. For example, the erase threshold voltage may be 0.5V±0.2 V and the programmed threshold voltage may be 1.5V±0.2V, so that a normal read voltage may be set at ~1V while the margin-read may be set at ~1.2V. Any slice that requires a program-refresh needs to be read and then correctly reprogrammed into the same slice or into an erased slice in the same tile or in another previously erased tile. Multiple reads of quasi-volatile FeFETs can result in disturbing the erase or program threshold voltages, and may require rewriting the slice into another, erased slice. Read disturbs are suppressed by lowering the voltages applied to the control gate, and the source and drain regions during reads. However, repetitive reads may cumulatively cause read errors. Such errors can be recovered by requiring the data to be encoded with error correcting codes ("ECC"). Typically, each read operation involves decoding the retrieved encoded data. The decoding process computes a syndrome, which indicates if the retrieved data has been corrupted. Based on the syndrome, the decoding process determines where the corrupted bits ("error bits") are and makes the necessary correction, if possible. In one embodiment, for a 512-bit data word, one suitable ECC scheme detects up to 6 error bits and corrects up to 5 error bits. An FeFET that has been subject to a billion cycles or more of erase or programming operations may have one or both of its polarization states drifted outside of its designated operational threshold voltage window. This condition may result in an error bit. The system controller may replace the data word associated with the FeFET with a spare word and may adjust the erase/program bias conditions to achieve an operational window for the FeFET. This same repair/replace sequence may be included within the refresh operation (typically, operating in a background mode), as every FeFET in the entire memory circuit is read by the refresh process according to its schedule. The ECC encoded word has 10% or more bits than the data word, and thus imposes an overhead cost in word size and may increase the read latency (e.g., by a few nanoseconds). However, a suitable ECC scheme greatly enhances memory reliability over the life of the memory circuit.

One requirement for the proper operation of the quasi-volatile memory of the present invention is the ability to read and program-refresh a large number of FeFETs, NOR memory strings, pages or slices. For example, a quasi-volatile 1-terabit chip has ~8,000,000 slices of 128K bits each. Assuming that 8 slices (~1 million) of FeFETs can be program-refreshed in parallel (e.g., one slice in each of 8 tiles), and assuming a program-refresh time of 100.0 micro-seconds, then program-refreshing the entire chip may be achieved in ~100 seconds. This massive parallelism is made possible in memory devices of the present invention primarily because of two key factors; 1) the programming or erase mechanism requires very low current per FeFET, allowing 1 million or more FeFETs to be programmed together without expanding excessive power; and 2) the parasitic capacitor intrinsic to a long NOR memory string enables pre-charging and temporarily holding the pre-charged voltage on multiple NOR memory strings. These characteristics allow a multitude of pages or slices on different tiles to be first read in margin-read mode (or in ECC-check mode) to determine if a refresh is required, and if so, the pages or slices are individually pre-charged for program or program-inhibit and then program-refreshed in a single parallel operation. A quasi-volatile memory with average retention time of ~10 minutes or longer will allow the system controller to have adequate time for properly program-refresh, and to maintain a low error rate that is well within the ECC recovery capability.

Figure 10A:
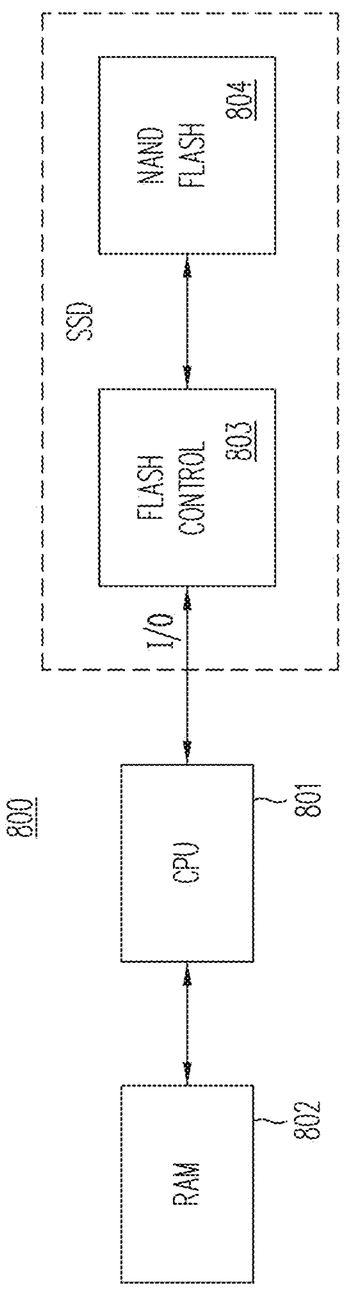
FIG. 10*a* shows in simplified form prior art storage system 800 in which microprocessor (CPU) 801 communicates with system controller 803 in a flash solid state drive (SSD) that employs NAND flash chips 804; the SSD emulates a hard disk drive and NAND flash chips 804 do not communicate directly with CPU 801 and have relatively long read latency.
Figure 10B:
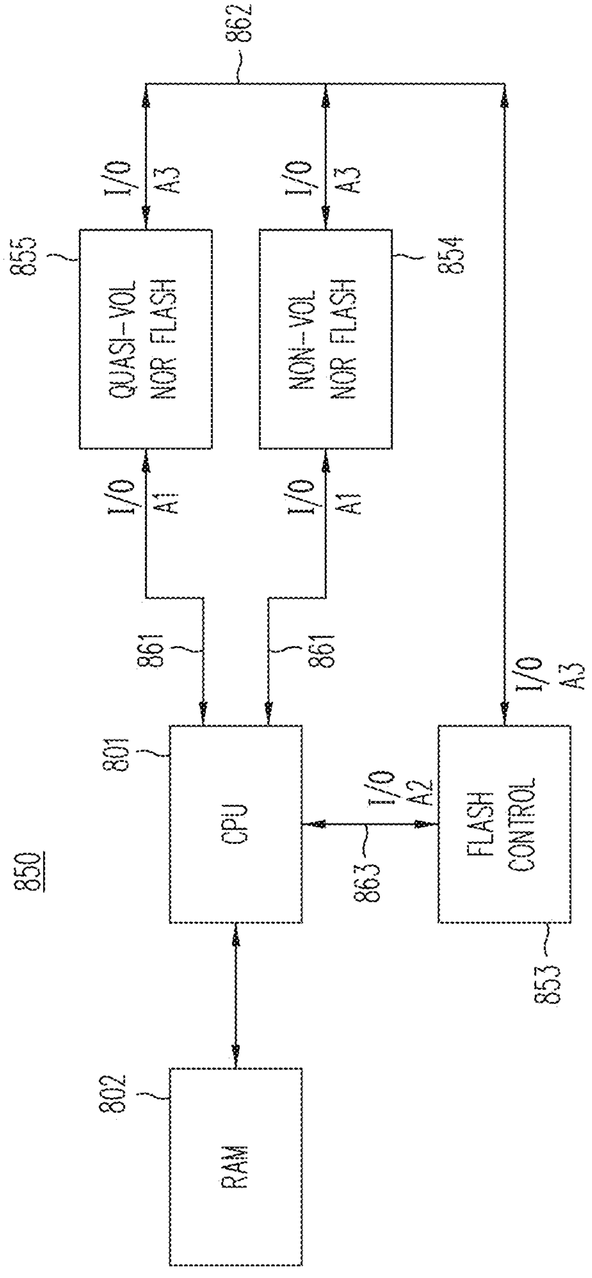
FIG. 10*b* shows in simplified form system architecture 850 using the memory devices of the present invention, in which FeFETs of NOR memory string arrays 854 and 855 communicate directly with CPU 801 through one or more input and output (I/O) ports 861, and indirectly through controller 863.

FIG. 10*a* shows in simplified form prior art storage system 800 in which microprocessor (CPU) 801 communicates with system controller 803 in a flash solid state drive (SSD) that employs NAND flash chips 804. The SSD emulates a hard disk drive and NAND flash chips 804 do not communicate directly with CPU 801 and have relatively long read latency. FIG. 10*b* shows in simplified form system architecture 850 using the memory devices of the current invention, in which 3-dimensional non-volatile FeFET NOR memory string arrays 854, or quasi-volatile NOR memory string arrays 855 (or both) are accessed directly by CPU 801 through one or more of input and output (I/O) ports 861. I/O ports 861 may be one or more high speed serial ports for data streaming in or out of NOR memory string arrays 854 and 855, or they may be 8-bit, 16-bit, 32-bit, 64-bit, 128-bit, or any suitably sized wide words that are randomly accessed, one word at a time. Such access may be provided, for example, using a DRAM-compatible protocol (e.g., DDR4), and future higher speed industry standard memory interface protocols, or other protocols for DRAM, SRAM or NOR flash memories. I/O ports 862 handle storage system management commands, with flash memory controller 853 translating CPU commands for memory chip management operations and for data input to be programmed into the memory chips. In addition, CPU 801 may use I/O ports 862 to write and read stored files using one of several standard formats (e.g., CXL, PCIe, HBM, NVMe, eMMC, SD, USB, SAS, or multi-Gbit high data-rate ports). I/O ports 862 communicate between system controller 853 and FeFET NOR memory string arrays in the memory chips.

It is advantageous to keep the system controller or chiplet (e.g., system controller 853 of FIG. 8*b*) off the memory chips, as each system controller typically manages a large number of memory chips, so that it is disengaged as much as possible from the continuous ongoing margin-read/program-refresh operations, which can be more efficiently controlled by simple on-chip state machines, sequencers or dedicated microcontrollers. For example, parity-check bit (1-bit) or more powerful ECC words (typically, between a few bits to 70 bits or more) can be generated for the incoming data by the off-chip controller or on-chip by dedicated logic or state machines and stored with the page or slice being programmed. During a margin-read operation the parity bit generated on-chip for the addressed page is compared with the stored parity bit. If the two bits do not match, the controller reads again the addressed page under a standard read (i.e., non-margin). If that gives a parity bit match, the controller reprograms the correct data into the page, even though it is not yet fully corrupted. If the parity bits do not match, then on-chip dedicated ECC logic or the off-chip controller intervenes to detect and corrects the bad bits and rewrites the correct data preferably into another available page or slice, and permanently retiring the errant page or slice. To speed up the on-chip ECC operations, it is advantageous to have on-chip Exclusive-Or, or other logic circuitry to find ECC matches quickly without having to go off-chip. Alternatively, a memory chip can have one or more high-speed I/O ports dedicated for communication with the controller for ECC and other system management chores (e.g., dynamic defect management), so as not to interfere with the low latency data I/O ports. As the frequency of read or program-refresh operations may vary over the life of the memory chip due to FeFET wear-out after excessive program/erase cycling, the controller may store in each tile (preferably in the high-speed cache slices) a value indicating the time interval between refresh operations. Such a time interval tracks the cycle count of the tile. Additionally, the chip or the system may have a temperature monitoring circuit whose output data is used to modulate the frequency of refreshes according to the measured chip temperature.

In the example of a 1-terabit chip having only 8 tiles out of 4,000 tiles, or 0.2% or less of all tiles are being refreshed at any one time, program-refresh operations can be performed in a background mode, while all other tiles can proceed in parallel with their pre-charge, read, program and erase operations. In the event of an address collision between the 0.2% and the 99.8% of tiles, the system controller arbitrates one of the accesses is more urgent. For example, the system controller can pre-empt a program-refresh, storing away temporarily the state of the interrupted operation, to yield priority to a fast read, then return to complete the program-refresh.

In summary, in the integrated circuit memory chip of the present invention, each active strip and its multiple associated conductive word lines are architected as a single-port isolated capacitor that can be charged to pre-determined voltages which are held semi-floating (i.e., subject to charge leaking out through the string-select transistor in the substrate circuitry) during read, program, program-inhibit or erase operations. That isolated semi-floating capacitor of each active strip, coupled with the low current required to program or erase the FeFETs in a 3-dimensional NOR memory string associated with the active strip, makes it possible to program, erase or read a massive number of randomly selected tiles, sequentially or concurrently. Within the integrated circuit memory chip, the NOR memory strings of one or more of a first group of tiles are first pre-charged and then erased together, while the NOR memory strings of one or more other groups of tiles are first pre-charged and then programmed or read together. Furthermore, erasing of the first group of tiles and programming or reading of a second group of tiles can take place sequentially or concurrently. Tiles that are dormant (e.g., tiles that store archival data) are preferably held at a semi-floating state, preferably isolated from the substrate circuits after having their NOR memory strings and conductors set at ground potential. To take advantage of the massively parallel read and program bandwidths of these quasi-floating NOR memory strings, it is advantageous for the integrated circuit memory chip to incorporate therein multiple high-speed I/O ports such as high-bandwidth memory (HBM) employing dense through-silicon vias (TSVs)) or the much denser heterogeneous integration connectors (e.g., in die-to-die or die-to-wafer format). Data can be routed on-chip to and from these I/O ports, for example, to provide multiple channels for word-wide random access, or for serial data streams out of the chip (reading) or into the chip (programming or writing).

FeFETs of the present invention has the added advantage of being selectively configurable to a depletion threshold voltage state ("depletion mode"). When a depletion mode FeFET has negligible or insignificant source-drain leakage current. A NOR memory string that is not selected for read, write or erase operation may have its common drain region and its common source region biased to a predetermined voltage difference to prevent source-drain leakage currents in the FeFETs that are not in the depletion mode. While held in this bias condition, the NOR memory string has insignificant or negligible leakage current.

In some memory applications, FeFETs may be organized as differential pairs, in which one FeFET in each differential pair holds a first binary value and the other FeFET holds in the differential pair holds the opposite binary value. The differential pair may be used as input or output terminal of a latch. The differential pair may be formed by storage transistors sharing a common gate electrode.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A memory structure formed above a planar surface of a crystalline substrate, comprising an array of NOR memory strings, each NOR memory string comprising a plurality of thin-film ferroelectric transistors (FeFETs) sharing a common drain region and a common source region, wherein each FeFET further comprises:

(i) a channel region in contact with both the common source region and the common drain region, the channel region comprising an oxide semiconductor material;

(ii) a conductive layer serving as a gate electrode;

(iii) an electrically polarizable layer, which is: (a) provided between the conductive layer and the channel region; and (b) electrically configurable into a selected one of a plurality of polarization states by a predetermined combination of voltages imposed on the common drain region, the common source region and the gate electrode; and (iv) an interface dielectric layer between the channel region and the electrically polarizable layer, the interface dielectric layer comprising a material with a bandgap that reduces tunneling of charged species between the electrically polarizable layer and the channel region.

2. The memory structure of claim 1, wherein the crystalline substrate comprises silicon or polycrystalline silicon.

3. The memory structure of claim 1, wherein each FeFET comprises a junction-less field-effect transistor.

4. The memory structure of claim 1, wherein the oxide semiconductor material comprises one or more of: indium zinc oxide and indium gallium zinc oxide.

5. The memory structure of claim 1, wherein at least one of the common drain region and the common source region each comprise a metal.

6. The memory structure of claim 5, wherein the metal comprises one or more of: molybdenum, titanium, tungsten, lanthanum, tantalum, ruthenium, any silicide thereof, any nitride thereof and any combination thereof.

7. The memory structure of claim 1, wherein the electrically polarizable layer comprises one or more of: laminated layers of hafnium oxide (HfO2) and zirconium oxide (ZrO2), zirconium-doped hafnium oxide (HfO:Zr), aluminum zirconium-doped hafnium oxide (HfZrAlO), aluminum-doped hafnium oxide (HfO2:Al), silicon-doped hafnium oxide (HfO2:Si), lanthanum-doped hafnium oxide (HfO2:La), hafnium zirconium oxide (HfZrO), hafnium zirconium oxynitride (HfZrON), hafnium zirconium aluminum oxide (HfZrAlO), any hafnium oxide that includes zirconium impurities, and combinations thereof.

8. The memory structure of claim 1, wherein the oxide semiconductor material has a charge carrier mobility exceeding 4.0 $cm^2/V$.

9. The memory structure of claim 1, wherein the oxide semiconductor material in the channel region is formed by deposition at a temperature between 200.0-450.0° C.

10. The memory structure of claim 1, wherein the electrically polarizable layers of the FeFETs are electrically isolated from each other.

11. The memory structure of claim 1, wherein the interface dielectric layer has a dielectric constant greater than stoichiometric silicon oxide's dielectric constant.

12. The memory structure of claim 11, wherein the interface dielectric layer comprises one or more of a silicon nitride layer and an aluminum oxide layer.

13. The memory structure of claim 11, wherein the interface dielectric layer is formed by nitridation of a silicon oxide or silicon oxynitride.

14. The memory structure of claim 12, wherein the interface dielectric layer is converted by nitridation from an oxide formed on a surface of the channel region.

15. The memory structure of claim 14, wherein the nitridation is carried out using an ammonia anneal.

16. The memory structure of claim 11, wherein the interface dielectric layer has a dielectric constant greater than 3.9.

17. The memory structure of claim 11, wherein the interface dielectric layer is treated using one or more of: pulsed ozone and thermal annealing in a hydrogen or deuterium ambient.

18. The memory structure of claim 11, wherein the interface dielectric layer comprises one or more of: aluminum oxide, zirconium oxide ($ZrO_2$), silicon oxynitride (SiON), silicon nitride ($Si_3N_4$), and silicon oxide ($SiO_2$).

19. The memory structure of claim 1, wherein the conductive layers of a first group of FeFETs are connected to a first conductor that extends lengthwise along a first direction, each of such FeFET belonging to a different NOR memory string in the array of NOR memory strings.

20. The memory structure of claim 19, wherein the conductive layers of a second group of FeFETs are connected to a second conductor extending lengthwise along the first direction, each such FeFET belonging to a different NOR memory string within the array of NOR memory strings.

21. The memory structure of claim 1, wherein the electrically polarizable layer is formed using a selective deposition carried out in an ozone ambient.

22. The memory structure of claim 21, wherein the selective deposition includes a post-deposition annealing step carried out at a temperature between 400° C. and 1000° C.

23. The memory structure of claim 1, wherein circuitry for supporting memory operation is formed at the planar surface of the crystalline substrate underneath the array of NOR memory strings.

24. The memory structure of claim 23, further comprising a layer of interconnect conductors formed above, and in electrically connection with, the array of NOR memory strings, the layer of interconnect conductors being provided for routing control and data signals among NOR memory strings in the array of NOR memory strings and the circuitry for supporting memory operations.

25. The memory structure of claim 23, wherein the circuitry for supporting memory operations includes both analog and digital circuits.

26. The memory structure of claim 23, wherein the circuitry for supporting memory operations comprises two or more of: shift registers, latches, sense amplifiers, reference cells, power supply lines, bias and reference voltage generators, inverters, NAND, NOR, Exclusive-Or and other logic gates, input/output drivers, address decoders, other memory elements, sequencers, state machines, and data processing circuitry that receives control and data signal from an external control circuit.

27. The memory structure of claim 26, wherein the external control circuit is formed on a separate crystalline substrate.

28. The memory structure of claim 27, wherein the crystalline substrates are provided in an integrated circuit package.

29. The memory structure of claim 27, wherein the crystalline substrates are wafer-bonded to each other.

30. The memory structure of claim 23, further comprising interconnect conductors formed between the array of NOR memory strings and the planar surface of the crystalline substrate, the interconnect conductors electrically connect among the support circuitry, the common drain regions of the FeFETs, and the conductive layers of the FeFETs.

31. The memory structure of claim 1, wherein the electrically polarizable layer contacts the channel region directly.

32. The memory structure of claim 1, wherein the electrically polarizable layer is deposited using chemical or physical vapor deposition, ALD, or evaporation.

33. The memory structure of claim 1 wherein the electrically polarizable layer is embedded in a dielectric material.

34. The memory structure of claim 33, wherein the dielectric material comprises silicon oxide.

35. The memory structure of claim 1, further comprising a metal layer adjacent and in electrical contact with the common drain region.

36. The memory structure of claim 1, wherein a first FeFET of a first NOR memory string and a second FeFET of a second NOR memory string are configured to operate as a differential pair, in which the first FeFET holds a first binary value and the second FeFET holds a binary value different from the first binary value.

37. The memory structure of claim 36, wherein the gate electrode of the first FeFET and the gate electrode of the second FeFET are electrically connected.

* * * * *